(12) United States Patent
Tianxiang

(10) Patent No.: US 10,241,959 B1
(45) Date of Patent: Mar. 26, 2019

(54) CODING WAVE-PIPELINED CIRCUITS WITH BUFFERING FUNCTION IN HDL

(71) Applicant: Weng Tianxiang, Rowland Heights, CA (US)

(72) Inventor: Weng Tianxiang, Rowland Heights, CA (US)

(73) Assignee: Weng Tianxiang, El Monte, CA (US)

( * ) Notice: Subject to any disclaimer, the term of this patent is extended or adjusted under 35 U.S.C. 154(b) by 0 days.

(21) Appl. No.: 15/861,093

(22) Filed: Jan. 3, 2018

(51) Int. Cl.
| | | |
|---|---|---|
| G06F 17/50 | (2006.01) | |
| G06F 15/82 | (2006.01) | |
| G06F 8/30 | (2018.01) | |
| G11C 7/10 | (2006.01) | |
| G06F 8/71 | (2018.01) | |

(52) U.S. Cl.
CPC ............. *G06F 15/82* (2013.01); *G06F 8/31* (2013.01); *G06F 8/71* (2013.01); *G06F 17/5054* (2013.01); *G11C 7/1039* (2013.01); *G11C 7/1066* (2013.01); *G11C 7/1069* (2013.01); *G11C 7/1072* (2013.01)

(58) Field of Classification Search
CPC .......... G06F 8/31; G06F 8/71; G06F 17/5054; G06F 15/82; G06F 17/505; G06F 22/7184
USPC ......................................... 716/101, 104, 114
See application file for complete search history.

(56) References Cited

U.S. PATENT DOCUMENTS

| | | | | |
|---|---|---|---|---|
| 5,528,177 A | * | 6/1996 | Sridhar et al. ............ | G06F 7/00 326/113 |
| 5,701,094 A | * | 12/1997 | Sridhar et al. ............ | G06F 7/00 326/113 |
| 5,796,624 A | * | 8/1998 | Sridhar et al. ............ | G06F 7/00 326/113 |
| 7,423,927 B2 | | 9/2008 | Kim | |
| 9,575,929 B2 | | 2/2017 | Tianxiang | |
| 9,734,127 B2 | | 8/2017 | Tianxiang | |
| 9,747,252 B2 | | 8/2017 | Tianxiang | |
| 2006/0077731 A1 | * | 4/2006 | Ware et al. ............ | G11C 5/04 365/194 |

OTHER PUBLICATIONS

Wayne P. Burleson et al, "Wave-Pipelining: A Tutorial and Research Survey", in IEEE Trans. Very Large Scale Integra. (VLSI) Syst., Sep. 1998. 464-474, vol. 6, No. 3.

* cited by examiner

*Primary Examiner* — Sun Lin

(57) ABSTRACT

The present invention teaches how to code a new or existing circuit of wave-pipelining with a buffering function in HDL (Hardware Description Language). The circuit comprises at least one critical path component (CPC) and a wave-pipelined component (WPC). A WPC comprises one Data_position_shifter per CPC, an Input_register_rotator if the circuit has multiple input registers, a Combinational_logic_rotator if the circuit has multiple pieces of combinational logic and a sole output register, a buffering controller and up to three FIFOs. All critical paths provide a first storage, FIFO_1 provides a second storage for output-ready data; FIFO_2 is to store indexes of output registers if the circuit has multiple output registers; FIFO_3 is to store assistant data. Each output register has an attached output register state machine which has three states: idle state, active state and buffered state. A locked piece of combinational logic is blocked from latching onto its connected or shared output register to avoid data contamination.

48 Claims, 24 Drawing Sheets

| | | |
|---|---|---|
| 1 | 1 | : Series number of a snapshot |
| 2 | ①↓ | : Working data is being latched onto an output register |
| 3 | * | : The active output register |
| 4 | ① | : Valid working data at output register or in FIFO-1 |
| 5 | A | : Buffered output register's Index in FIFO-2 |
| 6 | x→ | : output working data from FIFO-1 or an output register by rule x |
| 7 | x↘ | : Push an output register to FIFO-1 by rule x |
| 8 | x↘→ | : Trig to push top buffered output register into FIFO-1 by rule x |
| 9 | x→ | : toggle B bit register by rule x |
| 10 | # | : next write position in FIFO-1 or FIFO-2 |
| 11 | ~ | : top read data in FIFO-1 or FIFO-2 |
| 12 | A@ | : Output register A is blocked to latch new working data |

FIG. 4

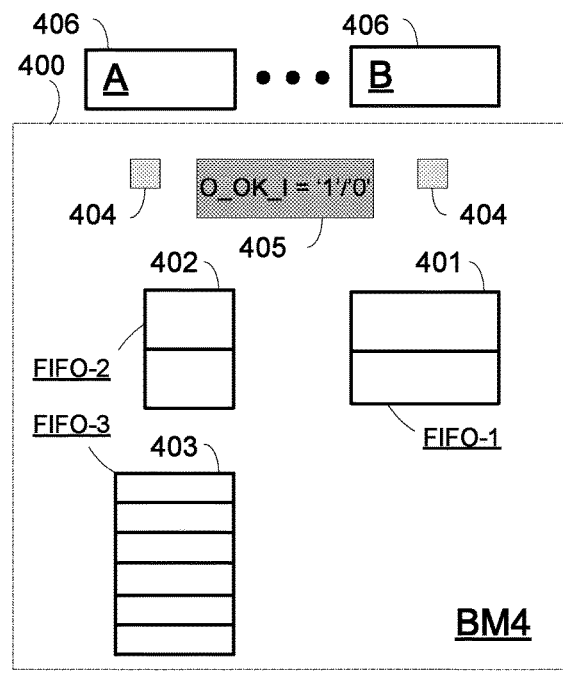

FIG. 4a

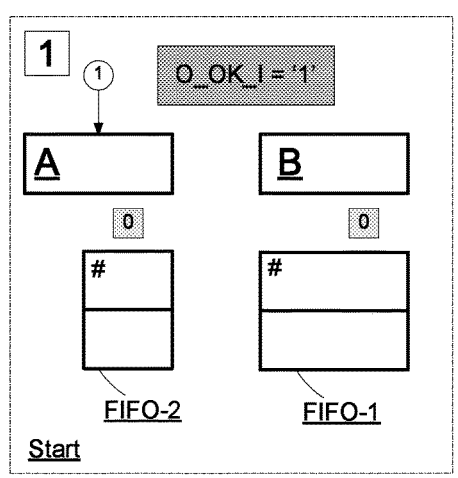

FIG. 4b

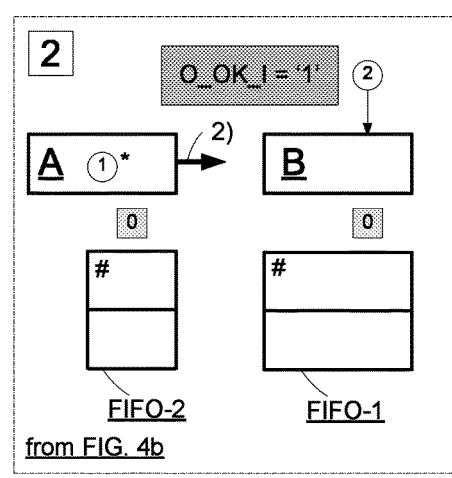

FIG. 4c

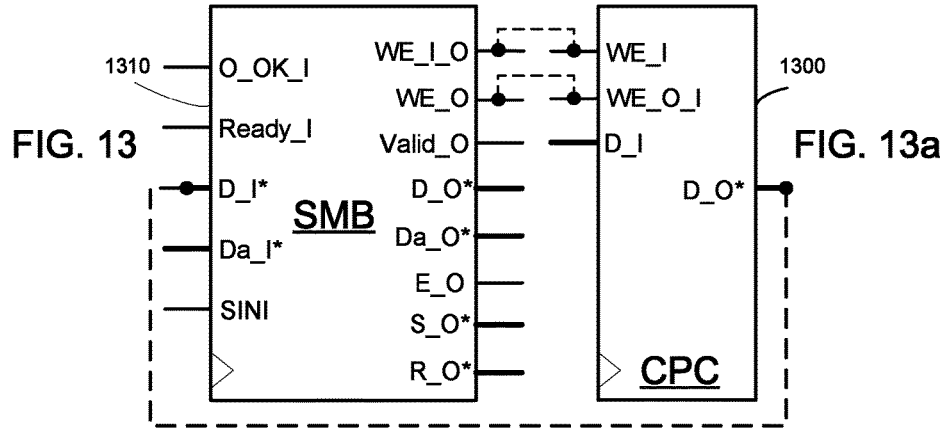
FIG. 13
FIG. 13a
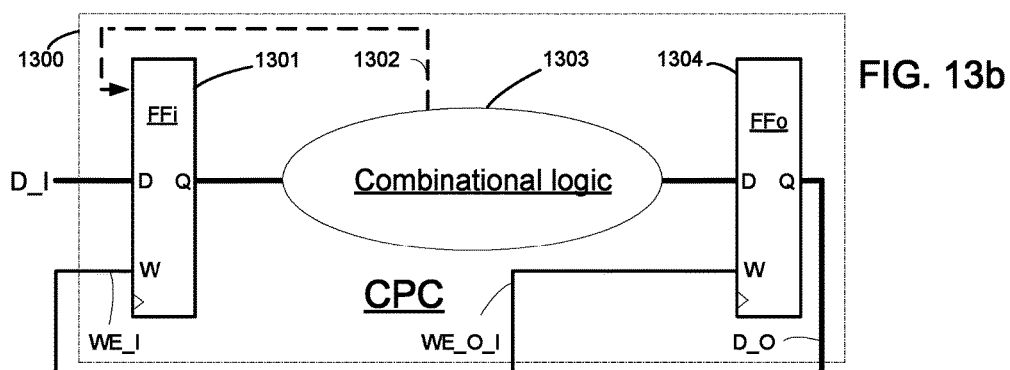
FIG. 13b
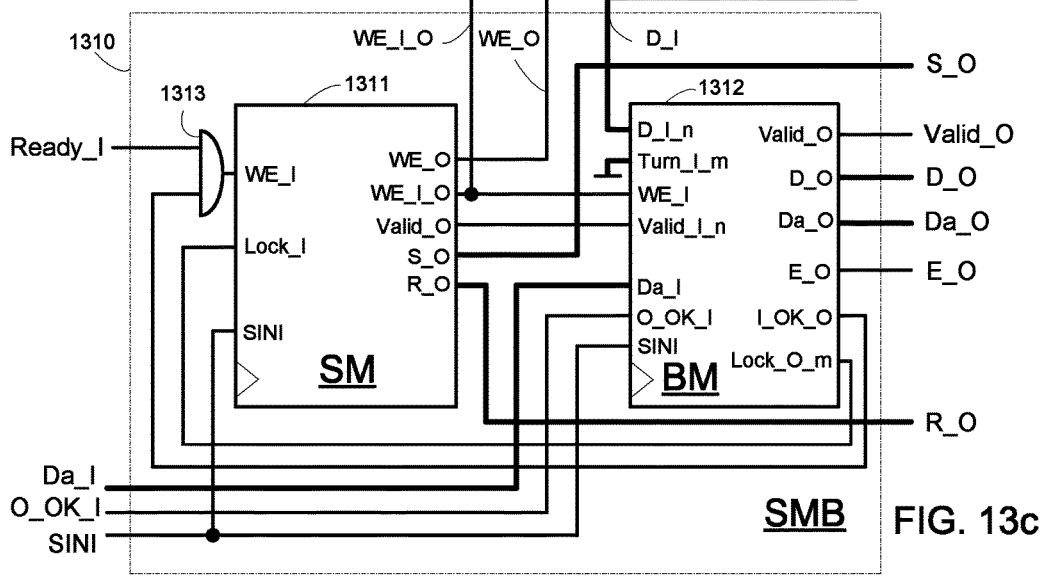
FIG. 13c

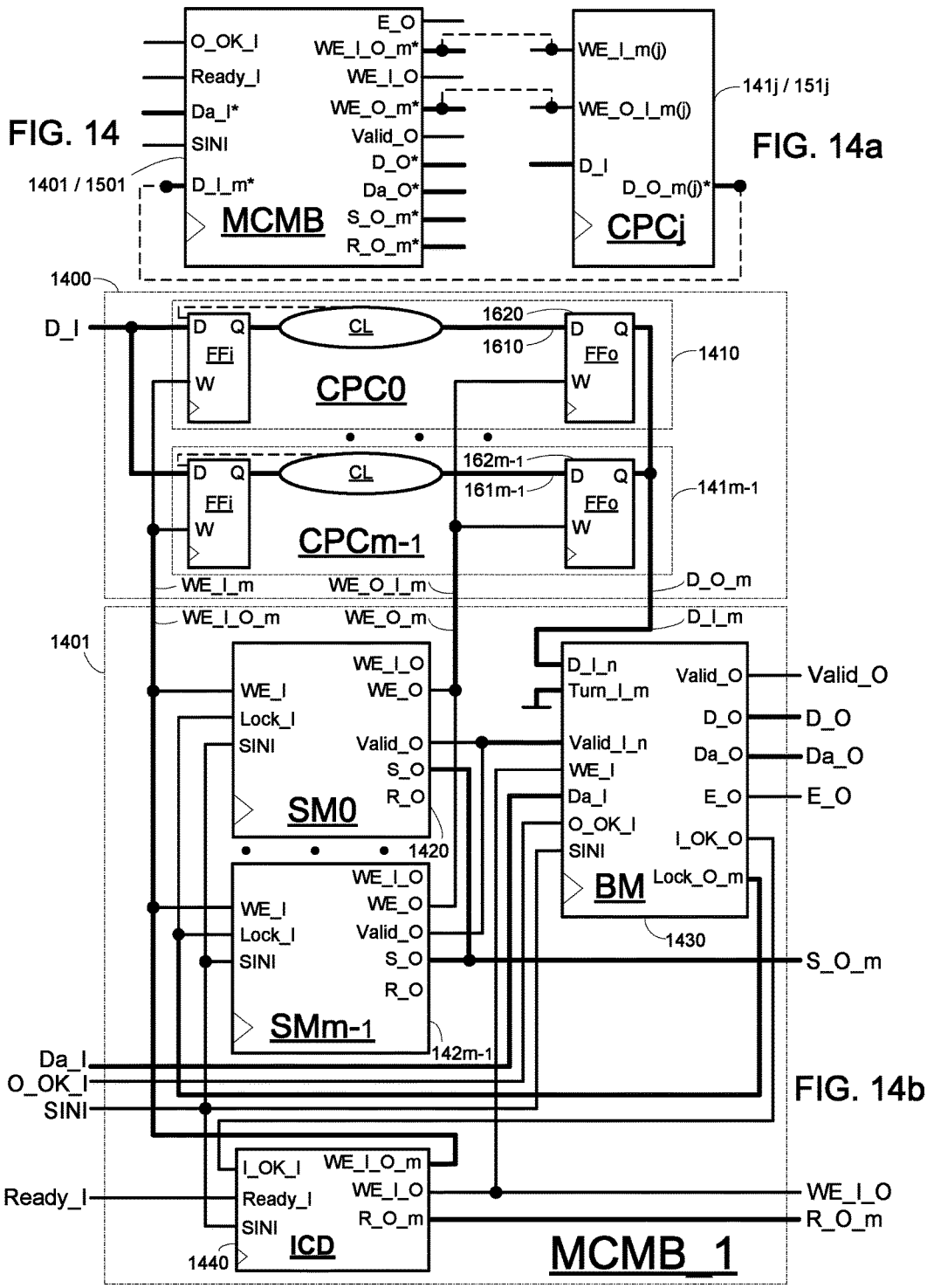

US 10,241,959 B1

CODING WAVE-PIPELINED CIRCUITS WITH BUFFERING FUNCTION IN HDL

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA OFFICE ELECTRONIC FILING SYSTEM (EFS-WEB)

WPC-CPC-with-buffering-function.txt file is a source code list in VHDL and submitted to USPTO via EFS-WEB and incorporated by reference in its entirety here. WPC-CPC-with-buffering-function.txt has 3691 lines, 147,146 bytes and is created on Dec. 30, 2017 by the applicant.

STATEMENT REGARDING PRIOR DISCLOSURES BY THE INVENTOR OR A JOINT INVENTOR

Not Applicable

BACKGROUND OF THE INVENTION

Field of the Invention

The present invention is related to the design of a synchronous circuit in HDL (Hardware Description Language, hereafter), especially to the design of wave-pipelined circuits with buffering function in HDL.

Description of the Related Art

HDL comprises VHDL, Verilog, SystemVerilog and so on. Wave-pipelining technology is a technology with which designers design traditional pipelining circuits with all intermediate registers' coding skipped and input data acceptable on every one or more cycles. For example, in a conventional pipelining circuit, data flow from an input register A to an output register D through intermediate registers B and C coded in order to divide the critical path timing from A to B into multiple smaller segments with each meeting the critical timing: A→B→C→D. With wave-pipelining technology, the circuits are designed in order to let input signals flow directly from the register A to the register D with intermediate registers B and C coding skipped by designers, and the generated wave-pipelined circuit usually does not have any intermediate registers. Accordingly, wave-pipelining circuits are superior to their conventional pipelining counterparts in terms of speed, power consumption and silicon area.

FIG. 1 is a prior art block diagram, showing how wave-pipelining technology applies when a wave-pipelined circuit is being coded before it is generated. A critical path comprises input register FFi, output register FFo and a piece of combinational logic connecting the input register to the output register. In the piece of combinational logic there are two special paths marked by Dmax and Dmin. Dmax is the longest path for signals to propagate from the input registers FFi to the output registers FFo while Dmin is the shortest path to do so. FFi and FFo may have different data widths. Data flow from input register FFi through the piece of combinational logic to output register FFo and a data takes more than one cycles to propagate from the input register to the output register.

Here are some prior art definitions.
1) A path in a synchronous digital system is called a critical path if it meets following three conditions:
   a) The path has input register receiving input data and output register driving output data.
   b) The input register and output register are connected by a piece of combinational logic.
   c) Signals take more than one cycle to propagate from the input register to the output register under a designated target running frequency.
2) A path is called a feedback of a critical path if it meets two conditions:
   a) Input data to the input register on the critical path partially comes from the middle of its piece of combinational logic.
   b) Signals take more than one cycle to propagate from a part of the input register through the feedback to another part of the input register under a designated target running frequency.
3) A data contamination occurs if an earlier entered data is caught up by a later entered data through the circuit.
4) Signal Input_register_number represents the number of input registers in the circuit and one critical path always has an independent input register. The number of pieces of combinational logic in the circuit is always equal to Input register number.
5) Signal Output_register_number represents the number of output registers in the circuit and if there is more than one critical path, each of them may have an independent output register, or all of them share a sole output register.
6) Signal Register_number is equal to the sum of the Input_register_number and the Output_register_number.

FIG. 1a is an example block diagram of a prior art hardware device FIFO (First In and First Out, hereafter), showing how it is organized and how it works. A FIFO is called empty if the FIFO has no valid data. FIFO structure is widely used in hardware design and employed in the present invention. The example FIFO in FIG. 1a comprises 4 memory cells, a write pointer W_ptr and a read pointer R_ptr. W_ptr points to the third memory cell that is the next memory cell to write. R_ptr points to the first memory cell to read from the FIFO, and the data in the memory cell pointed by R_ptr is called the top data of the FIFO. A top data is valid only if the FIFO is not empty. The first physical memory cell in a FIFO is always treaded as next memory cell of the last physical memory cell.

FIG. 1b is the interface of a FIFO. A FIFO has 4 input signals:
1) D: it is data input signal and has input data's width.
2) W: it is write enable signal for the FIFO. A data in input D is being pushed into the FIFO if W is asserted, or not otherwise.
3) R: it is read enable signal for the FIFO. The top data in the FIFO is being popped up from the FIFO on the current cycle if R is asserted, or not otherwise.

4) S: it is the initialization input signal. The FIFO is in the initial state one cycle after S is asserted.

A FIFO has 3 output signals:
1) Q: it drives the top data in the FIFO and has the same data width as its input data's width. Output Q is valid only when the FIFO is not empty.
2) E: it is asserted if the FIFO is empty, or not otherwise.
3) F: it is asserted if the FIFO is full, or not otherwise.

FIG. 1c is an interface diagram of a prior art hardware device D type flip-flop (FF, hereafter). Each of registers used in the circuit is a FF which may have different bit widths. A FF has 3 input signals (excluding clock signal, hereafter): data input D, write enable input W, and an optional synchronous initialization input R (reset) or S (set). A FF register is deasserted one cycle after input R is asserted or asserted one cycle after input S is asserted. A FF has 2 data output signals Q and $\overline{Q}$. Optional output signal $\overline{Q}$ always has reverse value of output Q. When input W is asserted on the current cycle, input data X on input D is being latched by the FF when an active edge occurs and data X will show up on output Q, and $\overline{X}$ will show up on output $\overline{Q}$ on next cycle. If input W is deasserted on the current cycle, outputs Q and $\overline{Q}$ will be kept unchanged on next cycle. A register is called empty if the register doesn't have a valid data. The output Q of a 1-bit register represents the 1-bit register and the 1-bit register is asserted or deasserted if its output Q is asserted or deasserted, respectively.

3 U.S. Pat. Nos. 9,575,929, 9,734,127 and 9,747,252 have invented systematic methods for coding and synthesizing wave-pipelined circuits in HDL. The coding method needs the least input and coding from a designer for a wave-pipelined circuit to be correctly generated, leaving all other complex design burdens to be resolved by a synthesizer. The least input provided by a designer is no more than a piece of combinational logic that connects the input register to the output register and other related coding is coping an off shelf solution provided by the 3 patents. The 3 patents have following 7 points that are closely related to understanding the present invention and are summarized as follows:

1) Divide a wave-pipelined circuit into 2 parts:
   a) One is static logic part that a designer codes to implement a static logic for the wave-pipelined circuit, and this part of code is called critical path component (CPC, hereafter). The static logic part has no logic related to how long signals propagate through the wave-pipelined circuit that a designer cannot exactly know while coding. A CPC is called series CPC if the CPC has no feedback or feedback CPC otherwise.
   b) Another is dynamic logic part that a designer codes to implement a dynamic logic for the wave-pipelined circuit, and this part of code is called wave-pipelining component (WPC, hereafter). The dynamic logic part is closely related to how long signals propagate through the wave-pipelined circuit.
2) Introduce a new concept of wave constant. The wave constant concept allows a designer to use after-synthesization information while coding a wave-pipelined circuit and let synthesizer do what is left.
   a) Even though the structure of CPC determines the initial values of related wave constants, the wave constants do not appear in CPC.
   b) All wave constants are defined in the linked WPC and coded like a generic constant except that their initial values are unknown to designers while designers are coding them, and determined by the synthesizer after it has analyzed all critical paths.
   c) A synthesizer does following steps to generate a wave-pipelined circuit:
      Analyzing the critical paths;
      Determining the wave constants' initial values;
      Synthesizing the WPC; and
      Generate a wave-pipelined circuit.
3) Invent 3 wave constants that are keys to a wave-pipelined circuit and can be summarized as follows:
   a) Series_clock_number: a number of cycles is called the number of series cycles for a path if it is the number of cycles for signals to take to propagate from the input registers through the piece of the combinational logic to the output registers on the critical path. The number of series cycles for a non-critical path is 1, and greater than 1 for a wave-pipelined circuit.
   b) Input_clock_number: a number of cycles is called the number of input data cycles for a critical path if input data is acceptable on every Input_clock_number cycles through the critical path. Input_clock_number is designed to guarantee 100% success rate for generating any types of wave circuits while using one critical path.
   c) Multiple_copy_number: a number is called the multiple copy number if it is the number of same CPC copies generated in the wave-pipelined circuit. It is introduced in order to resolve a situation when a wave-pipelined circuit needs to accept one data per cycle at any cost, even using Multiple_copy_number copies of a same critical path, and the structure has 100% success rate.
4) Define relationships among 3 wave constants:
   a) Series_clock_number >=Input_clock_number >=1.
   b) Series_clock_number >=Multiple_copy_number >=1.
   c) Multiple_copy_number=1 if Input_clock_number >1.
   d) Input_clock_number=1 if Multiple_copy_number >1.
5) Provide two location options for the output registers. An input register and its connected piece of combinational logic of a critical path are always located in a same CPC and the output register on the critical path have two location options:
   a) Each CPC comprises an independent output register if the number of the input registers and the number of the output registers are the same.
   b) All CPC share a sole output register and the sole output register is relocated in WPC in order to save logic resources and silicon area if Multiple_copy_number >1 and Output_register_number=1.
6) Invent a new group of concurrent link statements. A designer must use one of 3 concurrent link statements to link one or more CPC instantiation with a WPC instantiation to form a standard wave-pipelining ready code so that a synthesizer can identify, synthesize and generate the requested wave-pipelined circuit. The 3 concurrent link statements not only link two parts of code for a wave-pipelined circuit, but also specify what structure a designer wants to select on the final generated wave-pipelined circuit.
7) Provide an alias wave constant declaration so that all wave constants related to a wave-pipelined circuit can be used outside the circuit while a designer is coding before a synthesization.

The 3 foregoing mentioned inventions also specify following 5 structures for a wave-pipelined circuit based on 3 wave constants:
1) When Series_clock_number=1: it is a non-critical normal circuit. It is needed because a circuit whose designing is based on the method of coding wave-pipelined circuit in HDL may turn out to be a non-critical normal circuit through which signals take only one cycle to propagate.
2) When Series_clock_number >1 and Input_clock_number=Multiple_copy_number=1: the wave-pipelined circuit can accept one data per cycle, using one CPC. The structure may fail.
3) When Series_clock_number >=Input_clock_number >=2 and Multiple_copy_number=1: the wave-pipelined circuit can accept one data per Input_clock_number cycles, using one CPC. The structure has 100% success rate.
4) When Series_clock_number >=Multiple_copy_number >=2, and Input_register_number=Output_register_number=Multiple_copy_number: the wave-pipelined circuit can accept one data per cycle, using Multiple_copy_number copies of a same CPC, and each of CPCs has an input register and an output register. The structure has 100% success rate.
5) When Series_clock_number >=Multiple_copy_number >=2, and Input_register_number=Multiple_copy_number and Output_register_number=1: the wave-pipelined circuit can accept one data per cycle using Multiple_copy_number copies of a same CPC and all CPCs share a sole output register which is relocated in paired WPC. The structure has 100% success rate.

The above 5 foregoing mentioned circuit structures don't provide buffering function. Buffering function is so essential that every design of the wave-pipelined circuit must separately implement buffering function. The present invention provides an innovative, sophisticated and unified method to improve the wave-pipelined circuit design in HDL with buffering function, and hope that the attached WPC-CPC-with-Buffering-Function.txt (a source code in VHDL) will become base of a wave-pipelined system library in HDL to replace the previous version provided by the 3 foregoing mentioned patents.

BRIEF SUMMARY OF THE INVENTION

The present invention teaches how to code a wave-pipelined circuit with buffering function in HDL. The circuit comprises at least one critical path component (CPC) and a wave-pipelining component (WPC). The WPC comprises one Data_position_shifter per CPC, an Input_register_rotator if wave constant Multiple_copy_number >1, a Combinational_logic_rotator if Multiple_copy_number >1 and the circuit comprises one output register, an Input_clock_rotator if wave constant Input_clock_number >1, a buffering controller and up to 3 FIFOs. Data within the circuit are stored and distributed on critical paths as the first storage and extra output-ready data within the circuit are stored at data FIFO (FIFO_1) as the second storage if needed. Output register index FIFO (FIFO_2) is used to store indexes of output registers if the circuit comprises more than one output register, and make output sequence of data stored in the multiple output registers consistent with their input sequence. Assistant data FIFO (FIFO_3) is used to store assistant data. An input data is blocked from entering the circuit if the circuit is not allowed to output and the number of data buffered within the circuit has reached the capacity of the circuit. A piece of combinational logic is blocked from being latched onto its connected or shared output register if the piece of combinational logic is in locked state, or not otherwise. If the circuit is allowed to output, the data latched earliest by output registers is popped up and output from either the data FIFO if it exists and is not empty, or from one of the output registers otherwise, making data output sequence consistent with data input sequence. Most importantly, each of output registers has an output register state machine playing a key role to control data behavior in the circuit, preventing data contamination from happening. Each state machine has 3 states: idle state, active state and buffered state.

BRIEF DESCRIPTION OF THE SEVERAL VIEWS OF THE DRAWINGS

FIG. 1a is an example block diagram of a prior art hardware device First In and First Out (FIFO).

FIG. 1b is the interface of a FIFO.

FIG. 1c is an interface diagram of a prior art hardware device D type flip-flop.

FIG. 4 is a legend showing all symbols used in from FIG. 4b to FIG. 4u.

FIG. 4a is the block diagram of an exemplary buffering master sub-component (BM) 400.

FIG. 4b shows snapshot 1, an empty and properly initialized BM4 and O_OK_I='1'.

FIG. 4c shows snapshot 2 one cycle after FIG. 4b with O_OK_I='1'.

FIG. 13 is the interface of a series master component with buffering function (SMB) 1310.

FIG. 13a is the interface of a CPC 1300 connected to a SMB 1310.

FIG. 13b is the block diagram of CPC 1300.

FIG. 13c is the schematic of SMB 1310.

FIG. 14 is the interface of a multiple copy master with buffering function (MCMB).

FIG. 14a is the interface of j-th CPC 141j/151j connected to a MCMB.

FIG. 14b is the block diagram of CPCs 1400 linked with MCMB_1 1401.

DETAILED DESCRIPTION OF THE INVENTION

Figure 1:
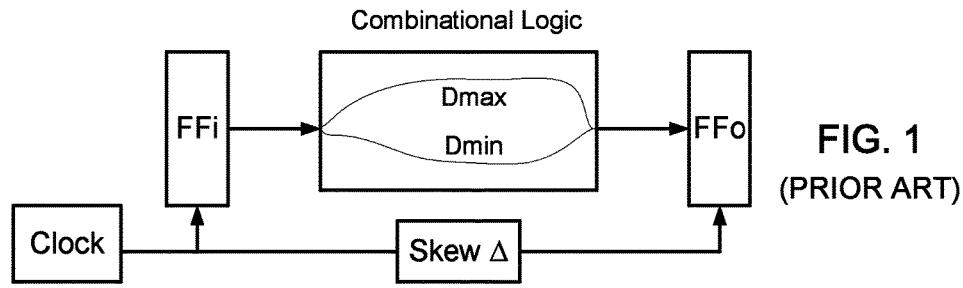
FIG. 1 is a prior art block diagram, showing how wave-pipelining technology applies when a wave-pipelined circuit is being coded before it is generated.

Here are general conventions used in the present invention.

1) "Circuit" hereafter in the present invention refers to a wave-pipelined circuit with buffering function which is being discussed or constructed unless otherwise specified.

2) Each of signals is asserted if it has logic '1' or deasserted if it has logic '0'.

3) A circuit may have either a synchronous initialization input signal SINI or an asynchronous initialization input signal RESET to initialize the circuit, or both the initialization input signals. The present invention has only input signal SINI and no input signal RESET for simplicity without loss of generality.

4) A signal whose name has affix "_m" is either an m-bit signal or an m-set data bus signal related to m pieces of combinational logic or m input/output registers, where m=Multiple_copy_number.

5) A signal whose name has affix "_n" is either an n-bit signal or an n-set data buses related to n output registers, where n=Output_register_number.

6) There are 2 relationships between Multiple_copy_number (=m) and Output_register number (=n) in circuit structures:
   a) m=n>=1; or
   b) m>1 and n=1.
7) Integer j in a signal affix "m(j)" always has range 0<=j<=m−1.
8) Integer j in a signal affix "_n(j)" always has range 0<=j<=n−1.
9) A signal whose name has 2 characters "_I" is an input signal unless specified otherwise.
10) A signal whose name has 2 characters "_O" is an output signal unless specified otherwise.
11) A character '>' in a block diagram or a schematic represents a clock input signal connected to a clock source for the circuit and the clock source is not drawn for simplicity.
12) There are 2 types of data passing through the circuit: working data and assistant data. A working data passes through a critical path, and an assistant data doesn't pass through any critical path and doesn't change when it passes through the circuit. A working data and an assistant data form a pair and the pair synchronously inputs to and outputs from the circuit. The number of the working data and the number of the assistant data buffered in the circuit are always the same. Later all working data are referenced as data, and assistant data are still used.
13) An output register always latches a valid data from its currently connected piece of combinational logic.
14) If a 2-input gate has an x-bit input (x>1), it means there are x 2-input gates each of which repeats the same logic as drawn with the x-bit input replaced by one bit of the x-bit input, and so on. So does a 2-input multiplexor with an x-bit input.
15) A data in the circuit may also be called an output-ready data to emphasize its status to be ready to output without any further change if the data has reaches an output register and is being or waiting to output from the circuit.
16) A critical path is reduced to a non-critical path if signals take one cycle to travel from the input register to the output register.
17) Input data have input data's width, output data have output data's width and assistant data have assistant data's width. Output data's width may be different from input data's width.
18) In all drawings input/output signals that may be multiple bits are drawn in bold lines in order to distinguish from 1-bit signals drawn as normal lines.
19) 3 wave constants Series_clock_number, Input clock_number and Multiple_copy_number of the circuit will be referenced later without adjective "wave constant" for simplicity.

Here are some new definitions:
1) Each of output registers, known as owner output register, owns an output register state machine to indicate the status of the output register. An output register state machine has 3 states: idle state, active state and buffered state.
2) An output register of the circuit is called the active output register if its output register state machine is in the active state.
3) An active output register exists in the circuit on the current cycle if the circuit has an active output register on the current cycle.
4) An output register of the circuit is called a buffered output register if its output register state machine is in the buffered state.
5) A buffered output register exists in the circuit on the current cycle if the circuit has a buffered output register on the current cycle.
6) FIFO_1 is called data FIFO and introduced to provide second storage for the output-ready data in buffering function. FIFO_1 has the same data width as an output register's, and is deployed only when needed.
7) FIFO_2 is called output register index FIFO and introduced to hold the indexes of output registers if the circuit comprises more than one output register. FIFO_2 has the same data width as the index of an output register does.
8) FIFO_3 is called assistant data FIFO and used to store assistant data. The capacity of FIFO_3 is equal to the capacity of the circuit. In the attached code file, assistant data must have at least 1-bit data width.
9) A buffered output register in the circuit is called the top buffered output register if the circuit has only one output register and the output register is in the buffered state, or the circuit has more than one output register, FIFO_2 is not empty and the buffered output register's index is the top data in FIFO_2.
10) A wave-pipelined circuit is called having buffering function if the circuit is capable of storing more than one data without any additional memory cell except the input registers and the output registers of the circuit on any situation and has the maximum throughput.
11) A code component is called a sub-WPC if the code component is designed to be located within a parent WPC.
12) A generic constant for a sub-WPC is called a wave generic constant if the generic constant is expected to receive the determined initial value of a specific wave constant in the parent WPC when the generic constant's initial value is being assigned.
13) An output register is called latching a data, or receiving a data, on the current cycle if the write enable signal to the output register is asserted with the data on the output register's data input on the current cycle and the data will be latched in the output register on next cycle.
14) An output register is called latched a data, or received a data, on the current cycle if the write enable signal to the output register was asserted with the data on the output register's data input on the previous cycle and the data is latched in the output register on current cycle.
15) A past cycle refers to the cycle that occurs one or more cycles before the current cycle.
16) An output register is called releasing its data on the current cycle if the output register is not empty, either being output, or being pushed into FIFO_1 if the circuit comprises FIFO_1.
17) An output register is called not releasing its data on the current cycle if the output register is not empty, not being output, and not being pushed into FIFO_1 if the circuit comprises FIFO_1.
18) A piece of combinational logic is called being in locked state on the current cycle if the piece of combinational logic cannot be latched onto its connected or shared output register.

How Input Handshaking Function Works

Here is the rule on how input handshaking function works for the circuit. Input signal Ready_I is generated by circuit source and asserted if an input data is available, or not otherwise. Write enable output signal WE_I_O is generated by a WPC, and asserted if an input register is latching an input data, or not otherwise. Ready_I and WE_I_O form a pair of handshaking signals. When both are asserted on the current cycle, a data is being latched onto the input register in a CPC on the current cycle, and an assistant data is being latched by the paired WPC onto FIFO_3. A designer should properly advance to provide next input data if WE_I_O is asserted, because WE_I_O is asserted only when input signal Ready_I is asserted.

Figure 2:
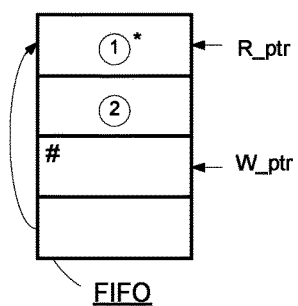
FIG. 2 is a waveform of the circuit, showing how input data D1, D2, D3 and D4 are being latched onto one of input registers.
Figure 2:
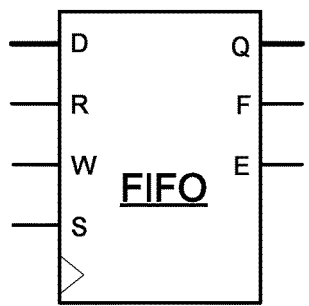
Figure 2:
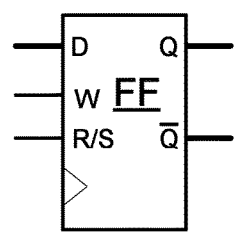
Figure 2:
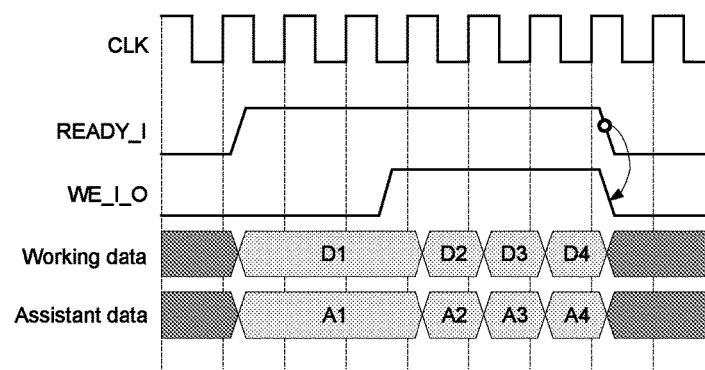

FIG. 2 is a waveform of the circuit, showing how input data D1, D2, D3 and D4 are being latched onto one of input registers when both input signal Ready_I and output signal WE_I_O are asserted, along with assistant data A1, A2, A3 and A4 being latched and saved onto the WPC.

Theory on making the circuit having maximum throughput and using minimum resources Maximum Throughput Theorem 1

A wave-pipelined circuit with one critical path can achieve maximum throughput if and only if it can accept all continuously input data to fill itself without data contamination, and the gap of cycles between 2 continuously input data in the critical path meets the limit posed by Input_clock_number of the circuit.

Maximum Throughput Theorem 2

A wave-pipelined circuit with multiple critical paths can achieve maximum throughput if and only if its every critical path achieves its maximum throughput and the gap of cycles between 2 continuously input data for each of the critical paths meets the limit posed by Multiple_copy_number of the circuit.

Critical Path Storage Theorem 1

A critical path can store at most 2 data without data contamination if no other memory cells are added on the critical path.

Proof: an output register can store one output-ready data which will not be damaged if the output register is not releasing its data and the output register is being blocked to latch next data. When the output register is being blocked to receive next data, the combination of the input register and its connected piece of the combinational logic can hold at most one data without data contamination.

Critical Path Storage Theorem 2

A wave-pipelined circuit can store at most Register number of data without data contamination if no other memory cells are added to the circuit.

Proof: there are 2 situations:
1) Each critical path has an input register and an output register: the proof of the theorem is based on Critical path storage theorem 1.
2) Multiple critical paths share one output register: the sole output register can store one data and each input register in combination with its connected piece of combinational logic can store one data without data contamination, based on the similar analysis of Critical path storage theorem 1.

Here are the rules on how to calculate 5 special positive integer constants Register_number, Necessary_capacity, Wanted_capacity, F1_capacity and Circuit_capacity that are closely related to buffering function in the circuit:
1) Later the number of input registers represents the number of combinations of an input register and its connected piece of combinational logic in the circuit.
2) Integer constant Necessary_capacity is the smallest positive integer that meets following 3 requirements in order for the circuit to use minimum number of extra memory cells to get maximum throughput:
   a) Up to Necessary_capacity data can be buffered within the circuit on any cycle;
   b) No data contamination occurs if the circuit is not allowed to output on any cycle; and
   c) The circuit has maximum throughput on any situation.
3) The formulae for the positive integer constant Necessary_capacity are:
   a) Necessary_capacity=floor(Series_clock_number/Input_clock_number)+1 if Multiple_copy_number=1; where function floor(x) maps a real number x to the greatest integer less than or equal to x.
   b) Necessary_capacity=Series_clock_number+1 if Multiple_copy_number >1.
4) Input integer constant Wanted_capacity indicates minimum number of data for the circuit to buffer and it is a requirement specified by a designer and has nothing to do with the critical paths.
5) Integer Register_number is the number of registers used in the circuit, and is equal to the sum of the total number of input registers and the total number of output registers for the circuit. Register_number is the number of data that can be buffered in the circuit without extra memory cells of FIFO_1 to store, based on Critical path storage theorem 2.
6) Integer constant Circuit_capacity is the number of data that the circuit can buffer and meet 2 requirements: a) minimum number of extra data cells in FIFO_1; and b) maximum throughput on any situation. Circuit_capacity is calculated by following equation:

Circuit_capacity=max(Register_number,Necessary_capacity,Wanted_capacity);

where max (x, y, z) is a function to return the largest integer among its 3 input integer x, y and z.
7) Integer constant F1_capacity is defined by following equation if F1_capacity >0: F1_capacity=max (Necessary_capacity, Wanted_capacity)−Register_number. F1_capacity is the smallest number of extra memory cells used by FIFO_1. FIFO_1 is absent in the circuit if F1_capacity <=0.
8) Data within the circuit are stored and distributed on critical paths as the first storage and in FIFO_1 as the second storage if needed when the circuit is not allowed to output.
9) No data contamination will occur if all following requirements are satisfied:
   a) No data contamination occurs on any critical paths. That is guaranteed by a synthesizer, not by a part of a design.
   b) The circuit is allowed to input on the current cycle if the circuit is either allowed to output or the number of data buffered in the circuit has not reached the capacity of the circuit.
   c) An input register is eligible to receive an input data if following two conditions are satisfied:
      The number of cycles from a past cycle receiving a data by the input register to the current cycle is equal to or greater than Input_clock_number if Input_clock_number >1.
      The input register has its turn to receive next input data if Multiple_copy_number >1.

d) A locked piece of combinational logic is blocked from being latched onto its connected or shared output register.
e) No overflow and underflow occur for any FIFOs.

Examples on how to Calculate Some Important Constants

Figure 3:
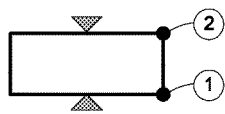
FIG. 3 is the data flow block diagram for a circuit with Series_clock_number=Input_clock_number=Multiple_copy_number=1.
Figure 3A:
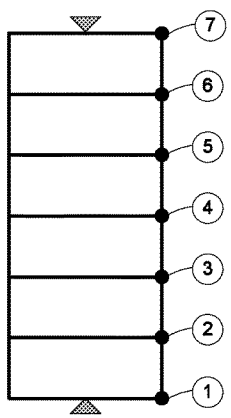
FIG. 3a is the data flow block diagram for a circuit with Series_clock_number=6 and Input_clock_number=Multiple_copy_number=1.
Figure 3B:
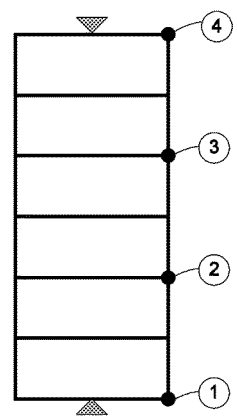
FIG. 3b is the data flow block diagram for a circuit with Series_clock_number=6, Input_clock_number=2 and Multiple_copy_number=1.
Figure 3C:
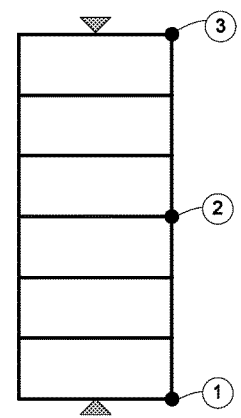
FIG. 3c is the data flow block diagram for a circuit with Series_clock_number=6, Input_clock_number=3 and Multiple_copy_number=1.
Figure 3D:
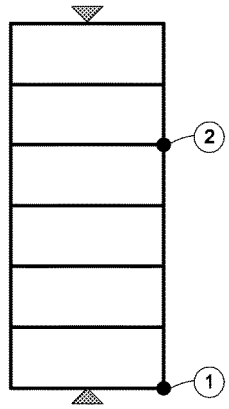
FIG. 3d is the data flow block diagram for a circuit with Series_clock_number=6, Input_clock_number=4, Multiple_copy_number=1.
Figure 3E:
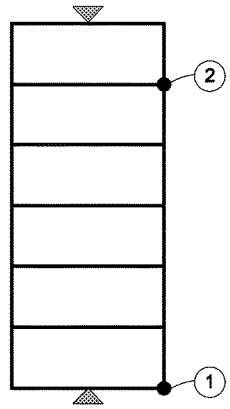
FIG. 3e is the data flow block diagram for a circuit with Series_clock_number=6, Input_clock_number=5, Multiple_copy_number=1.
Figure 3F:
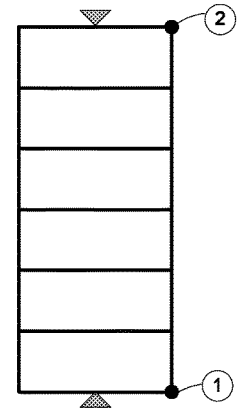
FIG. 3f is the data flow block diagram for a circuit with Series_clock_number=6, Input_clock_number=6, Multiple_copy_number=1.
Figure 3G:
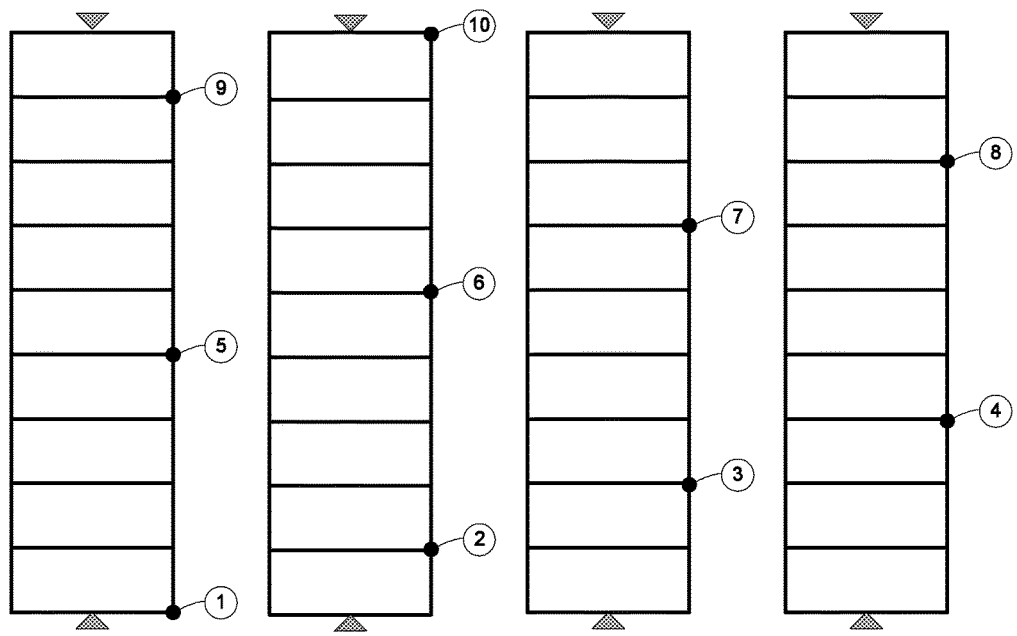
FIG. 3g is the data flow block diagram for a circuit with Series_clock_number=9 and Output_register_number=Multiple_copy_number=4.
Figure 3H:
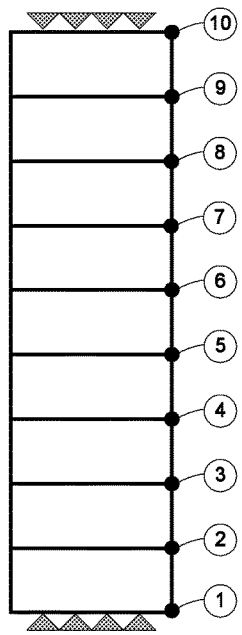
FIG. 3h is an equivalent data flow block diagram for the same circuit in FIG. 3g with Series_clock_number=9 and Output_register_number=Multiple_copy_number=4.
Figure 3I:
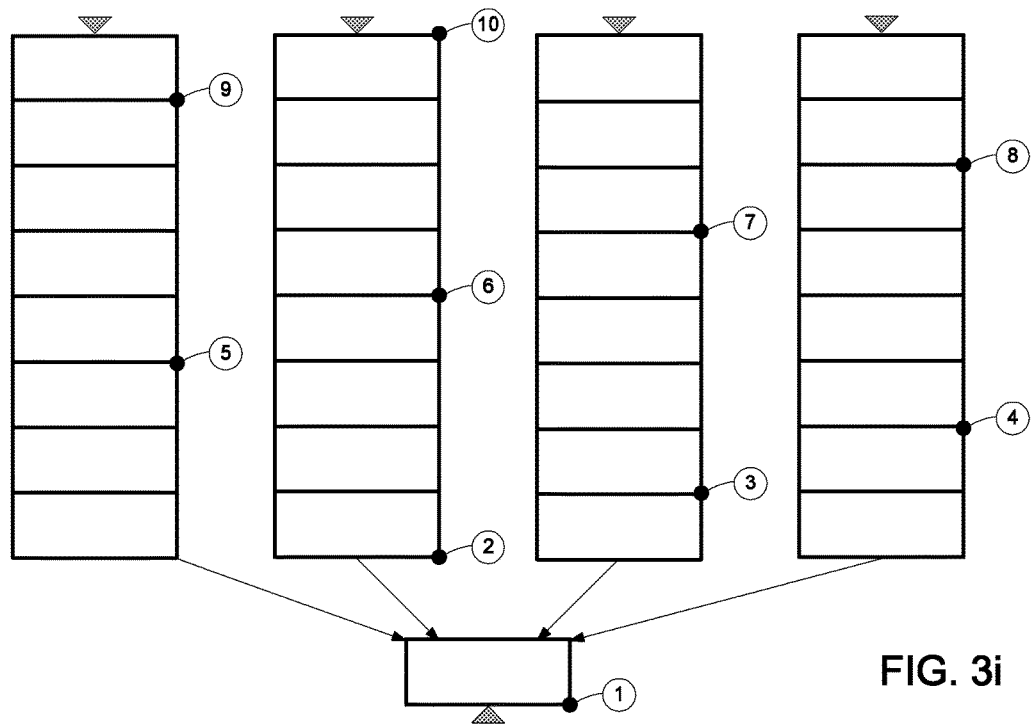
FIG. 3i is the data flow block diagram for a circuit with Series_clock_number=9, Multiple_copy_number=4 and Output_register_number=1.
Figure 3J:
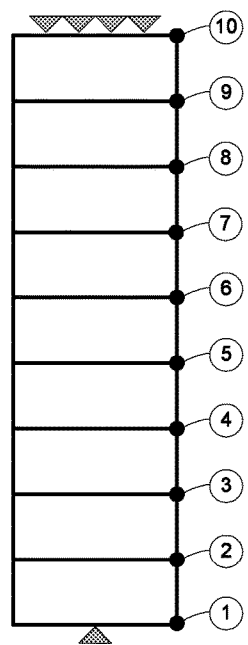
FIG. 3j is the equivalent data flow block diagram for the same circuit in FIG. 3i with Series_clock_number=9, Multiple_copy_number=4 and Output_register_number=1.

FIG. 3 to FIG. 3j are data flow block diagram examples, teaching how to calculate 5 constants Necessary_capacity, Register_number, Wanted_capacity, F1_capacity and Circuit_capacity based on 3 wave constants Series_clock_number, Input_clock_number and Mu;tiple_copy_number of the circuits to cover all different calculation situations. In FIG. 3 to FIG. 3j a column of rectangles represents a critical path from the input register through the piece of combinational logic to the output register, and each of horizontal lines represents a position on the critical path, where each of cycles for data to take to travel through the critical path has a position in time series in the data flow block diagram; a large black dot on one horizontal line represents a valid data located in the position on the critical path; an encircled number indicates input series number of a valid data; a facing down triangle touches the input register which is connected to the input of a piece of combinational logic, and a facing up triangle touches the output register which is connected to the output of a piece of combinational logic. All data are input continuously one data per cycle if Input_clock_number=1, or one data per Input_clock_number cycles if Input_clock_number >1.

FIG. 3 is the data flow block diagram for a circuit with Series_clock_number=Input_clock_number=Multiple_copy_number=1. The circuit comprises one CPC which has one input register, one output register and there is no critical path. The circuit is a non-critical normal circuit and has 2 positions to fill. In the circuit Necessary_capacity=Register_number=2.

FIG. 3a is the data flow block diagram for a circuit with Series_clock_number=6 and Input_clock_number=Multiple_copy_number=1. The circuit comprises one CPC. While data 7 is latched onto the input register data 1 is latched onto the output register on the current cycle. In the circuit Necessary_capacity=floor (Series_clock_number/Input_clock_number)+1=7, Register_number=2 and F1_capacity=5; the input register and the output register together can store 2 data, and FIFO_1 needs 5 memory cells to store other 5 output-ready data to avoid data contamination.

FIG. 3b is the data flow block diagram for a circuit with Series_clock_number=6, Input_clock_number=2 and Multiple_copy_number=1. The circuit comprises one CPC which has two consecutively input data separated by 2 cycles to avoid data contamination. In the circuit Necessary_capacity=floor (Series_clock_number/Input_clock_number)+1=4, Register_number=2 and F1_capacity=2.

FIG. 3c is the data flow block diagram for a circuit with Series_clock_number=6, Input_clock_number=3 and Multiple_copy_number=1. The circuit comprises one CPC which has two consecutively input data separated by 3 cycles to avoid data contamination. In the circuit Necessary_capacity=floor (Series_clock_number/Input_clock_number)+1=3, Register_number=2 and F1_capacity=1.

FIG. 3d is the data flow block diagram for a circuit with Series_clock_number=6, Input_clock_number=4, Multiple_copy_number=1. The circuit comprises one CPC which has two consecutively input data separated by 4 cycles to avoid data contamination. In the circuit Necessary_capacity=floor (Series_clock_number/Input_clock_number)+1=2, Register_number=2 and F1_capacity=0.

FIG. 3e is the data flow block diagram for a circuit with Series_clock_number=6, Input_clock_number=5, Multiple_copy_number=1. Its analysis is the same as for FIG. 3d except that the CPC has two consecutively input data separated by 5 cycles to avoid data contamination.

FIG. 3f is the data flow block diagram for a circuit with Series_clock_number=6, Input_clock_number=6, Multiple_copy_number=1. Its analysis is the same as for FIG. 3d except that the CPC has two consecutively input data separated by 6 cycles to avoid data contamination.

FIG. 3g is the data flow block diagram for a circuit with Series_clock_number=9 and Output_register_number=Multiple_copy_number=4. The circuit comprises 4 CPC copies; each CPC has an input register, one piece of combinational logic and an output register. Data inputs are rotated among 4 CPCs so that each CPC has two consecutively input data separated by 4 cycles to avoid data contamination, and input data for the circuit are acceptable one data per cycle.

FIG. 3h is an equivalent data flow block diagram for the same circuit in FIG. 3g with Series_clock_number=9 and Output_register_number=Multiple_copy_number=4. Four CPCs in FIG. 3g are combined together virtually to generate the data flow block diagram FIG. 3h which is equivalent to FIG. 3g. By equivalent it means that both circuits would have the same performance, same total number of input registers and output registers in purpose for the calculation of the number of extra memory cells for FIG. 3g. In circuit FIG. 3h Necessary_capacity=Series_clock_number+1=10, Register number=8 and F1_capacity=2, so are they for FIG. 3g.

FIG. 3i is the data flow block diagram for a circuit with Series_clock_number=9, Multiple_copy_number=4 and Output_register_number=1. The circuit comprises 4 same CPC copies, each CPC has an input register, one piece of combinational logic and all 4 CPCs share a sole output register. Data inputs are rotated among 4 CPCs so that each CPC has two consecutively input data separated by 4 cycles, and input data for the circuit are acceptable one data per cycle.

FIG. 3j is the equivalent data flow block diagram for the same circuit in FIG. 3i with Series_clock_number=9, Multiple_copy_number=4 and Output_register_number=1. 4 CPCs in FIG. 3i are combined together virtually to generate the data flow block diagram FIG. 3j which is equivalent to FIG. 3i. In circuit FIG. 3j Necessary_capacity=Series_clock_number+1=10, Register number=5 and F1_capacity=5, so are they for the FIG. 3i.

A designer can use input integer constant Wanted_capacity to specify minimum number of data he needs for the circuit to buffer. Following formula for F1_capacity can be used to meet the special requirement required by the designer if F1_capacity >1:

$$F1\_capacity=\max(Necessary\_capacity, Wanted\_capacity)-Register\_number.$$

6 Buffering Configurations for the Circuit

There are 6 different buffering configurations for the circuit. Each of the buffering configurations has a buffering master component BMx ($1<=x<=6$):

1) The circuit comprises one CPC which has one input register, one piece of combinational logic and one output register, with BM1 having neither FIFO_1 nor FIFO_2, where m=n=1.
2) The circuit comprises one CPC which has one input register, one piece of combinational logic and one output register, with BM2 having FIFO_1 and no FIFO_2, where m=n=1.
3) The circuit comprises m CPCs each of which has one input register, one piece of combinational logic and one output register, with BM3 having FIFO_2 and no FIFO_1, where m=n>1.
4) The circuit comprises m CPCs each of which has one input register, one piece of combinational logic and one output register, with BM4 having both FIFO_1 and FIFO_2, where m=n>1.
5) The circuit comprises m CPCs each of which has one input register, one piece of combinational logic, and m CPCs share one output register, with BM5 having FIFO_2 and no FIFO_1, where m>1, n=1.
6) The circuit comprises m CPCs each of which has one input register, one piece of combinational logic, and m CPCs share one output register, with BM6 having FIFO_2 and FIFO_1, where m>1, n=1.

The following table 1 summarizes the 6 different buffering configurations:

TABLE 1

| # | No. of CPCs | No. of Input registers | No. of combinational logic | No. of output registers | FIFO_1 | FIFO_2 |
|---|---|---|---|---|---|---|
| 1 | 1 | 1 | 1 | 1 | No | No |
| 2 | 1 | 1 | 1 | 1 | Yes | No |
| 3 | m > 1 | m > 1 | m > 1 | m = n > 1 | No | Yes |
| 4 | m > 1 | m > 1 | m > 1 | m = n > 1 | Yes | Yes |
| 5 | m > 1 | m > 1 | m > 1 | 1 | No | No |
| 6 | m > 1 | m > 1 | m > 1 | 1 | Yes | No |

How a Buffering Master Component Operates

Figure 4D:
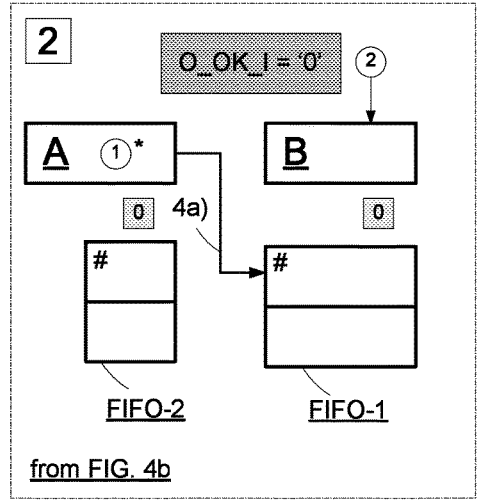
FIG. 4d shows snapshot 2 one cycle after FIG. 4b with O_OK_I='0'.
Figure 4E:
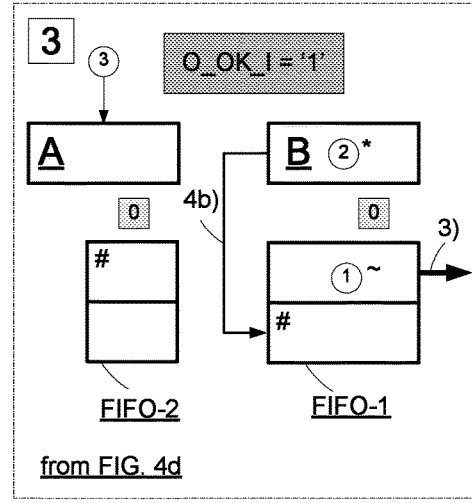
FIG. 4e shows snapshot 3 after FIG. 4d with O_OK_I='1'.
Figure 4F:
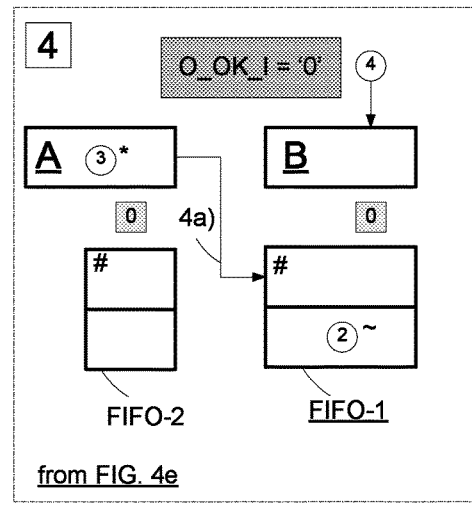
FIG. 4f shows snapshot 4 with O_OK_I='0'.
Figure 4G:
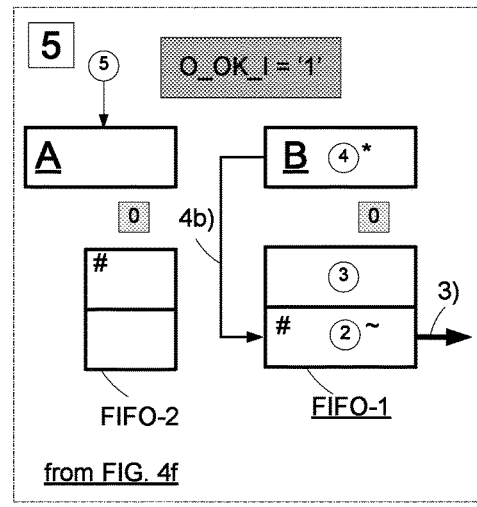
FIG. 4g shows snapshot 5 with O_OK_I='1'.
Figure 4H:
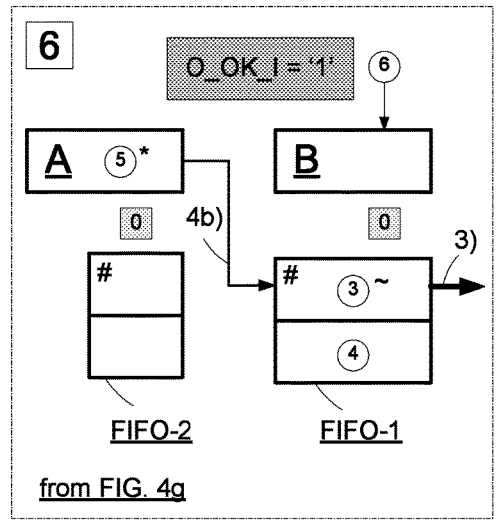
FIG. 4h shows snapshot 6 with O_OK_I='1'.
Figure 4I:
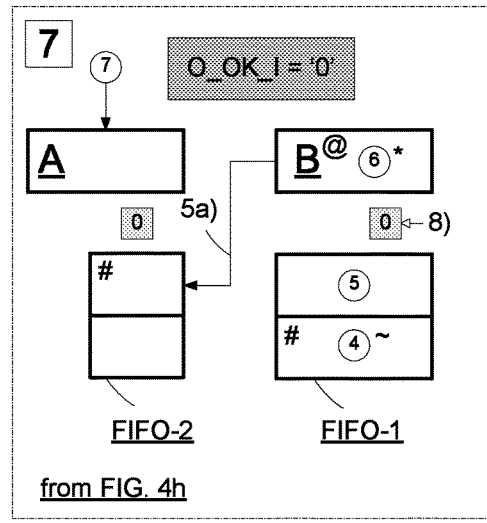
FIG. 4i shows snapshot 7 with O_OK_I='0'.
Figure 4J:
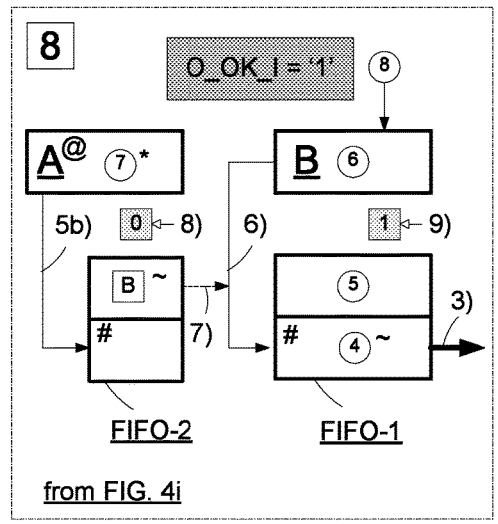
FIG. 4j shows snapshot 8 with O_OK_I='1'.
Figure 4K:
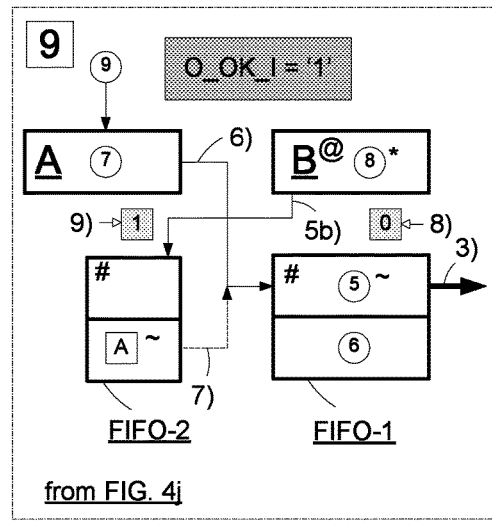
FIG. 4k shows snapshot 9 with O_OK_I='1'.
Figures 4L, 4M:
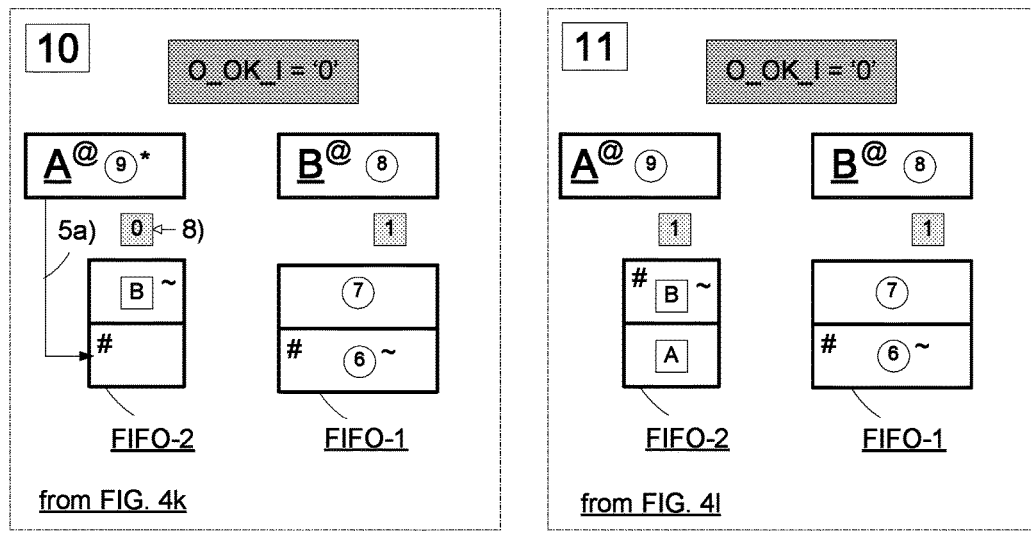
FIG. 4l shows snapshot 10 with O_OK_I='0'.
FIG. 4m shows snapshot 11 with O_OK_I='0'.
Figures 4N, 4O:
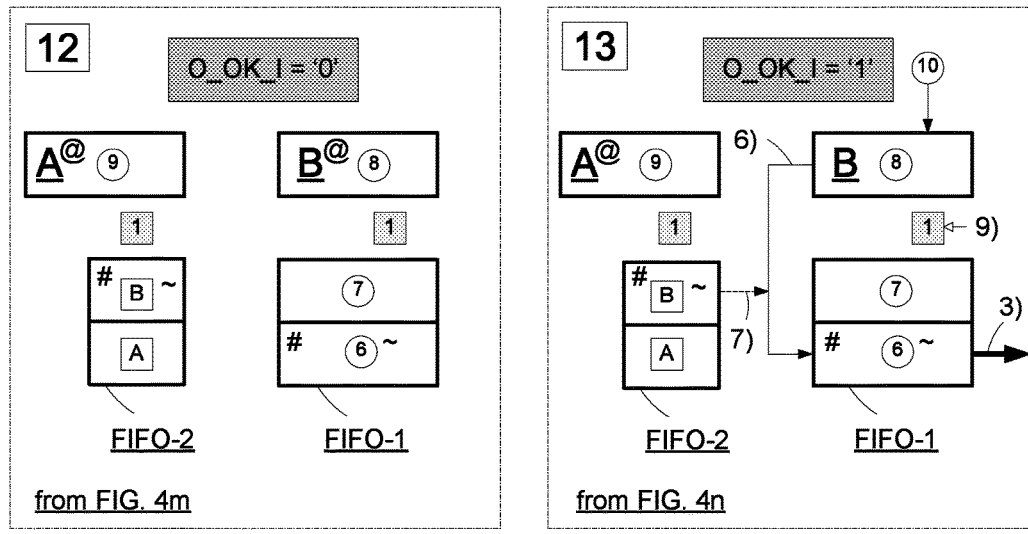
FIG. 4n shows snapshot 12 with O_OK_I='0'.
FIG. 4o shows snapshot 13 with O_OK_I='1'.
Figure 4P:
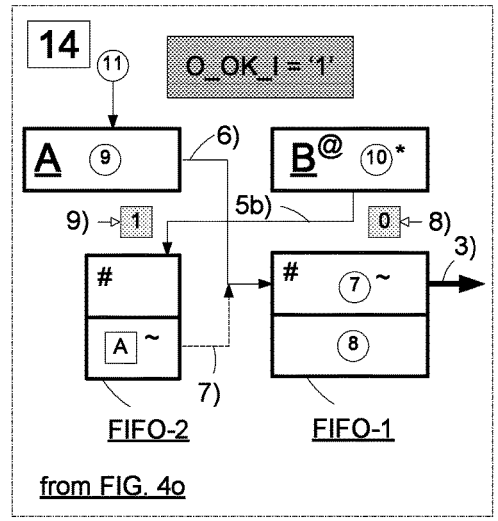
FIG. 4p shows snapshot 14 with O_OK_I='1'.
Figure 4Q:
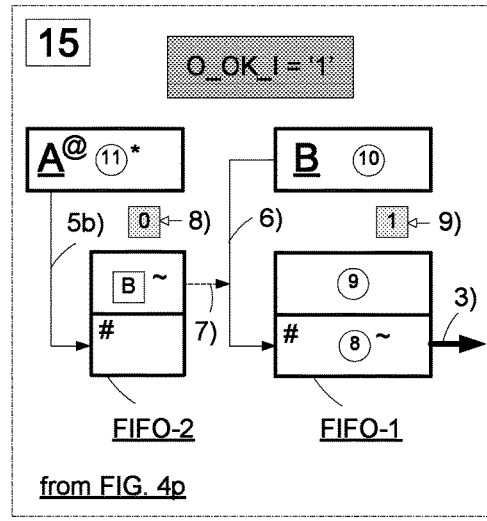
FIG. 4q shows snapshot 15 with O_OK_I='1'.
Figure 4R:
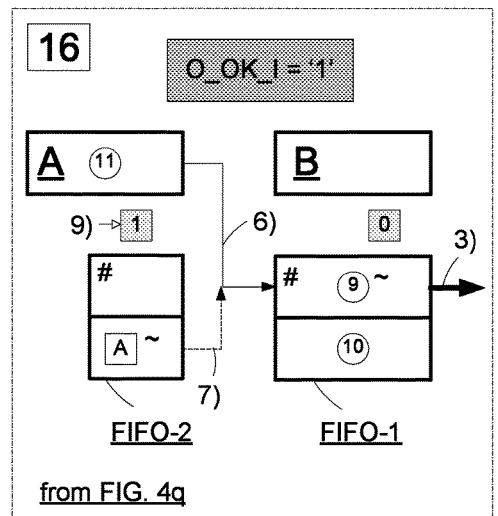
FIG. 4r shows snapshot 16 with O_OK_I='1'.
Figure 4S:
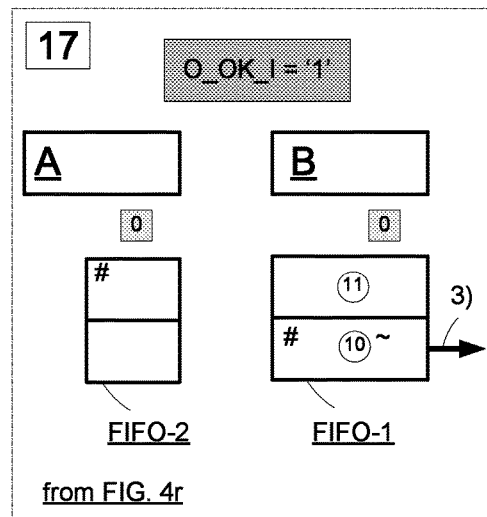
FIG. 4s shows snapshot 17 with O_OK_I='1'.
Figures 4T, 4U:
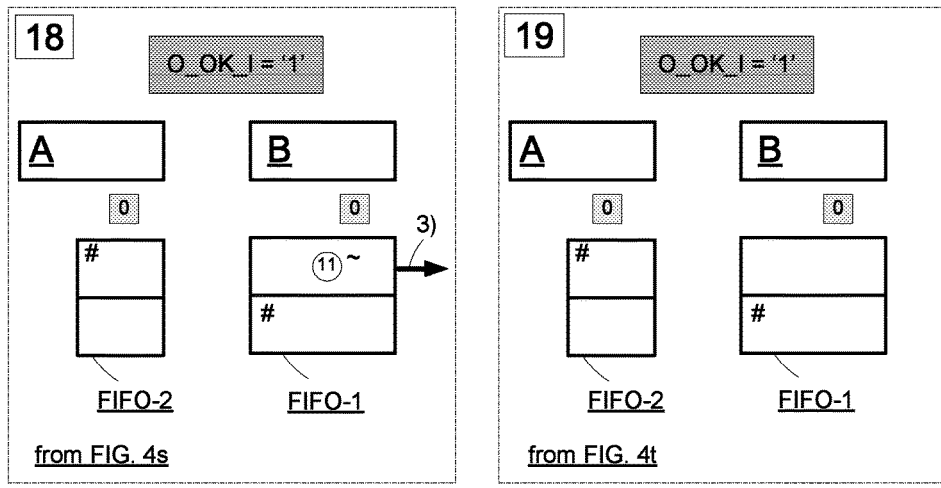
FIG. 4t shows snapshot 18 with O_OK_I='1'.
FIG. 4u shows snapshot 19 with O_OK_I='1

FIG. 4 is a legend showing all operation symbols used in from FIG. 4b to FIG. 4u on the current cycle.

1)  indicates that series number of a snapshot. Two snapshots with consecutive series numbers are one cycle apart between them.

2)  indicates that a data is being latched onto an output register on the current cycle and the encircled number is the series number of the data.

3) '*' indicates the active output register.

4)  indicates a valid data with its encircled series number at output registers or FIFO_1.

5)  indicates a buffered output register's index in FIFO_2.

6)  indicates that a data is being output from either an output register or FIFO_1 based on rule x.

7)  indicates that an output register is being pushed into FIFO_1 based on rule x.

8)  indicates that the top buffered output register index is triggering to push top buffered output register into FIFO_1 based on rule x.

9)  3x indicates that B-bit register is being toggled based on rule 3x.

10) '#' indicates next write position in FIFO_1 or FIFO_2.

11) '~' indicates top read data in FIFO_1 or FIFO_2.

12) A@ indicates that output register A is being blocked to latch data from its connected piece of combinational logic.

FIG. 4a is the block diagram of an exemplar buffering master sub-component (BM4) 400. BM is a sub-component of a WPC (a SMB or a MCMB) and is introduced to provide buffering function for the circuit.

1) Data FIFO_1 401 is used to store extra output-ready data as the second storage if needed. FIFO_1's capacity is equal to the integer F1_capacity if F1_capacity >0. FIFO_1 is absent if F1_capacity <=0.
2) Output register index FIFO_2 402 stores the indexes of the buffered output registers, and is introduced to keep the output sequence of data latched onto output registers consistent with their input sequence. FIFO_2 is deployed only if Output_register number >1 and the capacity of FIFO_2 is equal to Output_register number.
3) Assistant data FIFO_3 403 stores assistant data for the circuit. FIFO_3 capacity is equal to the capacity of the circuit.
4) Flag 404, named as B-bit, is a 1-bit register representing the buffered state of an output register in all situations. The flag is asserted if the output register is in the buffered state, or not otherwise. A B-bit and a V-bit form the output register state machine of an output register. V-bit is not part of BM 400.
5) O_OK_I 405 is an input signal generated by the circuit output receiver and asserted if the circuit is allowed to output, or not otherwise.
6) Each of registers 406 represents an output register for the circuit. The output registers are located outside of BM.
7) BM input operations are controlled by input signal WE_I which is asserted if a data is being latched into an input register and an assistant data is being latched into FIFO_3, or not otherwise.
8) All FIFOs and B-bits are properly initialized one cycle after input signal SINI is asserted.

FIG. 4b to FIG. 4u show a series of consecutive snapshots of the component BM4 400 as a circuit operation exemplar, demonstrating how 11 consecutively data pass through the component BM4 for buffering configuration 4). In this exemplar, the circuit is assumed to comprise 2 output registers A and B, 2 memory cells in FIFO_1, 2 input registers and 2 pieces of combinational logic (not drawn), so Output_register_number=2, Register_number=4, F1_capacity=2 and the capacity of the circuit=6. That is, the circuit can buffer at most 6 valid data without data contamination and has the maximum throughput. Any two of consecutive snapshots are one cycle apart. FIG. 4c and FIG. 4d are two different snapshots on the same cycle one cycle after FIG. 4b, corresponding to two different values of input signal O_OK_I to emphasize its role. For drawing convenience output registers A and B are drawn within each frame of the BM4. All invalid data are absent and their positions are left blank. The fullness and emptiness of FIFO_1 and FIFO_2 are clearly shown in the figures. A clock input '>' is not drawn from FIG. 4a to FIG. 4u for simplicity. All operations for a figure are described on the current cycle; mentioned rules are based on 4th set of operation rules (shown shortly) unless specified otherwise. The circuit is allowed to output if O_OK_I='1', or not otherwise.

FIG. 4b shows snapshot 1, an empty and properly initialized BM4 and O_OK_I=
1) Output nothing based on rule 2) of general set of operation rules.
2) Data 1 is entering output register A from its connected piece of combinational logic.

FIG. 4c shows snapshot 2 one cycle after FIG. 4b with O_OK_I='1'.
1) The active output register A receives data 1.
2) Data 1 is being output based on rule 2).
3) Data 2 is entering output register B.

FIG. 4d shows snapshot 2 one cycle after FIG. 4b with O_OK_I='0'.
1) The active output register A receives data 1.
2) Data 1 is being pushed into FIFO_1 based on rule 4a).
3) Data 2 is entering output register B.
4) Output nothing based on rule 2) of general set of operation rules.

FIG. 4e shows snapshot 3 one cycle after FIG. 4d with O_OK_I='1'.
1) The active output register B receives data 2.
2) Data 2 is being pushed into FIFO_1 based on rule 4b).
3) FIFO_1 receives data 1 from output register A.
4) Top data 1 in FIFO_1 is being output based on rule 3).
5) Data 3 is entering output register A.

FIG. 4f shows snapshot 4 with O_OK_I='0'.
1) The active output register A receives data 3.
2) Data 3 is being pushed into FIFO_1 based on rule 4a).
3) FIFO_1 receives data 2 from output register B.
4) Data 4 is entering output register B.
5) Output nothing based on rule 2) of general set of operation rules.

FIG. 4g shows snapshot 5 with O_OK_I='1'.
1) The active output register B receives data 4.
2) Data 4 is being pushed into FIFO_1 based on rule 4b).
3) FIFO_1 receives data 3 from output register A.
4) Top data 2 in FIFO_1 is being output based on rule 3).
5) Data 5 is entering output register A.

FIG. 4h shows snapshot 6 with O_OK_I='1'.
1) The active output register A receives data 5.
2) Data 5 is being pushed into FIFO_1 based on rule 4b).
3) FIFO_1 receives data 4 from output register B.
4) Top data 3 in FIFO_1 is being output based on rule 3).
5) Data 6 is entering output register B.

FIG. 4i shows snapshot 7 with O_OK_I='0'.
1) The active output register B receives data 6.
2) Output register B's index is being pushed into FIFO_2 based on rule 5a).
3) B-bit for output register B is being asserted based on rule 8).
4) Output register B is blocked to receive next data based on rule 7) of general set of operation rules.
5) FIFO_1 receives data 5 from output register A.
6) Data 7 is entering output register A.
7) Output nothing based on rule 2) of general set of operation rules.

FIG. 4j shows snapshot 8 with O_OK_I='1'.
1) The active output register A receives data 7.
2) The index of output register A is being pushed into FIFO_2 based on rule 5b).
3) B-bit for output register A is being asserted based on rule 8).
4) Output register A is blocked to receive next data based on rule 7) of general set of operation rules.
5) Top data 4 in FIFO_1 is being output based on rule 3).
6) FIFO_2 receives output register B's index.
7) Top index data in FIFO_2 is popping off based on rule 7).
8) B-bit for output register B is being cleared based on rule 9).
9) Data 6 at the top buffered output register B is being pushed into FIFO_1 based on rule 6).
10) Data 8 is entering output register B.

FIG. 4k shows snapshot 9 with O_OK_I='1'.
1) The active output register B receives data 8.
2) The index of output register B is being pushed into FIFO_2 based on rule 5b).
3) B-bit for output register B is being asserted based on rule 8).
4) Output register B is blocked to receive next data based on rule 7) of general set of operation rules.
5) FIFO_1 receives data 6 from output register B.
6) FIFO_2 receives output register A's index.
7) Top data 5 in FIFO_1 is being output based on rule 3).
8) Top index data in FIFO_2 is popping off based on rule 7)
9) B-bit for output register A is being cleared based on rule 9).
10) Data 7 at the top buffer output register A is being pushed into FIFO_1 based on rule 6).
11) Data 9 is entering output register A.

FIG. 4l shows snapshot 10 with O_OK_I='0'.
1) The active output register A receives data 9.
2) The index of output register A is being pushed into FIFO_2 based on rule 5a).
3) B-bit for output register A is being asserted based on rule 8).
4) Output registers A and B are blocked to receive next data based on rule 7) of general set of operation rules.
5) FIFO_1 receives data 7 from output register A.
6) FIFO_2 receives output register B's index.
7) Output nothing based on rule 2) of general set of operation rules.

FIG. 4m shows snapshot 11 with O_OK_I='0'.
1) There is no active register.
2) Output registers A and B are blocked to receive next data based on rule 7) of general set of operation rules.
3) FIFO_1 and both output registers A and B are full.
4) FIFO_2 receives output register A's index and is full.
5) Output nothing based on rule 2) of general set of operation rules.

FIG. 4n shows snapshot 12 with O_OK_I='0'.
1) There is no active register.
2) Output registers A and B are blocked to receive next data based on rule 7) of general set of operation rules.
3) FIFO_1, FIFO_2 and both output registers A and B are full.
4) Status in FIG. 4n can be continued for any number of cycles without data contamination.
5) Each of 2 pieces of combinational logic connected to output registers A and B may hold one additional data.
6) Output nothing based on rule 2) of general set of operation rules.

FIG. 4o shows snapshot 13 with O_OK_I='1'.
1) Top data 6 in FIFO_1 is being output based on rule 3).
2) Top index data in FIFO_2 is popping off based on rule 7).
3) Data 8 at the top buffered output register B is being pushed into FIFO_1 based on rule 6).

4) B-bit for output register B is being cleared based on rule 9).
5) Output register A is blocked to receive next data based on rule 7) of general set of operation rules.
6) Data 10 is entering output register B.

FIG. 4p shows snapshot 14 with O_OK_I='1'.
1) The active output register B receives data 10.
2) The index of output register B is being pushed into FIFO_2 based on rule 5b).
3) Output register B is blocked to receive next data based on rule 7) of general set of operation rules.
4) B-bit for output register B is being asserted based on rule 8).
5) FIFO_1 receives data 8 from output register B.
6) Top data 7 in FIFO_1 is being output based on rule 3).
7) Top index data in FIFO_2 is popping off based on rule 7).
8) Data 9 at the top buffered output register A is being pushed into FIFO_1 based on rule 6).
9) B-bit for output register A is being cleared based on rule 9).
10) Data 11 is entering output register A.

FIG. 4q shows snapshot 15 with O_OK_I='1'.
1) The active output register A receives data 11.
2) The index of output register A is being pushed into FIFO_2 based on rule 5b).
3) B-bit for output register A is being asserted based on rule 8).
4) Output register A is blocked to receive next data based on rule 7) of general set of operation rules.
5) FIFO_1 receives data 9 from output register A.
6) FIFO_2 receives output register B's index.
7) Top data 8 in FIFO_1 is being output based on rule 3).
8) Top index data in FIFO_2 is popping off based on rule 7).
9) Data 10 at the top buffered output register B is being pushed into FIFO_1 based on rule 6).
10) B-bit for output register B is being cleared based on rule 9).
11) The exemplar has total of 11 data and there are no more data to enter the output registers.

FIG. 4r shows snapshot 16 with O_OK_I='1'.
1) There is no active output register.
2) FIFO_1 receives data 10 from output register B.
3) Top data 9 in FIFO_1 is being output based on rule 3).
4) FIFO_2 receives output register A's index.
5) Top index data in FIFO_2 is popping off based on rule 7).
6) Data 11 at the top buffered output register A is being pushed into FIFO_1 based on rule 6).
7) B-bit for output register A is being cleared based on rule 9).

FIG. 4s shows snapshot 17 with O_OK_I='1'.
1) There is no active output register.
2) FIFO_1 receives data 11 from output register A.
3) Top data 10 in FIFO_1 is being output based on rule 3).

FIG. 4t shows snapshot 18 with O_OK_I='1'.
1) There is no active output register.
2) Top data 11 in FIFO_1 is being output based on rule 3).

FIG. 4u shows snapshot 19 with O_OK_I='1'.
1) BM4 become empty.
2) Output nothing based on rule 2) of general set of operation rules.

Figure 5:
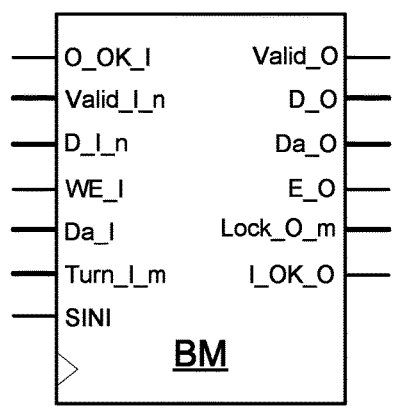
'
FIG. 5 shows the interface of a BM.

FIG. 5 shows the interface of a BM. Because the circuit has 6 different buffering configurations, BM has 6 different components from BM1 to BM6, 6 sets of operation rules and all 6 BMs have the same interface. All sets of operation rules for the circuit guarantee three things:
1) No data contamination occurs within the circuit on any situations.
2) The circuit has the maximum throughput.
3) All data and assistant data are output in the same order as they enter the circuit.

This patent application provides the circuit with two new types of WPC: a SMB and a MCMB in order to replace 4 old types of WPC proposed in the 3 foregoing mentioned patents, because they are easier to use, more user-friendly and provide extra buffering function which each wave-pipelined circuit design must have.

One thing is clear that all main principles invented in the 3 foregoing mentioned patents are strictly followed unless new better schemes are designed.

A BM is a sub-WPC and is located within a parent WPC (either a SMB or a MCMB). BM has 3 wave generic constants and 4 normal generic constants:
1) Series_clock_number1: it will be assigned with the parent WPC's Series clock number.
2) Input_clock_number1: it will be assigned with a SMB's Input_clock_number if the BM is located within the SMB or with default value 1 if the BM is located within a MCMB.
3) Multiple_copy_number1: it will be assigned with default value 1 if the BM is located within a SMB or with a MCMB's Multiple_copy_number if the BM is located within the MCMB.
4) Wanted_capacity: it is the minimum number of data a designer wants the circuit to buffer, and is assigned with the parent WPC's Wanted_capacity.
5) Output_register_number: it is the number of output registers in the circuit, and is assigned with the parent WPC's Output_register_number.
6) Output_data_width: it is output data's width of the circuit, and is assigned with the parent WPC's Output_data_width.
7) Assistant_data_width: it is the assistant data's width of the circuit, and is assigned with the parent WPC's Assistant_data_width. The width must be >=1.

A SMB has no Multiple_copy_number, a MCMB has no Input_clock_number, and BM sub-component is designed to be used within either a SMB or a MCMB, resulting in that BM must include all 3 wave generic constants.

Here are new rules on how to code a wave generic constant in a sub-WPC that is different from and better than the earlier method provided in the 3 foregoing mentioned patents:
1) Code a wave generic constant as a normal generic constant in the sub-WPC and the wave generic constant may have any name a designer wants.
2) Specify 1 as the wave generic constant's default value in the sub-WPC.
3) When the sub-WPC's instantiation is coded within its parent WPC, assign the wave generic constant with the default value if the parent WPC does not have the specific wave constant's definition which the sub-WPC has, or a constant that will receive the specific wave constant's determined initial value of the parent WPC otherwise. If the sub-WPC is only one level under the parent WPC which has the definition of the specific wave constant, the constant is the specific wave constant of the WPC.

A BM has 7 input signals:
1) O_OK_I: it is asserted if the circuit is allowed to output, or not otherwise.

2) D_I_n: it is an n-set data bus input signal. D_I_n(j) is output data from j-th output register and has output data's width.
3) Da_I: it is an assistant data input signal and has assistant data's width.
4) Valid_I_n: it is an n-bit input signal. Valid_I_n(j) is asserted if both D_I_n(j) and Da_I are valid, or not otherwise. Valid_I_n(j)'s assertion lasts one cycle for a valid input data.
5) WE_I: it drives the write enable input signal to FIFO_3, and is asserted if the circuit is receiving an input data, or not otherwise. WE_I's assertion lasts one cycle for a valid input data.
6) Turn_I_m: it is an m-bit input signal. Turn_I_m is only used if m>1 and n=1, or not used and connected to ground otherwise. Turn_I_m(j) is asserted if j-th piece of combinational logic has its turn to be latched onto the sole output register, or not otherwise.
7) SINI: it is connected to input signal SINI.

A BM has 6 output signals:
1) D_O: it drives data output bus for the circuit, and has output data's width.
2) Da_O: it drives assistant data output bus, and has assistant output data's width.
3) Valid_O: both data output D_O and assistant data output Da_O are valid if Valid_O is asserted, or not otherwise. Valid_O's assertion lasts one cycle for a valid output data.
4) E_O: it is asserted if the circuit is empty, or not otherwise.
5) Lock_O_m: it is an m-bit output signal. Lock_O_m(j) is asserted if j-th piece of combinational logic is in locked state and blocked from being latched onto its connected or shared output register, or not otherwise.
6) I_OK_O: it is asserted if the circuit can accept next input data or not otherwise. I_OK_O is used to guarantee that there is no data overflow for the circuit in any situation.

Figure 5A:
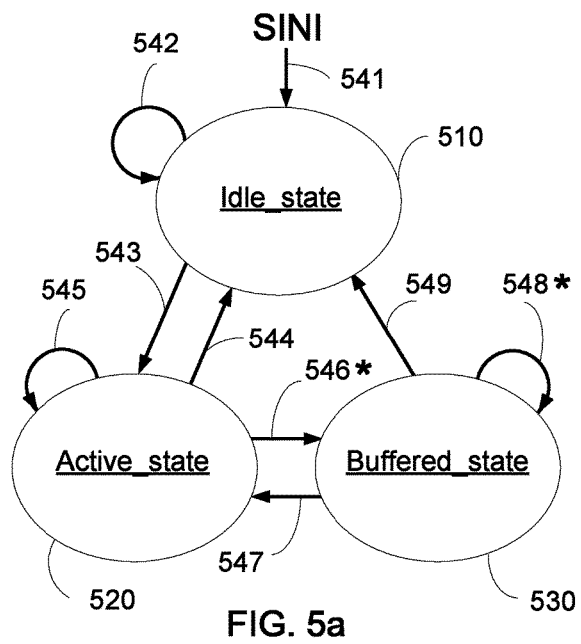
FIG. 5a is the state diagram of an output register state machine for each of the output registers in the circuit.

FIG. 5a is the state diagram of an output register state machine. Each of the output registers in the circuit owns an output register state machine. The output register state machine has 3 states:
1) Idle state 510: it is the initial state in which the owner output register is empty and has no valid data.
2) Active state 520: the owner output register has a valid data which is latched on the current cycle.
3) Buffered state 530: the owner output register has a valid data which was latched on a past cycle.

Here is how an output register state machine is transferring among the 3 states on the current cycle:
1) 541: the state machine is in the idle state one cycle after input signal SINI is asserted.
2) 542: the state machine is remaining in the idle state if the owner output register is not latching a valid data.
3) 543: the state machine is going from the idle state to the active state if the owner output register is latching a valid data.
4) 544: the state machine is going from the active state to the empty state if the owner output register is releasing its data, and the owner output register is not latching a valid data.
5) 545: the state machine is remaining in the active state if the owner output register is releasing its data, and the owner output register is also latching a new valid data.
6) 546: the state machine is going from the active state to the buffered state if the owner output register is not releasing its data.
7) 547: the state machine is going from the buffered state to the active state if the owner output register is releasing its data, and the owner output register is also latching a valid data.
8) 548: the state machine is remaining in the buffered state if the owner output register is not releasing its data.
9) 549: the state machine is going from the buffered state to the idle state if the owner output register is releasing its data, and the owner output register is not latching a valid data.

'*' on transfers 546 and 548 in FIG. 5a indicates a situation when the owner output register is blocked from latching a valid data from its currently connected piece of combinational logic on the current cycle.

Lifespan theorem The active state of an output register state machine has one cycle lifespan for a valid data latched by the owner output register on the current cycle.

Proof It is based on the definition of the active state of an output register state machine.

In the present invention, there are two bits to represent the 3 states: V-bit and B-bit based on following rules for V-B if m=n:
1) Idle state: V-B="00";
2) Active state: V-B="10";
3) Buffered state: V-B="01";

V-bit has one cycle lifespan for a valid data latched by its owner output register on the current cycle, and B-bit has no lifespan limit for a valid data in its owner output register. The output register state machine can be implemented in any other techniques, for example, another embodiment may use 3 bits and each bit represents one state.

General Set of Operation Rules on Buffering Function

The General set of operation rules applies to all 6 buffering configurations unless specified otherwise.
1) Latch an input data into an input register if write enable signal for the input register is asserted. The write enable signal is asserted if all following 4 conditions are satisfied:
   a) The input data is available.
   b) The circuit is allowed to output or the circuit holds the number of data less than the capacity of the circuit.
   c) The input register is eligible to receive next input data to meet the limit posed by Input_clock_number if Input_clock_number >1.
   d) The input register has its turn to receive an input data if Multiple_copy_number >1.
2) Output nothing if the circuit is not allowed to output, or all output registers are empty, and FIFO_1 is empty if the circuit comprises FIFO_1.
3) Push an assistant data into FIFO_3 if the circuit is receiving an input data.
4) Pop up and output the top assistant data from FIFO_3 if a data is being output.
5) Claim a piece of combinational logic being in locked state if at least one of following 2 conditions is true, or in unlocked state otherwise:
   a) The output register connected to or shared by the piece of combinational logic is not releasing its data; or
   b) The piece of combinational logic does not have its turn to be latched onto the shared sole output register if m>1 and n=1.

6) Shift the Data_position_shifter 1201 based on shifting rule 1 if the corresponding piece of combinational logic is in unlocked state, or based on shifting rule 2 if the corresponding piece of combinational logic is in locked state.
7) Block a locked piece of combinational logic from being latched onto its connected or shared output register.
8) Here is data output priority list based on data positions in the circuit from top to bottom:
    a) The top data in data FIFO_1 if the circuit comprises FIFO_1 and FIFO_1 is not empty.
    b) The top buffered output register if the circuit does not comprise FIFO_1 and at least one buffered output register exists.
    c) The active output register if the active output register exists.
9) An output register is not releasing its data on the current cycle if the output register is not empty and one of following 2 conditions is satisfied:
    a) the circuit is not allowed to output, and either the circuit does not comprise a working data FIFO, or the circuit comprises the working data FIFO and the working data FIFO is full; or
    b) The circuit is allowed to output, the circuit comprises FIFO_2, FIFO_2 is not empty, and the output register is not the top buffered output register.

Figure 6:
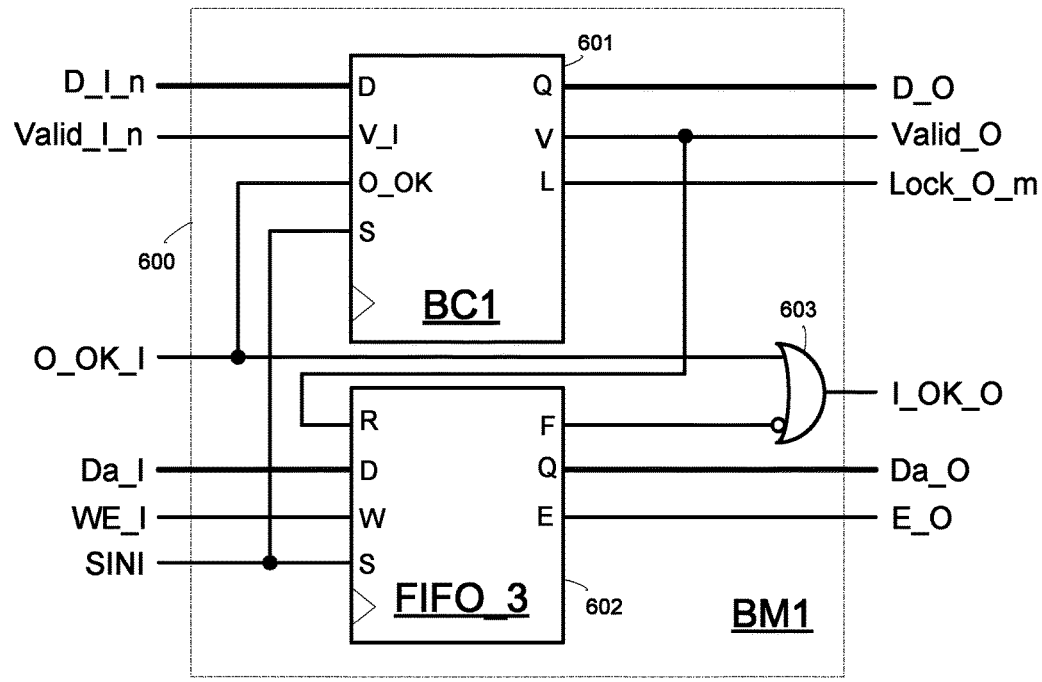
FIG. 6 is the block diagram of buffering master component BM1 600.

FIG. 6 is the block diagram of buffering master component BM1 600. BM1 applies to the buffering configuration 1), where m=n=1. BM1 comprises buffering controller BC1 601 and assistant data FIFO_3 602. Here are connections of BC1's 4 input signals:
1) D: it is connected to 1-set data bus input signal D_I_n and has output data's width.
2) VI: it is connected to 1-bit input signal Valid_I_n.
3) O_OK: it is connected to input signal O_OK_I.
4) S: it is connected to input signal SINI.

Here are connections of BC1's 3 output signals:
1) Q: it drives data output signal D_O and has output data's width.
2) V: it drives output signal Valid_O and FIFO_3's input R.
3) L: it drives 1-bit output signal Lock_O_m.

Here are connections of FIFO_3's 4 input signals:
1) D: it is connected to assistant data input signal Da_I and has assistant data's width.
2) W: it is connected to input signal WE_I.
3) R: it is connected to output V of BC1.
4) S: it is connected to input signal SINI.

Here are connections of FIFO_3's 3 output signals:
1) Q: it drives assistant data output signal Da_O and has assistant data's width.
2) F: it reversely drives one input of 2-input or-gate 603.
3) E: it drives output signal E_O.

2-input or-gate 603 has another input connected to input signal O_OK_I, and its output driving output signal I_OK_O. I_OK_O is asserted if the circuit can accept next input data or not otherwise. When FIFO 3 is not full, the circuit can receive a new data; when FIFO_3 is full, at least one data has reached an output register, and if O_OK_I is asserted a data is being output, so the circuit can accept next input data, and no data overflow would occur. When output signal Valid_O is asserted, a data and the top assistant data in FIFO_3 are being output from the BM through output signals D_O and Da_O, respectively.

The connections of FIFO_3 and the logic of 2-input or-gate 603 driving output signal I_OK_O are the same across 6 buffering configurations so that their descriptions for other buffering configurations will not be repeated again.

Figure 6A:
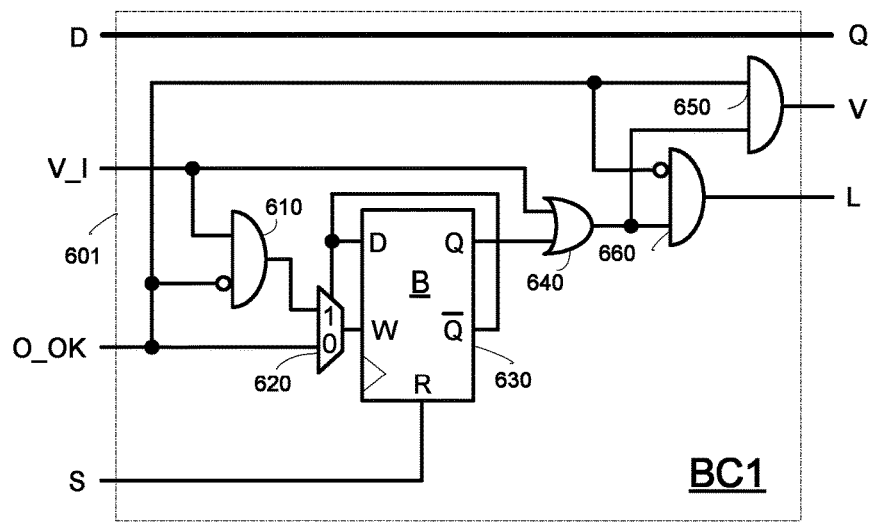
FIG. 6a is the schematic of buffering controller BC1 601.

FIG. 6a is the schematic of buffering controller BC1 601. Input signal D drives output signal Q. 2-input and-gate 610 has its one input connected to input signal VI, another to reverse input signal O_OK. 2-input multiplexor 620 has its '0' input connected to O_OK, its '1' input to and-gate 610's output, its control input to register 630's output $\overline{Q}$, and its output driving input W of register 630. 1-bit register B 630 has its input R connected to input signal S, its output $\overline{Q}$ also driving its input D and its output Q driving one input to 2-input or-gate 640. Register B 630 is B-bit of the output register state machine for the output register, is asserted if the output register is in the buffered state, or not otherwise. Register 630 is deasserted one cycle after input signal S is asserted, is being toggled to be asserted if the circuit is not allowed to output and the output register is in the active state, and is being toggled to be deasserted if the circuit is allowed to output and the output register is in the buffered state.

Or-gate 640 has another input connected to input signal V_I. 2-input and-gate 650 has its one input connected to or-gate 640's output, another to input signal O_OK and its output driving output signal V. Output signal V is asserted if the circuit is allowed to output and the output register is not empty, or not otherwise. 2-input and-gate 660 has its one input connected to or-gate 640's output, another to reverse input signal O_OK and its output driving output signal L. Output signal L is asserted if the circuit is not allowed to output and the output register is not empty, or not otherwise.

The First Set of Operation Rules

The first set of operation rules on the current cycle applies to the buffering configuration 1) with BM1 600. The rules are described in following points.
1) Output the output register if the circuit is allowed to output and the output register is not empty.
2) Assert register B if the circuit is not allowed to output and the output register is in the active state.
3) Deassert register B if the circuit is allowed to output and register B is asserted.
4) Claim the output register not releasing its data if the circuit is not allowed to output and the output register is not empty.
5) Claim the piece of combinational logic being in locked state if the output register is not releasing its data.
6) Rotate the Input_clock_rotator one bit per cycle continuously for Input_clock_number cycles, starting from the circuit receiving an input data, if Input_clock_number >1.

Figures 7, 7A:
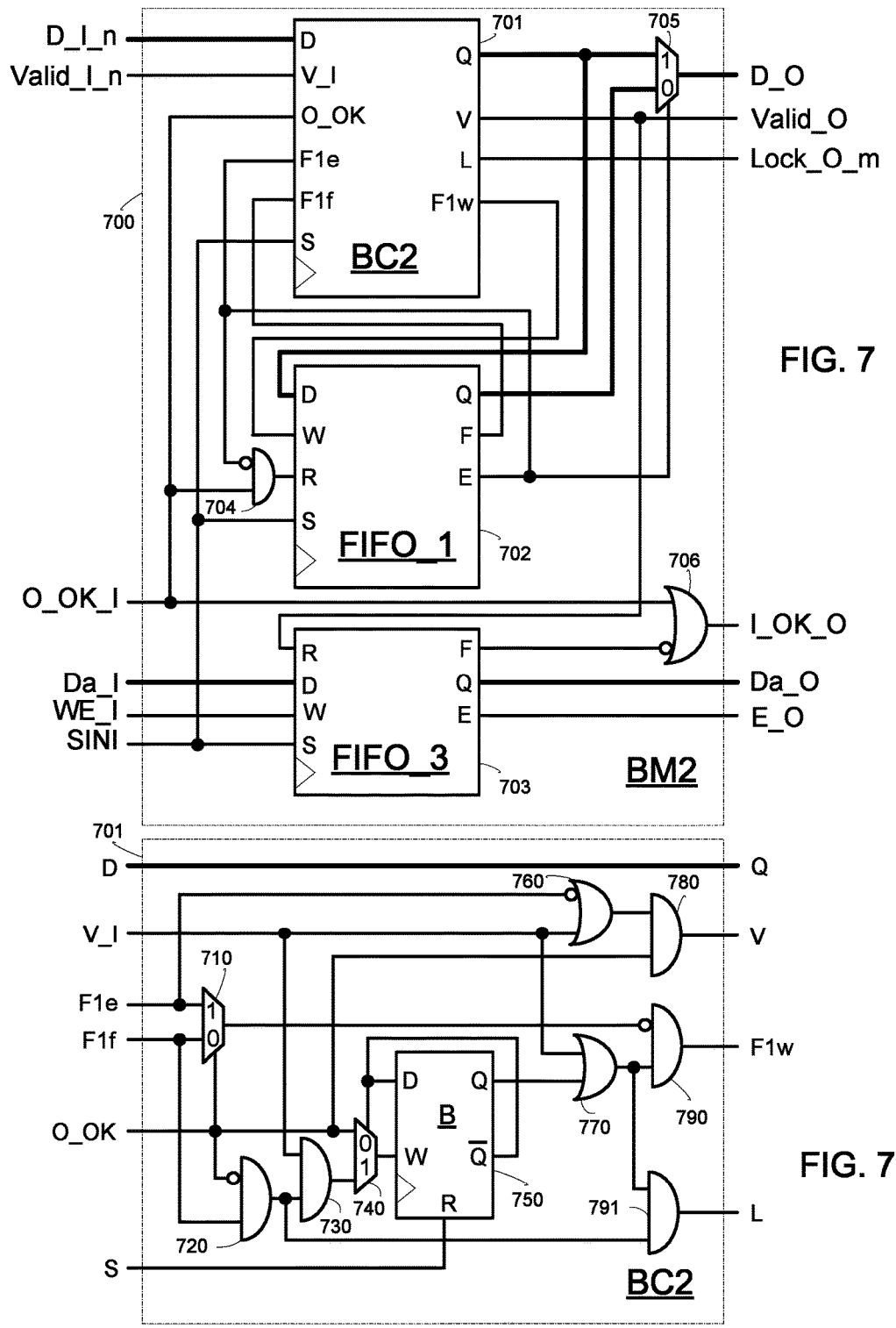
FIG. 7 is the block diagram of buffering master component BM2 700.
FIG. 7a is the schematic of buffering controller BC2 701.

FIG. 7 is the block diagram of buffering master component BM2 700. BM2 applies to the buffering configuration 2), where m=n=1. BM2 comprises buffering controller BC2 701, data FIFO_1 702 and assistant data FIFO_3 703. Here are connections of BC2's 6 input signals:
1) D: it is connected to 1-set data bus input signal D_I_n and has output data's width.
2) V_I: it is connected to 1-bit input signal Valid_I_n.
3) O_OK: it is connected to input signal O_OK_I.
4) F1e: it is connected to FIFO_1's output E.
5) F1f: it is connected to FIFO_1's output F.
6) S: it is connected to input signal SINI.

Here are connections BC2's 4 output signals:
1) Q: it drives '1' input of 2-input multiplexer 705 and FIFO_1's input D, and has output data's width.

2) V: it drives output signal Valid_O and FIFO_3's input R.
3) L: it drives 1-bit output signal Lock_O_m.
4) F1w: it drives FIFO_1's input W.

Here are connections of FIFO_1's 4 input signals:
1) D: it is connected to BC2's output Q and has output data's width.
2) W: it is connected to BC2's output F1w.
3) R: it is connected to 2-input and-gate 704's output.
4) S: it is connected to input signal SINI.

Here are connections of FIFO_1's 3 output signals:
1) Q: it drives '0' input of 2-input multiplexor 705 and has output data's width.
2) F: it drives BC2's input F1f.
3) E: it drives control input of 2-input multiplexor 705 and BC2's input F1e, and reversely drives one input of 2-input and-gate 704.

FIFO_3 703 and 2-input or-gate 706 have the same structures, connections and functions as described in FIG. 6, and their description is not repeated again.

2-input and-gate 704 has another input connected to input signal O_OK_I. FIFO_1 is being read if FIFO_1 is not empty and the circuit is allowed to output, or not otherwise. The output of 2-input multiplexor 705 of output data's width drives data output signal D_O. Output signal D_O is driven by the output register passing through BC2 if FIFO_1 is empty, or driven by the output of FIFO_1 otherwise.

FIG. 7a is the schematic of buffering controller BC2 701. Input signal D directly drives output signal Q. 2-input multiplexor 710 has its '1' input connected to input signal F1e, its '0' input to input signal F1f and its control input to input signal O_OK. 2-input and-gate 720 has its one input connected to input signal F1f, and another to reverse input signal O_OK. 2-input and-gate 730 has its one input connected to input signal V_I, and another to and-gate 720's output. 2-input multiplexor 740 has its '1' input connected to and-gate 730's output, its '0' input to input signal O_OK and its control input to output $\overline{Q}$ of 1-bit register 750. Register B 750 has its input W connected to multiplexor 740's output, its input R to input signal S, its output $\overline{Q}$ also driving its input D and its output Q driving one input to 2-input or-gate 770. 1-bit register B 750 is B-bit of the output register state machine for the output register, is asserted if the output register is in the buffered state, or not otherwise. Register 750 is deasserted one cycle after input signal S is asserted, is being toggled to be asserted if the circuit is not allowed to output, the output register is in the active state and FIFO_1 is full; register 750 is being toggled to be deasserted if the circuit is allowed to output and the output register is in the buffered state. 2-input or-gate 760 has its one input connected to input signal V_I, another to reverse input signal F1e. 2-input or-gate 770 has another input connected to input signal V_I. 2-input and-gate 780 has its one input connected to or-gate 760's output, another to input signal O_OK and its output driving output signal V. Output signal V is asserted if the circuit is allowed to output and either FIFO_1 is not empty or the output register is in the active state, or not otherwise. 2-input and-gate 790 has its one input connected to or-gate 770's output, another to multiplexor 710's reverse output and its output driving output signal F1w. 2-input and-gate 791 has its one input connected to or-gate 770's output, another to and-gate 720's output and its output driving output signal L. Output signal L is asserted if the circuit is not allowed to output, FIFO_1 is full and the output register is not empty, or not otherwise. Output signal F1w is asserted if the output register is not empty and one of following 2 conditions is true, or not otherwise:

1) The circuit is not allowed to output and FIFO_1 is not full; or
2) The circuit is allowed to output and FIFO_1 is not empty.

The Second Set of Operation Rules

The second set of operation rules on the current cycle applies to the buffering configuration 2) with BM2 700. The rules are described in following points.
1) Output the output register if the circuit is allowed to output, the output register is in the active state and FIFO_1 is empty.
2) Pop up and output top data in FIFO_1 if the circuit is allowed to output and FIFO_1 is not empty.
3) Push the output register into FIFO_1 if one of following 2 conditions is true:
    a) The circuit is not allowed to output, the output register is in the active state and FIFO_1 is not full; or
    b) The circuit is allowed to output, the output register is not empty and FIFO_1 is not empty.
4) Assert register B if the circuit is not allowed to output, the output register is in the active state and FIFO_1 is full.
5) Deassert register B if the circuit is allowed to output and register B is asserted.
6) Claim the output register not releasing its data if the circuit is not allowed to output, FIFO_1 is full and the output register is not empty.
7) Claim the piece of combinational logic being in locked state if the output register is not releasing its data.
8) Rotate the Input_clock_rotator one bit per cycle continuously for Input_clock_number cycles, starting from the circuit receiving an input data, if Input_clock_number >1.

Figure 8:
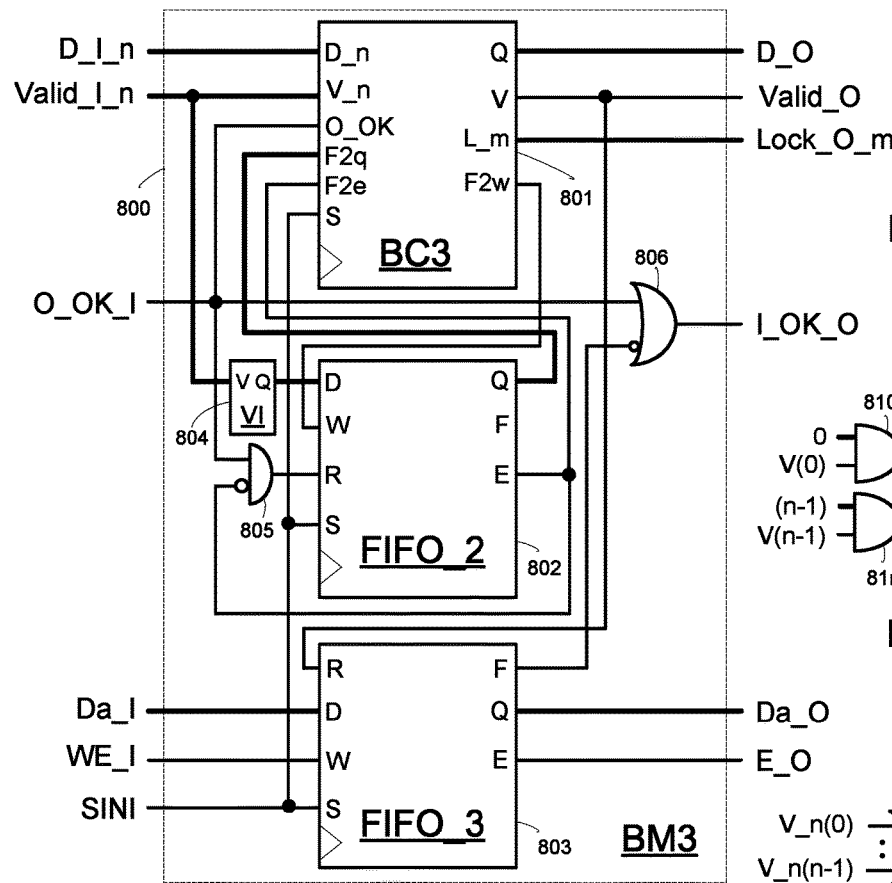
FIG. 8 is the block diagram of buffering master component BM3 800.

FIG. 8 is the block diagram of buffering master component BM3 800. BM3 applies to the buffering configuration 3), where m=n>1. BM3 comprises buffering controller BC3 801, output register index FIFO_2 802 and assistant data FIFO_3 803. Here are connections of BC3's 6 input signals:
1) D_n: it is connected to n-set data bus input signal D_I_n and each data bus has output data's width.
2) V_n: it is connected to n-bit input signal Valid_I_n.
3) O_OK: it is connected to input signal O_OK_I.
4) F2q: it is connected to FIFO_2's output Q and has the output register index's width.
5) F2e: it is connected to FIFO_2's output E.
6) S: it is connected to input signal SINI.

Here are connections of BC3's 4 output signals:
1) Q: it drives data output signal D_O and has output data's width.
2) V: it drives output signal Valid_O and FIFO_3's input R.
3) L_m: it drives m-bit output signal Lock_O_m.
4) F2w: it drives FIFO_2's input W.

Here are connections of FIFO_2's 4 input signals:
1) D: it is connected to component VI 804's output Q, and has output register index's width.
2) W: it is connected to BC3's output F2w.
3) R: it is connected to 2-input and-gate 805's output.
4) S: it is connected to input signal SINI.

Here are connections of FIFO_2's 3 output signals:
1) Q: it drives BC3's input F2q and has the output register index's width.
2) F: it is left open.

3) E: it drives BC3's input F2e, and it reversely drives one input of 2-input and-gate 805.

FIFO_3 803 and 2-input or-gate 806 have the same structures, connections and functions as described in FIG. 6, and their description is not repeated again.

Component VI 804 has its input V connected to n-bit input signal Valid I_n and its output Q of output register index's width drives FIFO_2's input D. VI 804 is designed to translate the sole asserted bit in n-bit input signal Valid In to the sole asserted bit's position ranging from 0 to n−1, and the position as the active output register's index is to be written into FIFO_2. 2-input and-gate 805 has another input connected to input signal O_OK_I.

Figure 8A:
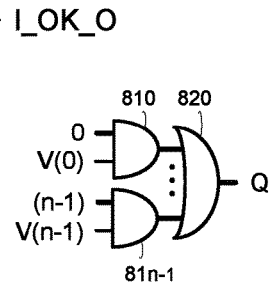
FIG. 8a is the schematic of component VI 804.

FIG. 8a is the schematic of component VI 804. Input signal V has n bits from V(0) to V(n−1) and at most one asserted bit among the n bits. 2-input and-gate 81j (0<=j<=n−1) has its one input connected to integer j ranging from 0 to n−1, another to bit V(j) and its output driving one input of n-set input or-gate 820. N-set input or-gate 820 has each input of an integer ranging from 0 to n−1, and its output driving output signal Q. When bit V(j) is asserted, VI's output Q outputs integer j. If input signal V has no asserted bit, the output Q is invalid and not used.

FIG. 8b to FIG. 8g are schematics of buffering controller BC3 801, each generating an output signal and/or an internal signal of BC3 based on its input signals and internal signals.

Figure 8B:
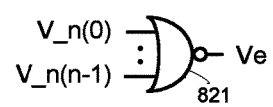
FIG. 8b is the schematic of the logic used to generate an internal signal Ve for BC3 801.

FIG. 8b is the schematic of the logic used to generate an internal signal Ve for BC3 801. N-bit input nor-gate 821 has its inputs connected to n-bit input signal V_n, and its output driving internal signal Ve. Ve is asserted if input signal V_n has no asserted bit, or not otherwise.

Figure 8C:
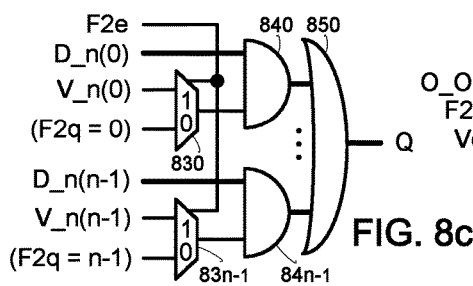
FIG. 8c is the schematic of the logic used to generate output signal Q for BC3 801.

FIG. 8c is the schematic of the logic used to generate data output signal Q for BC3 801. Input signal Dn(j) is output from j-th output register of output data's width. 2-input multiplexer 83j (0<=j<=n−1) has its '0' input connected to a bit which is asserted if F2q=j or not otherwise, its '1' input to input signal V_n(j), its control input to input signal F2e. F2q is the top index of FIFO_2. 2-input and-gate 84j of output data's width (0<=j<=n−1) has its one input connected to the output of multiplex 83j, another input to input signal D_n(j) and its output driving one input of n-set input or-gate 850. Or-gate 850 of output data's width has its output driving output signal Q. Input signal F2e is asserted if FIFO_2 is empty, or not otherwise. Output signal Q is driven by the top buffered output register if FIFO_2 is not empty or by the active output register if FIFO_2 is empty. When FIFO_2 is empty and the active output register does not exist, output signal Q is invalid and not used.

Figure 8D:
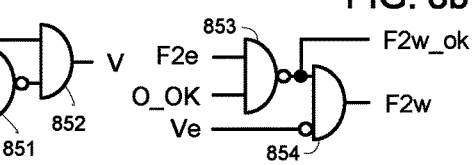
FIG. 8d is the schematic of the logic used to generate output signal V for BC3 801.

FIG. 8d is the schematic of the logic used to generate output signal V for BC3 801. V is asserted if the circuit's output data is valid, or not otherwise. 2-input nand-gate 851 has its one input connected to internal signal Ve, another to input signal F2e. And-gate 852 has its one input connected to nand-gate 851's output, another to input signal O_OK and its output driving output signal V. V is asserted if the circuit is allowed to output and at least one of the output registers is not empty, or not otherwise.

Figure 8E:
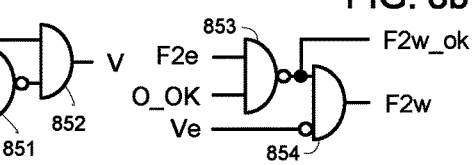
FIG. 8e is the schematic of the logic used to generate output signal F2w and internal signal F2w_ok for BC3 801.

FIG. 8e is the schematic of the logic used to generate output signal F2w and internal signal F2w_ok for BC3 801. F2w is asserted if the active output register's index is being written to FIFO_2 or not otherwise. 2-input nand-gate 853 has its one input connected to input signal F2e, another to input signal O_OK and its output driving internal signal F2w_ok. And-gate 854 has its one input connected to nand-gate 853's output, another to reverse internal signal Ve and its output driving output signal F2w. F2w_ok is asserted if either the circuit is not allowed to output or FIFO_2 is not empty. F2w is asserted if the active output register exists and its index is being written to FIFO_2, or not otherwise.

Figure 8F:
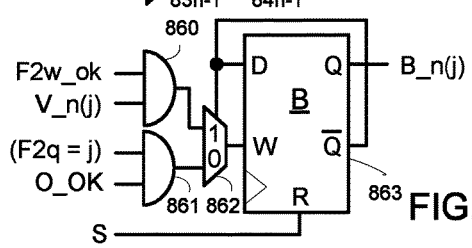
FIG. 8f is the schematic of the logic used to generate internal signal B_n(j) for BC3 801.

FIG. 8f is the schematic of the logic used to generate internal signal B_n(j) for BC3 801. 1-bit register B 863 has B_n(j) as its data output, is the B-bit of the output register state machine for j-th output register. B_n(j) is asserted if j-th output register is in the buffered state, or not otherwise. 2-input and-gate 860 has its one input connected to internal signal F2w_ok, another to input signal bit V_n(j). 2-input and-gate 861 has its one input connected to a bit which is asserted if F2q=j or not otherwise, another to input signal O_OK. 2-input multiplexer 862 has its '1' input connected to and-gate 860's output, its '0' input to and-gate 861's output, its control input to output $\overline{Q}$ of register B 863. 1-bit register B 863 has its R input connected to input signal S, its input W to multiplexer 862's output, its output $\overline{Q}$ also driving its input D and its output Q driving B-bit B_n(j). 1-bit register B 863 is deasserted one cycle after input signal S is asserted, is being toggled to be asserted if j-th output register is in the active state and its index is being written to FIFO_2, and is being toggled to be deasserted if the circuit is allowed to output, and j-th output register is the top buffered output register. Register B 863 is also called register B_n(j) to emphasize its j-th index.

Figure 8G:
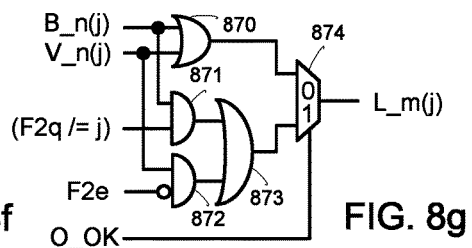
FIG. 8g is the schematic of the logic used to generate 1-bit output signal L_m(j) for BC3 801.

FIG. 8g is the schematic of the logic used to generate 1-bit output signal L_m(j) for BC3 801. L_m(j) is asserted if j-th piece of combinational logic is in locked state, or not otherwise. 2-input or-gate 870 has its one input connected to internal signal B_n(j) and another to input signal V_n(j). 2-input and-gate 871 has its one input connected to B_n(j) and another to a bit which is asserted if F2q/=j or not otherwise. 2-input and-gate 872 has its one input connected to V_n(j), another to the reverse input signal F2e. 2-input or-gate 873 has its one input connected to and-gate 871's output and another to and-gate 872's output. 2-input multiplexer 874 has its '0' input connected to or-gate 870's output, its '1' input to or-gate 873's output, its control input to input signal O_OK and its output driving output signal L_m(j). L_m(j) is asserted if one of following 2 conditions is true or not otherwise:
1) If the circuit is not allowed to output and j-th output register is not empty; or
2) If the circuit is allowed to output and one of following 2 conditions is true:
   a) If j-th output register is in the active state and FIFO_2 is not empty; or
   b) If j-th output register is a buffered output register, but is not the top buffered output register.

The Third Set of Operation Rules

The third set of operation rules on the current cycle applies to the buffering configuration 3) with BM3 800. The rules are described in following points (0<=j<=m−1).
1) Rotate the Input_register_rotator one bit if the circuit is receiving an input data.
2) Output the active output register if the circuit is allowed to output, the active output register exists and FIFO_2 is empty.
3) Output the top buffered output register if the circuit is allowed to output and FIFO_2 is not empty.
4) Push the active output register's index into FIFO_2 if the active output register exists and one of following 2 conditions is true:
   a) The circuit is not allowed to output; or
   b) The circuit is allowed to output and FIFO_2 is not empty.

5) Pop up FIFO_2 if the circuit is allowed to output and FIFO_2 is not empty.
6) Assert register B_n(j) if j-th output register is in the active state and being pushed into FIFO_2.
7) Deassert register B_n(j) if the circuit is allowed to output, and j-th output register is the top buffered output register.
8) Claim j-th output register not releasing its data if one of following 2 conditions is true:
   a) If the circuit is not allowed to output and j-th output register is not empty; or
   b) If the circuit is allowed to output and one of following 2 conditions is true:
      J-th output register is in the active state and FIFO_2 is not empty; or
      J-th output register is a buffered output register, but is not the top buffered output register.
9) Claim j-th piece of combinational logic being in locked state if j-th output register is not releasing its data.

Figures 9, 9A:
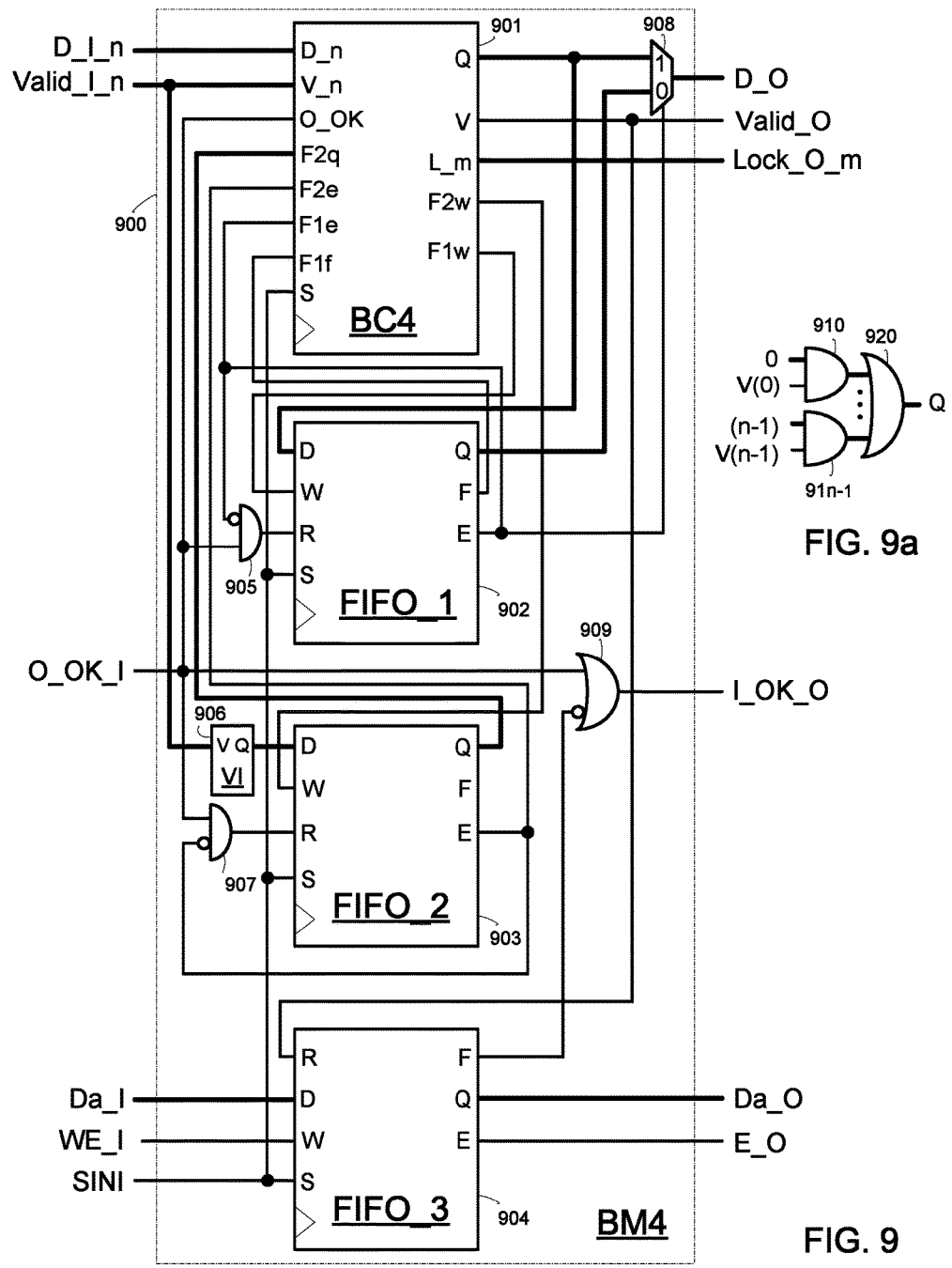
FIG. 9 is the block diagram of buffering master component BM4 900.
FIG. 9a, FIG. 9b and FIG. 9c have the same schematics and functions as FIG. 8a, FIG. 8b and FIG. 8c do.

FIG. 9 is the block diagram of buffering master component BM4 900. BM4 applies to the buffering configuration 4), where m=n>1. BM4 comprises buffering controller BC4 901, data FIFO_1 902, output register index FIFO_2 903 and assistant data FIFO_3 904. Here are connections of BC4's 8 input signals:
1) D_n: it is connected to n-set data bus input signal D_I_n and each data bus has output data's width.
2) V_n: it is connected to n-bit input signal Valid_I_n.
3) O_OK: it is connected to input signal O_OK_I.
4) F2q: it is connected to FIFO_2's output Q and has the output register index's width.
5) F2e: it is connected to FIFO_2's output E.
6) F1e: it is connected to FIFO_1's output E.
7) F1f: it is connected to FIFO_1's output F.
8) S: it is connected to input signal SINI.

Here are connections of BC4's 5 output signals:
1) Q: it drives '1' input of 2-input multiplexor 908 and FIFO_1's input D. Output Q has output data's width.
2) V: it drives output signal Valid_O and FIFO_3's input R.
3) L_m: it drives m-bit output signal Lock_O_m.
4) F2w: it drives FIFO_2's input W.
5) F1w: it drives FIFO_1's input W.

Here are connections of FIFO_1's 4 input signals:
1) D: it is connected to BC4's output Q and has output data's width.
2) W: it is connected to BC4's output F1w.
3) R: it is connected to 2-input and-gate 905's output.
4) S: it is connected to input signal SINI.

Here are connections of FIFO_1's 3 output signals:
1) Q: it drives '0' input of 2-input multiplexor 908 and has output data's width.
2) F: it drives BC4's input F1f.
3) E: it drives control input of 2-input multiplexor 908, BC4's input F1e, and reversely drives one input of 2-input and-gate 905.

Here are connections of FIFO_2's 4 input signals:
1) D: it is connected to component VI 906's output Q, and has output register index's width.
2) W: it is connected to BC4's output F2w.
3) R: it is connected to 2-input and-gate 907's output.
4) S: it is connected to input signal SINI.

Here are connections of FIFO_2's 3 output signals:
1) Q: it drives input F2q of BC4 and has the output register index's width.
2) F: it is left open.
3) E: it drives BC4's input F2e, and reversely drives one input of 2-input and-gate 907.

FIFO_3 904 and 2-input or-gate 909 have the same structures, connections and functions as described in FIG. 6, and their description is not repeated again.

2-input and-gate 905 has another input connected to input signal O_OK_I, and its output driving FIFO_2's input R. Component VI 906 has its n-bit input V connected to input signal Valid_In and its output Q of output register index's width drives FIFO_2's input D. VI 906 has the same function, connection and structure as the VI 804 in FIG. 8. 2-input and-gate 907 has another input connected to input signal O_OK_I and its output driving FIFO_2's input R. 2-input multiplexor 908 has its output driving output signal D_O.

FIG. 9b to FIG. 9i are schematics of BC4, each generating an output signal and/or an internal signal of BC4 based on its input signals and/or internal signals.

Figure 9B:
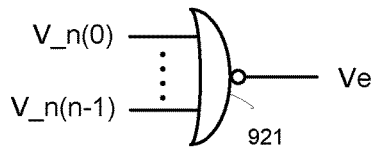
Figure 9C:
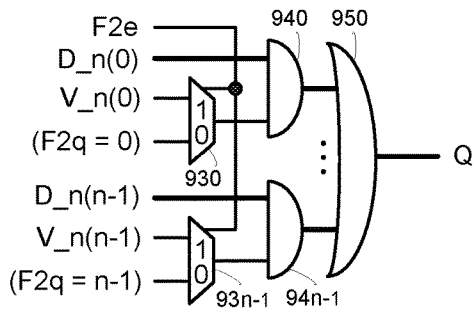

FIG. 9a, FIG. 9b and FIG. 9c have the same schematics, connections and functions as FIG. 8a, FIG. 8b and FIG. 8c do, respectively, so their connections and descriptions are not repeated again.

Figure 9D:
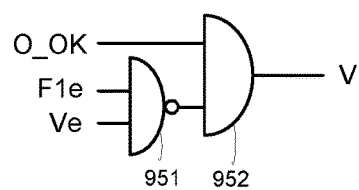
FIG. 9d is the schematic of the logic used to generate output signal V for BC4 901.

FIG. 9d is the schematic of the logic used to generate output signal V for BC4 901. V is asserted if output data from the circuit is valid or not otherwise. 2-input nand-gate 951 has its one input connected to internal signal Ve, another to input signal F1e. 2-input and-gate 952 has its one input connected to nand-gate 951's output, another to input signal O_OK and its output driving output signal V. V is asserted if the circuit is allowed to output, and either FIFO_1 is not empty or the active output register exists, or not otherwise.

Figure 9F:
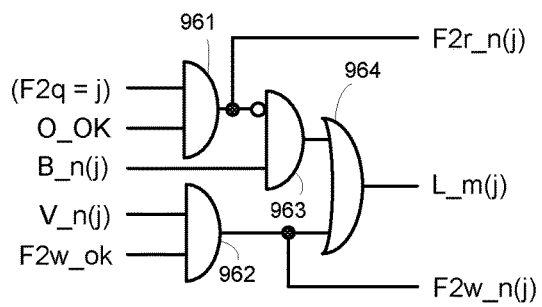
FIG. 9f is the schematic of the logic used to generate bit output signal L_m(j), internal signals F2w_n(j) and F2r_n(j) for BC4 901.
Figure 9E:
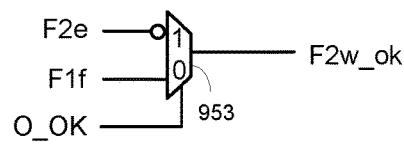
FIG. 9e is the schematic of the logic used to generate internal signal F2w_ok for BC4 901.

FIG. 9e is the schematic of the logic used to generate internal signal F2w_ok for BC4 901. 2-input multiplexor 953 has its '1' input connected to reverse input signal F2e, its '0' input to input signal F1f, its control input to input signal O_OK and its output driving internal signal F2w_ok. F2w_ok is asserted if one of following 2 conditions is true, or not otherwise:
1) The circuit is not allowed to output and FIFO_1 is full; or
2) The circuit is allowed to output and FIFO_2 is not empty.

FIG. 9f is the schematic of the logic used to generate bit output signal L_m(j), internal signals F2w_n(j) and F2r_n(j) for BC4 901. L_m(j) is asserted if j-th combinational logic is in locked state or not otherwise; F2w_n(j) is asserted if j-th output register's index is being written to FIFO_2 or not otherwise; F2r_n(j) is asserted if j-th output register's index is being read from FIFO_2 or not otherwise. 2-input and-gate 961 has its one input connected to a bit which is asserted if FIFO_2 top data is j or not otherwise, and another to input signal O_OK and its output driving internal signal F2r_n(j). F2r_n(j) is asserted if the circuit is allowed to output and j-th output register is the top buffered output register, or not otherwise. 2-input and-gate 962 has its one input connected to bit input signal V_n(j), another to internal signal F2w_ok, and its output driving internal signal F2w_n(j). F2w_n(j) is asserted if j-th output register is the active output register and its index is being written to FIFO_2, or not otherwise. 2-input and-gate 963 has its one input connected to and-gate 961's reverse output, another to input signal B_n(j). 2-input or-gate 964 has its one input connected to and-gate 963's output, another to and-gate 962's output and its output driving output signal L_m(j). L_m(j) is asserted if one of following 2 conditions is true, or not otherwise:
1) J-th output register is in the active state and its index is being written to FIFO_2; or 2) J-th output register is in the buffered state, and at least one of following 2 conditions is true:
   a) the circuit is not allowed to output; or
   b) j-th output register is not the top buffered output register.

Figure 9G:
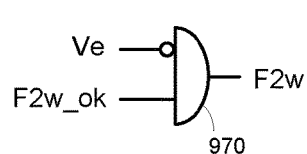
FIG. 9g is the schematic of the logic used to generate output signal F2w for BC4 901.

FIG. 9g is the schematic of the logic used to generate output signal F2w for BC4 901. F2w is asserted if an output register's index is being written to FIFO_2, or not otherwise. 2-input and-gate 970 has its one input connected to reverse internal signal Ve, another to internal signal F2w_ok and its output driving output signal F2w. F2w is asserted if the active output register exists and its index is being written to FIFO_2, or not otherwise.

Figure 9H:
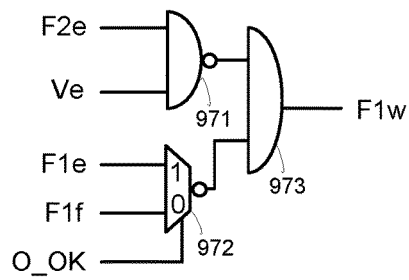
FIG. 9h is the schematic of the logic used to generate output signal F1w for BC4 901.

FIG. 9h is the schematic of the logic used to generate output signal F1w for BC4 901. F1w is asserted if one output register is being written to FIFO_1, or not otherwise. 2-input nand-gate 971 has its one input connected to input signal F2e, another to internal signal Ve. 2-input multiplexor 972 has its '1' input connected to input signal F1e, its '0' input to input signal F1f, its control input to input signal O_OK. 2-input and-gate 973 has its one input connected to nand-gate 971's output, another to multiplexor 972's reverse output and its output driving output signal F1w. F1w is asserted if both of following 2 conditions are true, or not otherwise:
   1) At least one of the output registers is not empty; and
   2) Either the circuit is not allowed to output and FIFO_1 is not full, or the circuit is allowed to output and FIFO_1 is not empty.

Figure 9I:
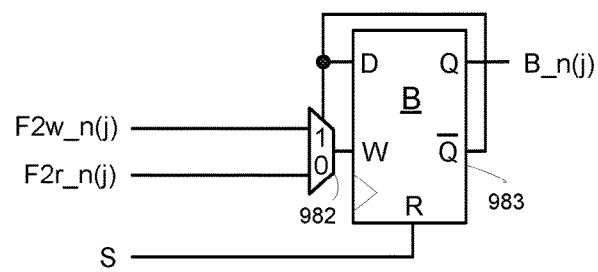
FIG. 9i is the schematic of the logic used to generate internal signal B_n(j) for BC4 901.

FIG. 9i is the schematic of the logic used to generate internal signal B_n(j) for BC4 901. 1-bit register B 983 has B_n(j) as its data output, is the B-bit of the output register state machine for j-th output register. B_n(j) is asserted if j-th output register is in the buffered state, or not otherwise. 2-input multiplexor 982 has its '1' input connected to internal signal F2w_n(j), its '0' input to internal signal F2r_n(j), its control input to its output $\overline{Q}$. 1-bit register B 983 has its input R connected to input signal S, its input W to multiplexor 982's output, its output $\overline{Q}$ also driving its data input D and its output Q driving internal 1-bit signal B_n(j). 1-bit register B 983 is deasserted one cycle after input signal S is asserted, is being toggled to be asserted if j-th output register is in the active state and its index is being written to FIFO_2, and is being toggled to be deasserted if the circuit is allowed to output, and j-th output register is the top buffered output register. Register B 983 is also called register B_n(j) to emphasize its j-th index.

The Fourth Set of Operation Rules

The fourth set of operation rules on the current cycle applies to the buffering configuration 4) with BM4 900. The rules are described in following points (0<=j<=m−1).
1) Rotate the Input_register_rotator one bit if the circuit is receiving an input data.
2) Output the active output register if the circuit is allowed to output, the active output register exists and FIFO_1 is empty.
3) Pop up and output top data in FIFO_1 if the circuit is allowed to output and FIFO_1 is not empty.
4) Push the active output register into FIFO_1 if the active output register exists and one of following 2 conditions is true:
   a) The circuit is not allowed to output and FIFO_1 is not full; or
   b) The circuit is allowed to output, FIFO_1 is not empty and FIFO_2 is empty.
5) Push the active output register's index into FIFO_2 if the active output register exists and one of following 2 conditions is true:
   a) The circuit is not allowed to output and FIFO_1 is full; or
   b) The circuit is allowed to output and FIFO_2 is not empty.
6) Push the top buffered output register into FIFO_1 if the circuit is allowed to output and FIFO_2 is not empty.
7) Pop up FIFO_2 if the circuit is allowed to output and FIFO_2 is not empty.
8) Assert register B_n(j) if j-th output register is in the active state and being pushed into FIFO_2.
9) Deassert register B_n(j) if the circuit is allowed to output, and j-th output register is the top buffered output register.
10) Claim j-th output register not releasing its data if one of following 2 conditions is true:
    a) The circuit is not allowed to output, and one of following 2 conditions is satisfied:
       The output register is in the active state and FIFO_1 is full.
       The output register is in the buffered state.
    b) The circuit is allowed to output, the circuit comprises FIFO_2, FIFO_2 is not empty and one of following 2 conditions is satisfied:
       The output register is in the active state.
       The output register is in the buffered state, but is not the top buffered output register.
11) Claim j-th piece of combinational logic being in locked state if j-th output register is not releasing its data.

Figure 10:
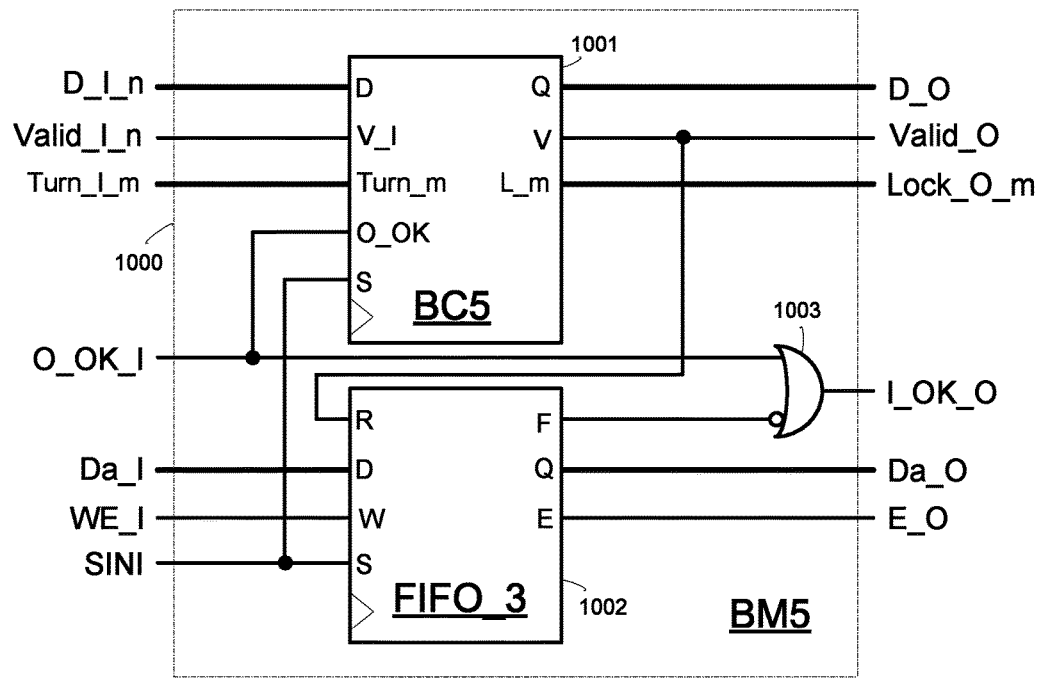
FIG. 10 is the block diagram of buffering master component BM5 1000.

FIG. 10 is the block diagram of buffering master component BM5 1000. BM5 applies to the buffering configuration 5), where m>1 and n=1. BM5 has the same structure and interface as BM1 600 except that BM5 has one m-bit input signal Turn_I_m more than BM1 does, and an m-bit output signal Lock_O_m instead of a 1-bit output signal Lock_O_m in BM1. BC5 1001 has input Turn_m connected to BM5's input signal Turn_I_m and its m-bit output L_m driving BM5's output signal Lock_O_m. Other input signals, output signals and their connections of BC5 in BM5 1000 are the same as ones of BC1 in BM1 600.

Figure 10A:
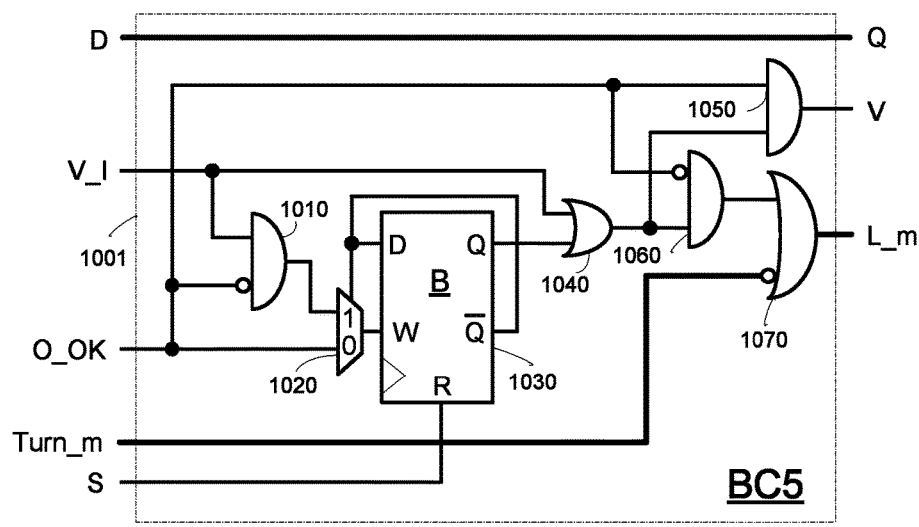
FIG. 10a is the schematic of buffering controller BC5 1001.

FIG. 10a is the schematic of buffering controller BC5 1001. BC5 has the same function and structure as BC1 601 except that BC5 has a 2-input or-gate 1070 more than BC1, and m-bit output signal L_m instead of 1-bit output signal L_m. Or-gate 1070 has its one input connected to and-gate 1060's output, another to reverse m-bit input signal Turn_m and its output driving m-bit output signal L_m. L_m(j) is asserted if j-th combinational logic is in locked state or not otherwise; L_m(j) is asserted if at least one of following 2 conditions is true, or not otherwise:
   1) The circuit is not allowed to output and the sole output register is not empty; or
   2) Input signal Turn_m(j) is deasserted, indicating that j-th piece of combinational logic does not have its turn to be latched onto the sole output register.

The Fifth Set of Operation Rules

The fifth set of operation rules on the current cycle applies to the buffering configuration 5) with BM5 1000. The rules are described in following points (0<=j<=m−1).
1) Rotate the Input_register_rotator one bit if the circuit is receiving an input data.

2) Output the sole output register if the circuit is allowed to output and the sole output register is not empty.
3) Assert register B if the circuit is not allowed to output and the sole output register is in the active state.
4) Deassert register B if the circuit is allowed to output and register B is asserted.
5) Claim the sole output register not releasing its data if the circuit is not allowed to output and the sole output register is not empty.
6) Claim j-th piece of combinational logic being in locked state if at least one of following 2 conditions is true:
   a) The sole output register is not releasing its data.
   b) J-th piece of combinational logic does not have its turn to be latched onto the sole output register.
7) Rotate the Combinational_logic_rotator a bit if the sole output register is latching a data.

Figures 11, 11A:
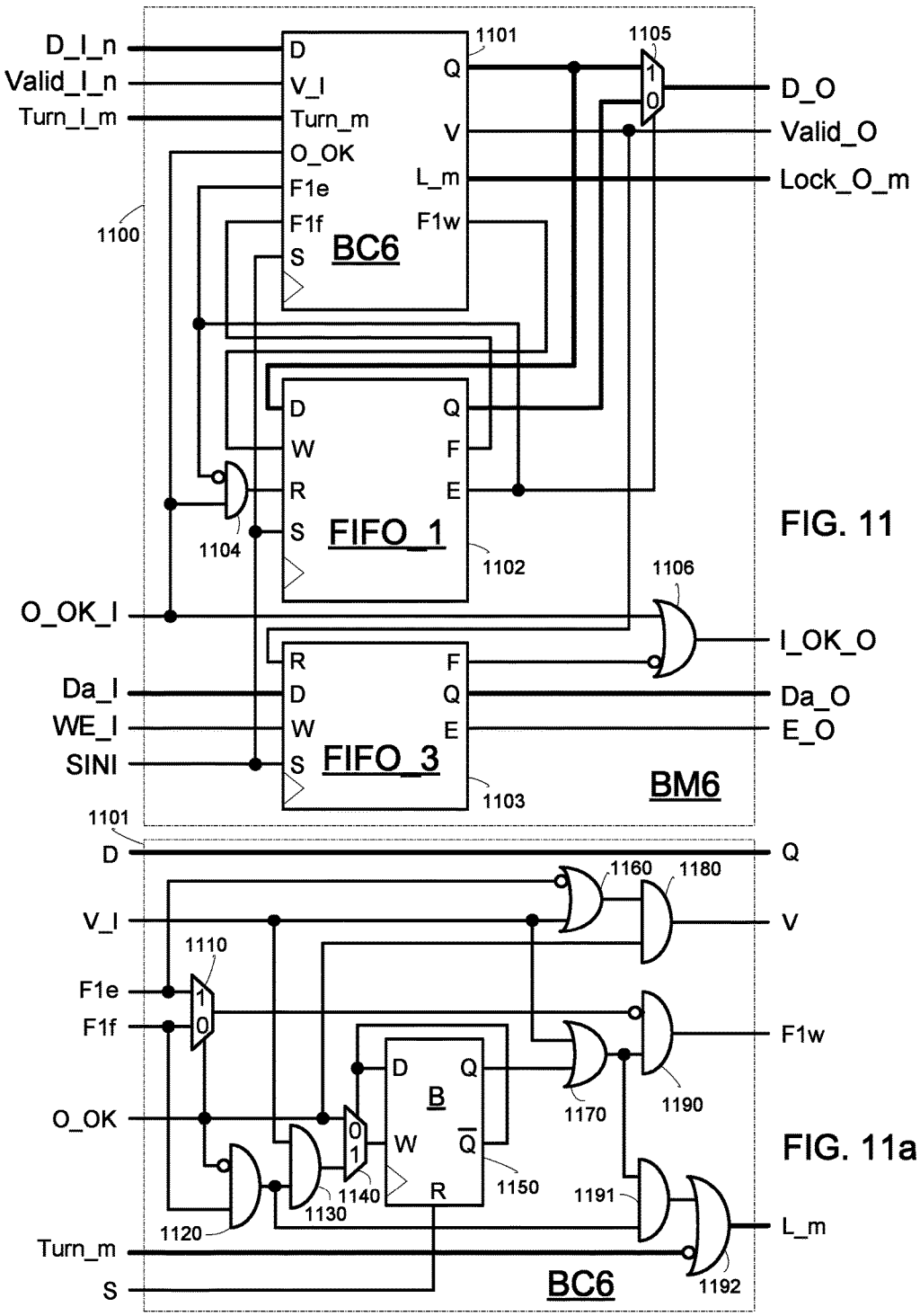
FIG. 11 is the block diagram of buffering master component BM6 1100.
FIG. 11a is the schematic of buffering controller BC6 1101.

FIG. 11 is the block diagram of buffering master component BM6 1100. BM6 applies to the buffering configuration 6), where m>1 an n=1. BM6 comprises buffering controller BC6 1101, data FIFO_1 1102 and assistant FIFO_3 1103, has the same interface and structure as BM2 700 except that BM6 1100 has one m-bit input signal Turn_I_m more than BM2 does, and an m-bit output signal Lock_O_m instead of a 1-bit output signal Lock_O_m in BM2. BC6 1101 has input Turn_m connected to BM6's input signal Turn_I_m and its m-bit output L_m driving BM6's output signal Lock_O_m. Other input signals, output signals and their connections of BC6 are the same as ones of BC2.

FIG. 11a is the schematic of buffering controller BC6 1101. BC6 has the same function and structure as BC2 701 except that BC6 has a 2-input or-gate 1192 more than BC2 does, and m-bit output signal L_m instead of 1-bit output signal L_m. Or-gate 1192 has one input connected to and-gate 1191's output, another to reverse m-bit input signal Turn_m and its output driving m-bit output signal L_m. L_m(j) is asserted if j-th combinational logic is in locked state or not otherwise; L_m(j) is asserted if at least one of following 2 conditions is true, or not otherwise:
   1) The circuit is not allowed to output, FIFO_1 is full, and the sole output register is not empty; or
   2) Input signal Turn_m(j) is deasserted, indicating that j-th piece of combinational logic does not have its turn to be latched onto the sole output register.

The Sixth Set of Operation Rules

The sixth set of operation rules on the current cycle applies to the buffering configuration 6) with BM6 1100. The rules are described in following points (0<=j<=m−1).
1) Rotate the Input_register_rotator one bit if the circuit is receiving an input data.
2) Output the sole output register if the circuit is allowed to output, the sole output register is in the active state and FIFO_1 is empty.
3) Pop up and output top data in FIFO_1 if the circuit is allowed to output and FIFO_1 is not empty.
4) Push the sole output register into FIFO_1 if one of following 2 conditions is true:
   a) The circuit is not allowed to output, the sole output register is in the active state and FIFO_1 is not full; or
   b) The circuit is allowed to output, the sole output register is not empty and FIFO_1 is not empty.
5) Assert register B if the circuit is not allowed to output, the sole output register is in the active state and FIFO_1 is full.
6) Deassert register B if the circuit is allowed to output and register B is asserted.
7) Claim the sole output register not releasing its data if the circuit is not allowed to output, FIFO_1 is full, and the sole output register is not empty.
8) Claim j-th piece of combinational logic being in locked state if at least one of following 2 conditions is true:
   a) The sole output register is not releasing its data.
   b) J-th piece of combinational logic does not have its turn to be latched onto the sole output register.
9) Rotate the Combinational_logic_rotator a bit if the sole output register is latching a data.

FIFO_1 full theorem: A FIFO_1 is full if the circuit comprises the FIFO_1 and at least one buffered output register exists.

Proof: To make the circuit to have a buffered output register the active output register must exist based on transfer condition 546 of output register state machine in FIG. 5a. There are 3 situations:
   1) No buffered output register exists, the active output register exists and it is becoming an buffered output register: The transfer condition 546 is true if the circuit is not allowed to output, the FIFO is full and the active output register exists, so on next cycle FIFO_1 is full and there is one buffered output register;
   2) One buffered output register exists and FIFO_1 is full:
      a) The active output register does not exist:
         The circuit is not allowed to output: the circuit still has one buffered output registers and FIFO_1 is full.
         The circuit is allowed to output: top data at FIFO_1 is being output, the buffered output register is being pushed into FIFO_1, its buffered state is going to either the idle state or the active state, and the circuit has no buffered output register that is not the situation described for theorem.
      b) The active output register exists:
         The circuit is not allowed to output: the circuit is going to have 2 buffered output registers and FIFO_1 is full.
         The circuit is allowed to output: top data at FIFO_1 is being output, the buffered output register is being pushed into FIFO_1, and the active output register is becoming a buffered output register, leading to the scenario: the circuit has one buffered output register and FIFO_1 is full.
   3) There are two or more buffered output registers and FIFO_1 is full: Whether the circuit is allowed to output or not, there is at least one buffered output register and FIFO_1 is full.

Figure 12:
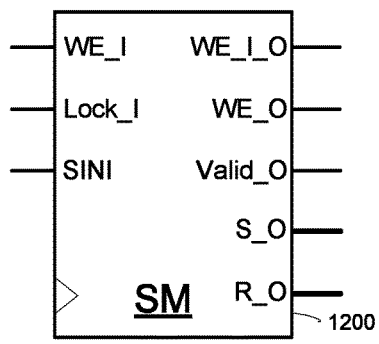
FIG. 12 is the interface of series master sub-component (SM) 1200.

FIG. 12 is the interface of series master sub-component (SM) 1200. SM 1200 is a sub-WPC and located within its parent WPC (either a SMB or a MCMB). Each SM 1200 represents its mapped critical path in the circuit, and is used to remember information of where all valid data are distributed on the mapped critical path, and generates a set of output signals some of which connect the parent WPC to the CPC that contains the mapped critical path.

SM 1200 has 3 wave generic constants.
   1) Series_clock_number1: it will be assigned with Series_clock_number of the parent WPC (a SMB or a MCMB).
   2) Input_clock_number1: it will be assigned with a SMB's Input_clock_number if the SM is located within the SMB or with default value 1 if the SM is located within a MCMB.

3) Multiple_copy_number1: it will be assigned with default value 1 if the SM is located within a SMB or with a MCMB's Multiple_copy_number if the SM is located within the MCMB.

SM 1200 has 3 input signals:
1) WE_I: it is asserted if an input data is available and the circuit can accept next input data, or not otherwise.
2) Lock_I: there are 2 situations:
   a) Lock_I is deasserted: the piece of combinational logic on the mapped critical path is in unlocked state, can be latched onto its connected or shared output register and shifting rule 1 for Data_position_shifter 1201 is being implemented on the current cycle.
   b) Lock_I is asserted: the piece of combinational logic on the mapped critical path is in locked state, cannot be latched onto its connected or shared output register and shifting rule 2 for Data_position_shifter 1201 is being implemented on the current cycle.
3) SINI: it is connected to input signal SINI.

SM 1200 has 5 output signals:
1) WE_I_O: it drives the write enable input W of the input register on the mapped critical path and it is used only when SM 1200 is located within a SMB and left open within a MCMB.
2) WE_O: it drives the write enable input W of the output register on the mapped critical path.
3) Valid_O: it is asserted if data latched onto the output register on the mapped critical path is valid, or not otherwise. It is used only when SM 1200 is located within a SMB or a MCMB_1, and it is left open within a MCMB_2. Valid_O has one cycle lifespan for a valid data latched by the output register on the current cycle.
4) S_O: it is a (x+1)-bit output signal and the direct output from the Data_position_shifter 1201, where x=Series_clock_number, providing information of where valid data are distributed on the mapped critical path with bit '1' being a valid data and bit '0' an invalid data.
5) R_O: it is a y-bit output signal and the direct output from the Input_clock_rotator 1211, where y=Input_clock_number, providing information of when the input register on the mapped critical path satisfies the limit posed by Input_clock_number. R_O (0) is asserted if the input register satisfies the limit posed by Input_clock_number or not otherwise.

The output signals S_O and R_O are provided to designers or synthesizers in case they are needed, and not used for the circuit itself.

Figure 12A:
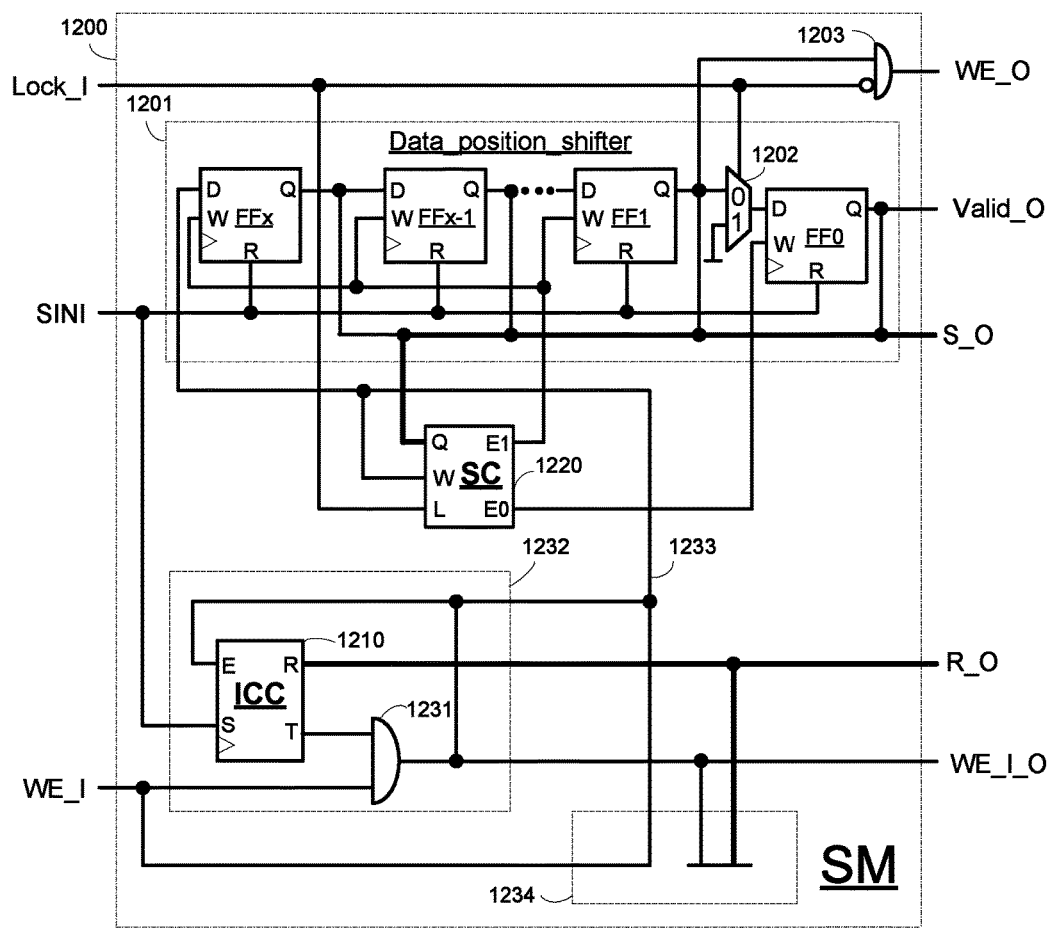
FIG. 12a is the schematic of SM 1200.

FIG. 12*a* is the schematic of SM 1200. SM 1200 has a Data_position_shifter 1201 which is a (x+1)-bit right shifter from register FFx to register FF0, where x=Series_clock_number. The Data_position_shifter 1201 is used to remember receiving sequence and positions for all data distributed on the mapped critical path. Every cycle for data to take to travel the mapped critical path has one corresponding position bit, and all bits are arranged in data travelling direction in Data_position_shifter 1201. Wire 1233 is data entry bit, connected to input D of register FFx and participates in right shift operations of Data_position_shifter 1201. Data entry bit 1233 is asserted if an input data is being latched by the input register on the mapped critical path, or not otherwise. Bit Qj (0<=j<=x) is output Q of register FFj. Bit Qx represents status of the input register on the mapped critical path, each of bits Qx-1-Q1 represents status of one position on piece of combination logic on the mapped critical path, and bit Q0 represents status of the output register on the mapped critical path; they are called input register bit, combinational logic bits and output register bit, respectively. If Series_clock_number=1, the circuit is a non-critical normal circuit and Data_position_shifter 1201 has no combinational logic bit. A bit in Data_position_shifter 1201 is asserted if data in the position on the mapped critical path is valid, or not otherwise. Another embodiment of the Data_position_shifter 1201 can also be implemented as a left shifter with same rules.

Data_position_shifter 1201 has two shifting rules based on input signal Lock_I. With Lock_I='0' shifting rule 1 is implemented to follow freely running data pattern through the mapped critical path when the piece of combinational logic is in unlocked state; with Lock_I='1' shifting rule 2 is implemented to follow freely running data pattern through the mapped critical path when the piece of combinational logic is in locked state.

1) Shifting rule 1: Right shift a combination of data entry bit 1233 plus bits Qx-Q0 of Data_position_shifter 1201 a bit if at least one bit of the combination has logic '1' on the current cycle, or do not otherwise.
2) Shifting rule 2: Divide the combination into two parts, bit Q0 and remaining bits (data entry bit 1233 plus bits Qx-Q1), and the shifting rule 2 comprises following steps:
   a) Deassert bit Q0.
   b) there are 2 situations:
      At least one combinational logic bit exists: right shift the remaining bits a bit on every cycle if bit Q1 has logic '0' and any bit among data entry bit 1233 and bits Qx-Q2 has logic '1', or do not otherwise.
      The combinational logic bit is absent: assert bit Q1 if data entry bit 1233 is asserted and bit Q1 is deasserted, or do not otherwise. In the case bit Q1 represents status of the input register.

Here are the explanations on how the 2 shifting rules are made:
1) When Lock_I='0', the piece of combinational logic on the mapped critical path is in unlocked state, the connected or shared output register can latch new data from the unlocked piece of combinational logic, and all data on the mapped critical path are running freely from the input data through the input register to the output register. This is the shifting rule 1.
2) When Lock_I='1', the piece of combinational logic on the mapped critical path is in locked state, the connected or shared output register cannot latch new data from the locked piece of combinational logic, otherwise data contamination at the output register would occur. With Lock_I='1', there is at most one valid data among data entry bit 1233, the input register and its connected piece of combinational logic based on Critical path storage theorem 1, and the sole valid data may come from the latest valid input data or remaining in the piece of combinational logic and run freely until it reaches at position FF1, one position before the output register. The position Q1 is the last position in the piece of combinational logic if the at least one combinational logic bit exists, or is the input register if the Data_position_shifter 1201 has no combinational logic bit and the circuit is a non-critical normal circuit. By the shifting rule 2 any number of cycles can continue on Lock_I='1' without data contamination and with the possible sole valid data waiting in the Q1 position. Bit Q0 is V-bit for the output register state machine of the output register on the mapped critical path if m=n>=1 and it is being deasserted because lifespan for an asserted V-bit is one cycle on any situation. When m>1 and n=1, m pieces of combinational logic share one sole output register whose V-bit will be generated independently that has no effects on the 2 shifting rules.

Input signal SINI drives inputs R of all registers FFx-FF0, and Data_position_shifter 1201 is initialized to all '0' one cycle after SINI is asserted. 2-input multiplexer 1202 has its '1' input connected to ground, its '0' input to bit Q1, its control input to input signal Lock_I and its output driving data input D of register FF0. 2-input and-gate 1203 has its one input connected to reverse Lock_I, another to bit Q1 and its output driving output signal WE_O. WE_O drives write enable input W of the output register on the mapped critical path, and is asserted if Lock_I is deasserted and Q1 is asserted, or not otherwise. Bit Q0 drives output signal Valid_O. Data outputs Qx-Q0 of registers FFx-FF0 are combined as a bus to drive shifter controller (SC) 1220's input Q and output signal S_O. SC 1220 has its input W connected to data entry bit 1233, its input L to input signal Lock_I, its output E0 driving write enable input W of FF0, and another output E1 driving write enable inputs W of FFx-FF1. Data entry bit 1233 also drives register FFx's input D. Being located within either a SMB or a MCMB and playing 2 slightly different roles, SM 1200 is designed to have 2 mutually exclusive logic boxes 1232 and 1234 to handle 2 different situations.

Logic box 1232 is used when Multiple_copy_number=1, Input_clock_number >=1 and SM 1200 is located within a SMB, comprises input clock controller (ICC) 1210 and 2-input and-gates 1231. 2-input and-gate 1231 has its one input connected to ICC 1210's output T, another to input signal WE_I and its output driving data entry bit 1233, output signal WE_I_O and ICC 1210's input E. Data entry bit 1233 and output signal WE_I_O are asserted if an input data is being latched by the input register on the mapped critical path, or not otherwise. Data entry bit 1233 is asserted under 3 conditions or not otherwise: a) an input data is available; b) the circuit can accept next input data; and c) the input register on the mapped critical path satisfies the limit posed by Input_clock_number. ICC 1210 has its input S connected to input signal SINI and its output R driving output signal R_O.

Logic box 1234 is used when Multiple_copy_number >1, Input_clock_number=1 and SM 1200 is located within a MCMB, receives input signal WE_I which drives data entry bit 1233, and connects 2 output signals WE_I_O and R_O to ground. Output signals WE_I_O and R_O are not used in the situation. Data entry bit 1233 is asserted if an input data is being latched by the input register on the mapped critical path, or not otherwise.

Figure 12B:
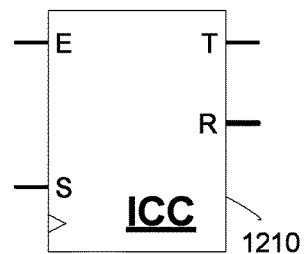
FIG. 12b is the interface of input cycle controller (ICC) 1210 which exists only when Input_clock_number >1.

FIG. 12b is the interface of input cycle controller (ICC) 1210 which exists only when Input_clock_number >1. ICC 1210 is used to determine whether or not the input register on the mapped critical path satisfies the limit posed by Input_clock_number. ICC has 2 input signals:
 1) E: it is asserted if an input data is being latched onto the input register on the mapped critical path, or not otherwise.
 2) S: it is connected to input signal SINI.
ICC 1210 has 2 output signals:
 1) T: it is asserted if the input register on the mapped critical path satisfies the limit posed by Input_clock_number, or not otherwise.
 2) R: it is a y-bit signal, where y=Input_clock_number, a direct output from Input_clock_rotator 1211, providing rotation information about when the input register satisfies the limit posed by Input_clock_number. R(0) is asserted if the input register satisfies the limit, or not otherwise.

Figure 12C:
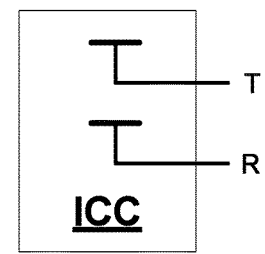
FIG. 12c is the interface of ICC 1210 if Input_clock_number=1.

FIG. 12c is the interface of ICC 1210 if Input_clock_number=1. In the situation ICC 1210 has no input signals and 2 output signals T and R connected to logic '1'. Their physical meaning is that when Input_clock_number=1 there is no limit posed by Input_clock_number, and there is no Input_clock_rotator 1211.

Figure 12D:
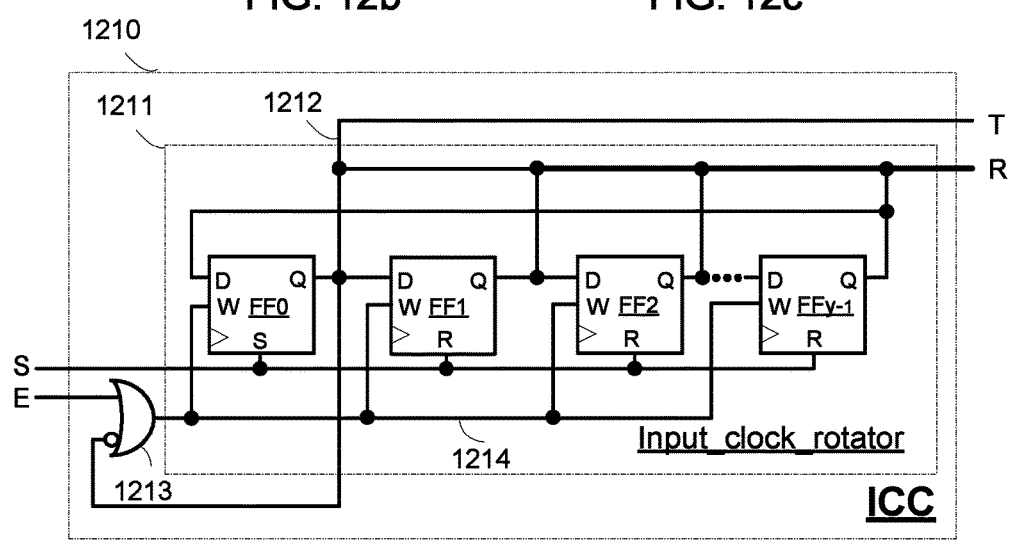
FIG. 12d is the schematic of ICC 1210 if Input_clock_number >1.

FIG. 12d is the schematic of ICC 1210 if Input_clock_number >1. Input_clock_rotator 1211 has y bits, where y=Input_clock_number. Input signal S drives input S of FF0 and inputs R of FF1-FFy−1. Input_clock_rotator 1211 has bit Q0 asserted and other bits Q1-Qy−1 deasserted one cycle after input signal S is asserted. Outputs Q of registers FF0-FFy−1 drive bits Q0-Qy−1, respectively. Bit Q0 1212 drives output signal T whose assertion indicates that the input register on the mapped critical path satisfies the limit posed by Input_clock_rotator. 2-input or-gate 1213 has its one input connected to input signal E, another to reverse bit Q0 1212 and its output driving write enable inputs W of Input_clock_rotator 1211. Input_clock_rotator 1211 is right rotated 1 bit if either an input data is being latched (E='1') or bit Q0 1212 is deasserted. It means that when an input data is being latched, Input_clock_rotator 1211 will be rotated one bit per cycle continuously for Input_clock_number cycles to complete a round to make the input register satisfying the limit posed by Input_clock_number again. The Input_clock_rotator 1211 can also be implemented by a left rotator, or a state machine using the same rule with one state corresponding to one bit in the Input_clock_rotator 1211.

Figure 12E:
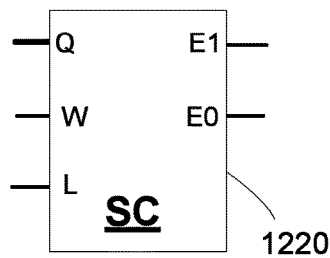
FIG. 12e is the interface of a shifter controller (SC) 1220.

FIG. 12e is the interface of a shifter controller (SC) 1220. SC is used to implement two shifting rules described in FIG. 12a. SC 1220 has 3 input signals:
 1) Q: it is a (x+1)-bit signal, where x=Series_clock_number, and Q(j) is asserted if data at position j on the mapped critical path is valid, or not otherwise.
 2) W: it is asserted if a new data is being latched by the input register on the mapped critical path on the current cycle, or not otherwise.
 3) L: it is deasserted if shifting rule 1 applies to Data_position_shifter 1201, or asserted if shifting rule 2 applies.
SC has 2 output signals:
 1) E0: it drives the write enable input W of register FF0 in FIG. 12a.
 2) E1: it drives the write enables inputs W of registers FFx-FF1 in Data_position_shifter 1201.

Figure 12F:
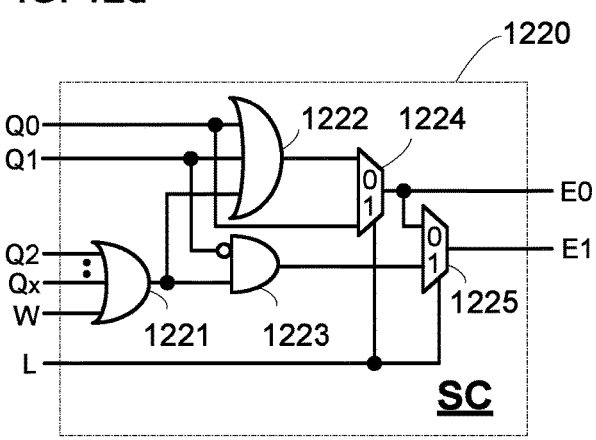
FIG. 12f is the schematic of shifter controller (SC) 1220.

FIG. 12f is the schematic of shifter controller (SC) 1220. X-bit or-gate 1221 has inputs connected to input signals W and Q2-Qx, respectively. 3-input or-gate 1222 has input signals Q0-Q1 and or-gate 1221's output as its 3 inputs. 2-input and-gate 1223 has its one input connected to reverse input signal bit Q1 and another to or-gate 1221's output. 2-input multiplexer 1224 has its '0' input connected to or-gate 1222's output, its '1' input to input signal Q0, its control input to input signal L and its output driving output signal E0. 2-input multiplexer 1225 has its '0' input connected to multiplexer 1224's output, its '1' input to and-gate 1223's output, its control input to input signal L, and its output driving output signal E1. There are two situations based on input signal L:
 1) If input signal L has logic '0': the piece of combinational logic on the critical path is in unlocked state, outputs E0 and E1 are the same, implementing shifting rule 1 for Data_position_shifter 1201.

2) If input signal L has logic '1': the piece of combinational logic on the critical path is in locked state:

a) E0 is asserted if Q0 is asserted, or not otherwise, making Q0 equal to '0' in FIG. 12*a* and implementing shifting rule 2a) for Data_position_shifter 1201.

b) E1 is asserted if at least one bit among input signals W and bits Q2-Qx is asserted and Q1 is deasserted, or not otherwise, implementing shifting rule 2b) for Data_position_shifter 1201.

The above connection applies if Data_position_shifter 1201 has at least one combinational logic bit. If Series_clock_number=1 and Data_position_shifter 1201 has no combinational logic bit, input signals Q2-Qx don't exist and schematic in FIG. 12*f* still works.

Lemma 1 In buffering configurations 3) and 4), if the circuit has 2 pieces of combinational logic having valid data located in their last positions on the current cycle, respectively, the piece of combinational logic which has the data first arrived at the last position is in locked state.

Proof Based on data input rule, the circuit receives at most one input data per cycle, and those data reach their last positions in their pieces of combinational logic at most one by one, respectively, if there is no locked piece of combinational logic, so if the circuit has 2 pieces of combinational logic having valid data located in their last positions on the current cycle, the piece of combinational logic which has the data first arrived at the last position is in locked state based on shifting rule 2.

Lemma 2 In buffering configurations 3) and 4), if the circuit has K (K>2) pieces of combinational logic having valid data located in their last positions on the current cycle, respectively, all pieces of combinational logic which have the data located at their last positions are in locked state except the piece of combinational logic which has the data last arrived its last position.

Proof It can be proved repeatedly using Lemma 1 pairwise for first (K−1) pieces of combinational logic.

Active output register theorem The circuit has at most one active output register on any cycle.

Proof The design follows 3 coding rules: a) at most one input register is latching an input data on any cycle; b) at most one data is being output on any cycle; and c) the active state has only one cycle lifespan for a valid data latched by its owner output register on the current cycle. Based on the definition of the active state of an output register state machine it has to prove that the circuit has at most one output register latching a data from one or more piece of combinational logic on any cycle. There are 3 different situations in 6 buffering configurations:

1) Configurations 1) and 2): there is one input register and one output register. It guarantees that the sole output register can latch at most one data per cycle based on the coding rules a), b) and Critical path storage theorem 1.

2) Configurations 3) and 4): there is more than one input register, more than one output register, or m=n>1. The circuit might have more than one active output register only if K (K>=2) pieces of combinational logic had their last positions occupied by valid data, respectively, and their output registers were latching from them on the current cycle, because the active state has one cycle lifespan for a new data latched by the owner output register on the current cycle. Based on Lemma 2, the K pieces of combinational logic except the last one are in locked state and only the last piece of combinational logic among the K pieces of combinational logic can be latched onto its output register.

3) Configurations 5) and 6): there is a plurality of pieces of combinational logic and the plurality of pieces of combinational logic shares a sole output register, or m>1 and n=1. There is a Combinational_logic_rotator that limits only one piece of combinational logic being eligible to be latched onto the sole output register on any cycle.

The output register bit Q0 in Data_position_shifter 1201 is called V-bit for the owner output register's output register state machine when m=n>=1. When m>1 and n=1, there are m CPCs, m Data_position_shifter 1201 and the sole output register, and a new V-bit will be generated.

FIG. 13 is the interface of a series master component with buffering function (SMB) 1310. SMB 1310 is a WPC connected to a single CPC to handle situations when Series_clock_number >=Input_clock_number >=1, and m=n=1. A synthesizer will try its best to generate a circuit that can accept one data per cycle using a SMB. If it fails and a link2 statement instead of a link1 statement is used, the synthesizer would switch to generate the circuit using the SMB that can accept one data per Input_clock_number cycles and the structure has 100% success rate. SMB 1310 also has an inherent ability to handle the case when Series clock number=1, and in the case CPC 1300 in combination with its connected SMB 1310 is degenerated to a non-critical normal circuit, and also provides buffering function if a designer wants the circuit to buffer more than 2 data.

SMB 1310 has 2 wave constants and 3 generic constants:
1) Series_clock_number: a wave constant of the circuit.
2) Input_clock_number: a wave constant of the circuit.
3) Wanted_capacity: it is the minimum number of data a designer wants the circuit to buffer.
4) Output_data_width: it is SMB's input/output data's width, and the width is the same as its connected CPCs' output data's width.
5) Assistant_data_width: it is assistant data's width. The width must be >=1.

SMB 1310 has 5 input signals:
1) O_OK_I: it is asserted if the circuit is allowed to output, or not otherwise.
2) D_I: it is data input bus for the circuit and has output data's width.
3) Da_I: it is an assistant data input bus whose input is synchronous with D_I's input, and has assistant data's width.
4) Ready_I: it is asserted if both input data at D_I and input assistant data at Da_I are valid, or not otherwise. Ready_I must be kept asserted until output signal WE_I_O from SMB is asserted for an input data to be latched.
5) SINI: it is connected to input signal SINI of the circuit.

SMB 1310 has 8 output signals:
1) WE_I_O: it drives the write enable input W of the input register of the connected CPC and drives input WE_I of the CPC. WE_I_O is also used to let designer advance to provide next input data if it is asserted as a handshaking signal.
2) WE_O: it drives the write enable input W of the output register of the connected CPC and drives input WE_O_I of the CPC.
3) D_O: it drives data output bus for the circuit and has output data's width. A designer freely defines Output data's width and types.

4) Da_O: it drives assistant data output bus whose output is synchronous with the output of D_O, and has output assistant data's width. A designer freely defines Output assistant data's width.
5) Valid_O: it is asserted if both data output D_O and assistant data output Da_O are valid, or not otherwise. Valid_O's assertion lasts one cycle for a valid output data.
6) E_O: it is asserted if the circuit is empty, or not otherwise.
7) S_O: it is an (x+1)-bit output signal, where x=Series_clock_number. S_O is the direct output from the Data_position_shifter 1201, providing information of where valid data are distributed on the mapped critical path with bit '1' being a valid data and bit '0' an invalid data.
8) R_O: it is a y-bit output signal, where y=Input_clock_number. R_O is the direct output from the Input_clock_rotator 1211, providing information of when the input register on the mapped critical path satisfies a limit posed by Input_clock_number. R_O(0) is asserted if the input register satisfies the limit, or not otherwise.

Output signals E_O, S_O and R_O in SMB 1310 are not used for the circuit's operation, designed only to provide designers or synthesizers with full information for any special needs. S_O and R_O need the information of circuit's Series_clock_number and Input_clock_number, respectively. All circuit's wave constant information outside the circuit is available by using alias wave constant declaration mechanism specified in the 3 foregoing mentioned patents.

FIG. 13a is the interface of a CPC 1300 connected to SMB 1310. CPC 1300 is a critical path component (CPC) from its input register through its piece of combinational logic to its output register without Series_clock_number information.

CPC 1300 has 2 optional generic constants, and any number of other optional generic constants a designer wants to add:

1) Input_data_width: it is input data's width of the circuit, optional.
2) Output_data_width: it is output data's width of the circuit, optional; and Input_data_width and Output_data_width may have different widths.

A CPC's Input_data_width and Output_data_width are optional, because they may skip and be replaced by fixed digital numbers in CPC coding.

The CPC has 3 input signals, and any number of optional input signals a designer wants to add:
1) WE_I: it drives the write enable input W of input register FFi of the CPC, and asserted if an input data is being latched by the input register, or not otherwise. It is driven by output signal WE_I_O of the connected SMB.
2) WE_O_I: it drives the write enable input W of output register FFo of the CPC, and asserted if an output data is being latched by the output register, or not otherwise. It is driven by output signal WE_O of the connected SMB.
3) D_I: it is data input for the circuit. Input signal D_I's data types and widths are determined by a designer.

The CPC has one output signal, and any number of optional output signals a designer wants to add:
1) D_O: it is output data driven by output register FFo of the CPC. D_O drives input signal D_I of the connected SMB.

Here is a CPC code exemplar CPC_1_2 linked by a link1 or a link2 statement with a SMB for a 64-bit wave-pipelined signed integer multiplier C<=A*B, illustrating how powerful the methods invented by the 3 foregoing mentioned patents are, especially how simple and natural it is to write a wave-pipelined circuit. The methods assume that all complex logic designs should and can be left to resolve by synthesizers, a task that absolutely can be done based on the history of the generated wave-pipelined circuits mentioned in paper "Wave-Pipelining: A Tutorial and Research Survey" by Wayne P. Burleson et al in IEEE Trans. Very Large Scale Integra. (VLSI) Syst., vol. 6, no. 3, pp. 464-474, Sep. 1998.

```
entity CPC_1_2 is
    generic (
        Input_data_width      : positive := 64;     -- optional
        Output_data_width     : positive := 128     -- optional
    );
    port (
        CLK:        in std_logic;
        WE_i:       in std_logic;      -- '1': write enable to input registers A & B
        Da_i:       in signed(Input_data_width-1 downto 0); -- input data A
        Db_i:       in signed(Input_data_width-1 downto 0);-- input data B
        WE_o_i:in std_logic;           -- '1': write enable to output register C
        Dc_o:       out unsigned(Output_data_width -1 downto 0) -- output data C
    );
end CPC_1_2;
architecture A_CPC_1_2 of CPC_1_2 is
    signal      Ra : signed(Input_data_width-1 downto 0);       -- input register A
    signal      Rb : signed(Input_data_width-1 downto 0);       -- input register B
    signal      Rc : signed(Output_data_width-1 downto 0);      -- output register C
    signal      Cl: signed(Output_data_width-1 downto 0);       -- combinational logic
begin
    Cl      <= Ra * Rb;         -- combinational logic's output, key part of CPC
    Dc_o    <= unsigned(Rc);    -- output to a SMB comes from output register
                                -- and it must be "unsigned" data type
    p_1 : process(CLK)
    begin
        if Rising_edge(CLK) then
            if WE_i = '1' then              -- WE_i = '1' : latch input data
                Ra <= Da_i;
                Rb <= Db_i;
            end if;
```

```
        if WE_o_i = '1' then           -- WE_o_i = '1': latch output data
            Rc <= Cl;
        end if;
      end if;
   end process;
end A_CPC_1_2;
```

The above CPC code can easily be changed to a 64-bit floating wave-pipelined multiplier C<=A*B, C<=A*B+C, or their 32-bit counterparts, and so on. The above CPC code exemplar also illustrates following coding rules on data type change between a pair of CPC and WPC (either a SMB or a MCMB) to let the circuit capable of handling any data operation type with buffering function:

1) A CPC has at least one freely selected input data type.
2) A CPC has at least one freely selected output data type.
3) A CPC's output's data type must be switched to "unsigned" data type by a designer before the CPC's output is physically connected to its paired WPC's input in code.
4) A WPC's both input and output data always have fixed "unsigned" data type.
5) A WPC's output's data type should be switched back externally from "unsigned" data type to the final processing result's data type by the designer to get his proper processing result.
6) A CPC's output data's width and its paired WPC's input/output data's widths are always the same.
7) Here is a data type flow list, showing how data type changes from the circuit's input data to the circuit's output data:
   a) Before the circuit's input: one or more input data types;
   b) After CPC's processing: one or more final output data types;
   c) Before or after CPC's output: "unsigned" data type;
   d) Before WPC's input: "unsigned" data type;
   e) After WPC's output: "unsigned" data type; and
   f) After the circuit's output: the one or more final output data types.

Input signals and output signals marked by '*' in FIG. 13, FIG. 13a, FIG. 14 and FIG. 14a have "unsigned" data type to partially reflect the above rules.

FIG. 13b is the block diagram of CPC 1300. FFi 1301 is CPC's input register of input data's width; 1302 is an optional feedback for the CPC if feedback exists and is drawn as a dashed line; 1303 is CPC's piece of combinational logic; FFo 1304 is CPC's output register of output data's width.

FIG. 13c is the schematic of SMB 1310. SMB 1310 is a wave-pipelining component (WPC), and a link1 or a link2 statement is used to link CPC 1300 with WPC 1310 to form a standard wave-pipelining ready code. Because SMB 1310 is connected to one CPC which has one output register, all multiple-bit or multiple-bus input and output signals with affix "_n" and "_m" in BM 1312 become either 1-bit signal or 1-bus signal, respectively, or m=n=1. SMB 1310 comprises sub-components SM 1311 and BM 1312. 2-input or-gate 1313 has its one input connected to input signal Ready_I of the circuit and another to BM 1312's output I_OK_O.

Here are the connections of 3 input signals of SM 1311:
1) WE_I: it is connected to and-gate 1313's output.
2) Lock_I: it is connected to output Lock_O_m of BM 1312.
3) SINI: it is connected to input signal SINI of the circuit.

Here are the connections of 5 output signals for SM 1311:
1) WE_I_O: it drives input WE_I of CPC 1300.
2) WE_O: it drives input WE_O_I of CPC 1300.
3) Valid_O: it drives BM 1312's input Valid_I_n.
4) S_O: it drives output signal S_O of the circuit.
5) RO: it drives output signal R_O of the circuit.

Here are the connections of 7 input signals of BM 1312:
1) D_I n: D_In is connected to CPC 1300's output D_O.
2) Turn_I_m: it is connected to ground.
3) WE_I: it is connected to SM 1311's output WE_I_O.
4) Valid_I_n: Valid_I_n is connected to SM 1311's output Valid_O.
5) Da_I: it is connected to input signal Da_I of the circuit.
6) O_OK_I: it is connected to input signal O_OK_I of the circuit.
7) SINI: it is connected to input signal SINI of the circuit.

Here are the connections of 6 output signals of BM 1312:
1) Valid_O: it drives output signal Valid_O of the circuit.
2) D_O: it drives data output signal D_O of the circuit.
3) Da_O: it drives assistant data output signal Da_O of the circuit.
4) E_O: it drives output signal E_O of the circuit.
5) I_OK_O: it drives 2-input or-gate 1313's one input.
6) Lock_O_m: Lock_O_m drives SM 1311's input Lock_I.

Here is the data flow for the circuit comprising CPC 1300 and SMB 1310 in FIG. 13b and FIG. 13c: Data enter CPC 1300 through input signal D_I under control by output signal WE_I_O from SMB 1310. SMB 1310 provides both write enable signals to input register FFi and output register FFo in CPC 1300, and input data pass through the critical path of CPC one data per Input_clock_number cycles. Output data from CPC 1300 pass through SMB 1310 which provides buffering control function and second storage FIFO_1 if needed, while the critical path provides the first storage. Data output D_O of the circuit is under control by input signal O_OK_I of the circuit. D_O and Da_O are valid if output signal Valid_O is asserted, or not otherwise. Input assistant data are stored in BM 1312.

FIG. 14 is the interface of a multiple copy master component with buffering function (MCMB). MCMB 1401/1501 is a wave-pipelining component (WPC) which is connected to multiple copies of a same CPC to handle situations when the circuit is required to accept one data per cycle at any cost, even if multiple copies of the CPC are used. A synthesizer will try its best to generate a circuit which can accept one data per cycle by using only one CPC. If it fails, the synthesizer will generate multiple copies of a same CPC to meet the requirement. The structure has 100% success rate, where Series_clock_number >=Multiple_copy_number >1. A MCMB is degenerated to a SMB if Multiple_copy_number=1. There are 2 structure configurations for a MCMB to deal with 2 different resource usages and with same input and output interfaces:

1) MCMB_1: In FIG. 14*b* m=n>1, data outputs D_O_m of m CPCs are driven by their m output registers. And its schematic is shown in FIG. 14*b*.
2) MCMB_2: In FIG. 15 m>1 and n=1, data outputs D_O_m of m CPCs are driven by their pieces of combinational logic, and all m CPCs share one output register which is located in the MCMB 2. And its schematic is shown in FIG. 15.

A MCMB_1 and a MCMB_2 almost have the same performance. If the circuit does not comprise FIFO_1 and still satisfies buffering requirement, a MCMB_2 would certainly use few silicon resources. But if the circuit needs to comprise FIFO_1 with extra memory cells to meet buffering requirement, it must go through a careful calculation to decide which of a MCMB 1 and a MCMB 2 uses few silicon resources.

A new wave constant Thru_out_register is introduced to handle a property of exchangeability between a MCMB_1 and a MCMB_2, and has 4 points different from 3 previously defined wave constants: Series_clock_number, Input_clock_number and Multiple_copy_number:

1) Thru_out_register is a constant bit, having value '0' or '1', while other 3 wave constants has positive integer values.
2) Thru_out_register appears in both a WPC and its paired CPCs if they are linked by a link3 statement to form a standard wave-pipelining ready code while other 3 wave constants appear only in a WPC.
3) A designer must code Thru_out_register in CPCs that can be fully copied from exemplar CPC_3 code in VHDL in the present invention.
4) Thru_out_register's initial value is determined by a synthesizer by calling function Get_Thru_out_register( ) after other 2 wave constants are determined by the synthesizer. The present invention provides the function Get_Thru_out_register( ).

A MCMB has 3 wave constants and 3 generic constants:
1) Series_clock_number: a wave constant for the circuit.
2) Multiple_copy_number: a wave constant for the circuit.
3) Thru_out_register: a new wave constant for the circuit.
4) Wanted_capacity: it is the minimum number of data a designer wants the circuit to buffer.
5) Output_data_width: it is the input/output data's width of the MCMB and the width is the same as its connected CPCs' output data's width and the circuit output data's width.
6) Assistant_data_width: it is the assistant data's width of the circuit. The width must be >=1.

MCMB 1401/1501 in FIG. 14 has 5 input signals among which 4 input signals O_OK_I, Ready_I, Da_I and SINI have the same definitions as they do for SMB 1310 in FIG. 13. The only different input signal is D_I_m. D_I_m is an m-bus data input signal and D_I_m(j) is driven by output signal D_O_m(j) of j-th CPC. MCMB 1401/1501 has 9 output signals among which 4 output signals Valid_O, D_O, Da_O and E_O have the same definitions as they do for SMB 1310 in FIG. 13. The 5 different output signals are defined as following:

5) WE_I_O_m: it is an m-bit output signal. WE_I_O_m(j) is the write enable to the input register in CPC 141*j*/151*j* and drives input WE_I_m(j) of j-th CPC 141*j*/151*j*.
6) WE_I_O: it is asserted if an input data is being written into an input register, or not otherwise. WE_I_O is provided to let designer advance to provide next input data if it is asserted as handshaking signal.
7) WE_O_m: it is an m-bit output signal. WE_O_m(j) is the write enable to the output register in CPC 141*j*/151*j* and drives input WE_O_I_m(j) of j-th CPC 141*j*/151*j*. This output signal is used only for a MCMB_1 and is left open for a MCMB_2.
8) S_O_m: it is an m-bus output signal. S_O_m(j) is the direct output of j-th Data_position_shifter 1201. S_O_m(j) provides information of where valid data are distributed on the mapped critical path for j-th CPC 141*j*/151*j*.
9) R_O_m: it is an m-bit output signal. R_O_m is the direct output of Input_register_rotator 1460 and provides information on which CPC among m CPCs has its turn to receive next input data. RO m(j) is asserted if the input register in j-th CPC 141*j*/151*j* has its turn to receive next input data, or not otherwise.

Output signals E_O, S_O_m and R_O_m in MCMB 1401/1501 are not used for the circuit's operation, designed only to provide designers or synthesizers with full information for any special needs.

FIG. 14*a* is the interface of j-th CPC 141*j*/151*j* connected to a MCMB 1401/1501. Each CPC in FIG. 14*a* has similar interface definitions as the CPC defined in FIG. 13*a* does with one exception that the CPC in FIG. 14*a* has a new wave constant Thru_out_register which will be described shortly. In addition to the exception, Input/output signal names change from WE_I to WE_I_m(j), WE_O_I to WE_O_I_m(j), and D_O to D_O_m(j).

FIG. 14*b* is the block diagram of CPCs 1400 linked with MCMB_1 1401. There are m copies 1410-141*m*-1 of a same CPC. For MCMB_1 1401 m=n>1. MCMB_1 1401 comprises m SM 1420-142*m*-1, a BM 1430 and an input cycle distributor (ICD) 1440.

Here are the connections of 3 input signals of j-th SM 142*j* (0<=j<=m-1):
1) WE_I: it is connected to output WE_I_O_m(j) of ICD 1440.
2) Lock_I: it is connected to output Lock_O_m(j) of BM 1430.
3) SINI: it is connected to input signal SINI of the circuit.

Here are the connections of 5 output signals for j-th SM 142*j* (0<=j<=m-1):
1) WE_I_O: it is left open.
2) WE_O: it drives output WE_O_m(j) of MCMB_1 1401.
3) Valid_O: it drives input Valid_I_n(j) of BM 1430.
4) S_O: it drives output signal S_O_m(j) of the circuit.
5) R_O: it is left open.

Here are the connections of 7 input signals of BM 1430:
1) D_I_n: it is an n-bus input signal. D_I_n(j) is connected to input D_I_m(j) of MCMB_1 1401, and m=n>1.
2) Turn_I_m: it is connected to ground and not used.
3) WE_I: it is connected to output WE_I_O of ICD 1440.
4) Valid I_n: it is an n-bit input signal and Valid_I_n(j) is driven by output Valid_O of j-th SM 142*j*.
5) Da_I: it is connected to input signal Da_I of the circuit.
6) O_OK_I: it is connected to input signal O_OK_I of the circuit.
7) SINI: it is connected to input signal SINI of the circuit.

Here are the connections of 6 output signals of BM 1430:
1) Valid_O: it drives output signal Valid_O of the circuit.
2) D_O: it drives data output signal D_O of the circuit.
3) Da_O: it drives assistant data output signal Da_O of the circuit.
4) E_O: it drives output signal E_O of the circuit.
5) I_OK_O: it drives input I_OK_I of component ICD 1440.

6) Lock_O_m: it is an m-bit output signal. Lock_O_m(j) drives input Lock_I of j-th SM 142*j*.

Here are the connections of 3 input signals for ICD 1440:
1) I_OKI: it is connected to output I_OK_O of BM 1430.
2) Ready_I: it is connected to input signal Ready_I of the circuit.
3) SINI: it is connected to input signal SINI of the circuit.

Here are the connections of 3 output signals of ICD 1440:
1) WE_I_O_m: it is an m-bit output signal. WE_I_O_m(j) drives input WE_I of j-th SM 142*j* and output WE_I_O_m(j) of MCMB_1 1401.
2) WE_I_O: it drives input WE_I of BM 1430 and output signal WE_I 0 of the circuit.
3) R_O_m: it drives output signal R_O_m of the circuit.

The data flow for the circuit comprising CPC 1400 and MCMB_1 1410 in FIG. 14*b* is the same as FIG. 13*b* and FIG. 13*c* except that m input registers take turns to latch input data, and m output registers take turns to latch output data.

Figure 14C:
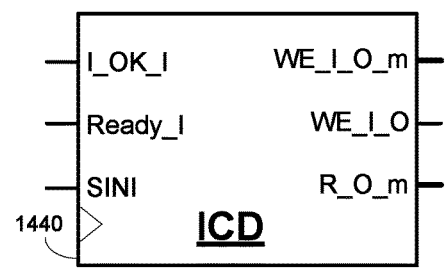
FIG. 14c is the interface of ICD 1440 in FIG. 14b.
Figures 15, 15A:
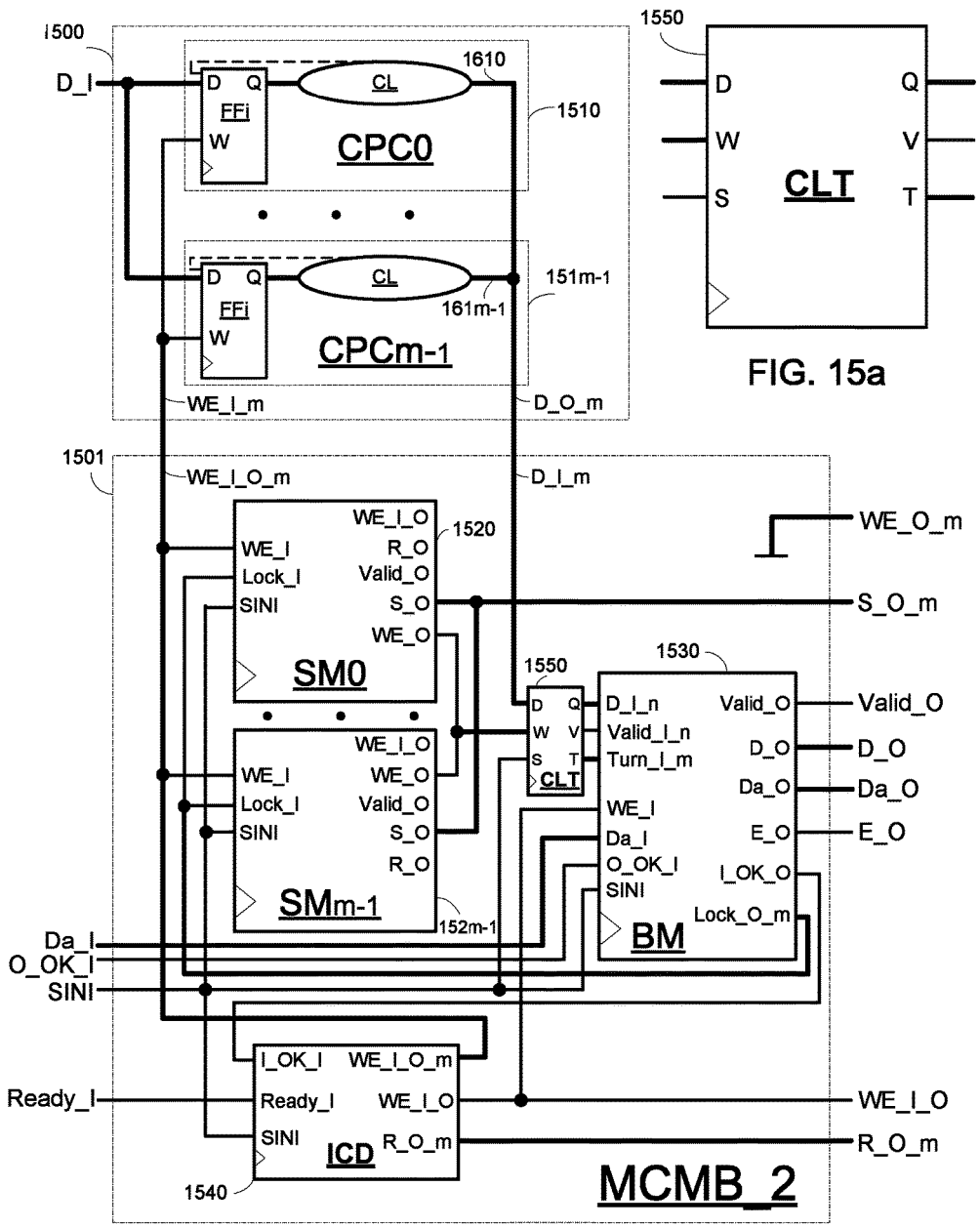
FIG. 15 is the block diagram of CPCs 1500 linked with MCMB_2 1501.
FIG. 15a is the interface of CLT 1550 in FIG. 15.

FIG. 14*c* is the interface of ICD 1440 in FIG. 14*b*. ICD 1440 is designed to centrally generate input signals for SMs and CPCs, and output signal WE_I_O of the circuit. ICD 1440 has 3 input signals:
1) I_OK_I: it is asserted if the circuit can accept next input data or not otherwise.
2) Ready_I: it is asserted if an input data is available, or not otherwise.
3) SINI: it is connected to input signal SINI of the circuit.

ICD 1440 has 3 output signals:
1) WE_I_O_m: it is an m-bit output signal. WE_I_O_m(j) is the write enable to the input register in CPC 141*j*.
2) WE_I_O: it is asserted if an input data is being latched, or not otherwise.
3) R_O_m: it is direct output of Input_register_rotator 1460, providing information on which of m CPCs has its turn to receive next input data on the current cycle.

Figure 14D:
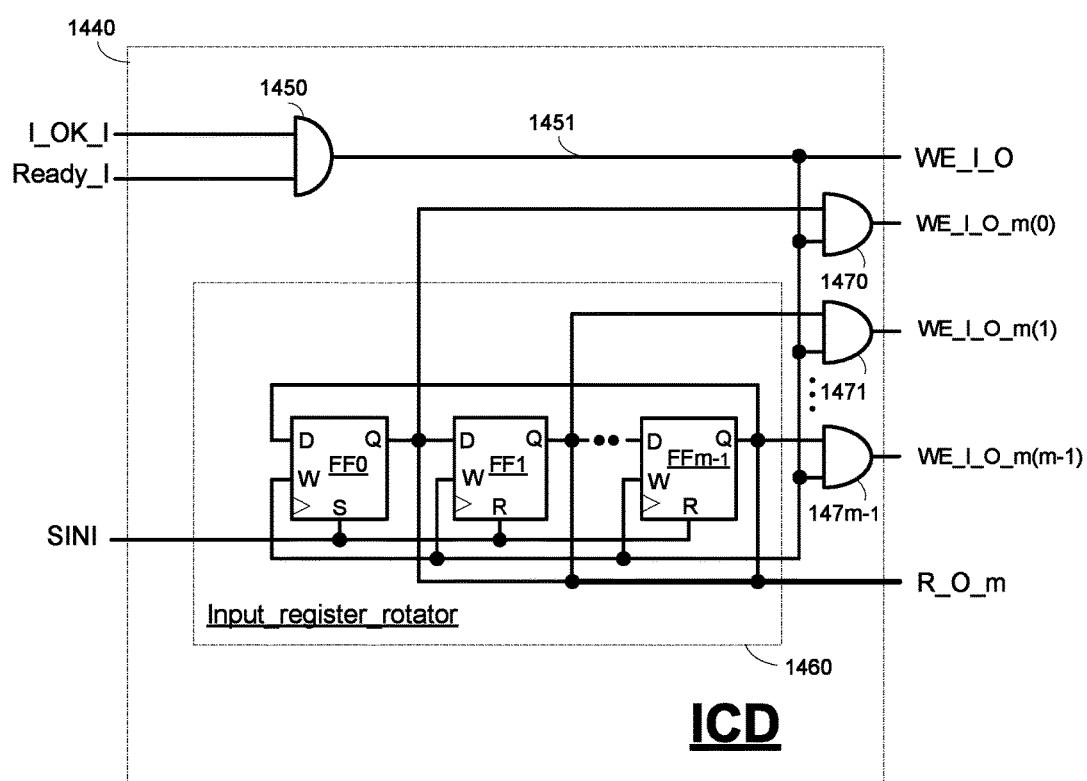
FIG. 14d is the schematic of ICD 1440.

FIG. 14*d* is the schematic of ICD 1440. Input_register_rotator 1460 is an m-bit rotator and used to determine which of m input registers has its turn to receive next input data. 2-input and-gate 1450 has its two inputs connected to input signals I_OK_I and Ready_I, respectively, and its output driving wire 1451. Wire 1451 is asserted if an input data is being latched into an input register, or not otherwise. Wire 1451 is asserted only if input data is available and the circuit is able to receive next input data without data overflow. Wire 1451 drives output signal WE_I_O, one input of 2-input and-gate 147*j* (0<=j<=m−1) and inputs W of registers FF0-FFm−1. 2-input and-gate 147*j* (0<=j<=m−1) has another input connected to output Q of register FFj, and its output driving output signal WE_I_O_m(j). Q0-Qm−1 combined together drive output signal RO m. Input signal SINI drives register FF0's input S and inputs R of registers FF1-FFm−1. Q0 is asserted and Q1-Qm−1 are deasserted one cycle after input signal SINI is asserted. The rotator is rotated one bit each time a new input data is being latched and the sole asserted bit among Q0-Qm−1 indicates which of m input registers has its turn to receive next input data. Input_register_rotator 1460 may also be designed as a state machine with the same rule.

FIG. 15 is the block diagram of CPCs 1500 linked with MCMB_2 1501. There are m copies 1510-151*m*−1 of a same CPC, each comprising an input register FFi, a piece of combinational logic CL, and sharing one output register which is relocated to MCMB_2 1501 to reduce logic area and designer's burden to avoid repeatedly writing the same code. The piece of combinational logic of j-th CPC drives its output signal D_O_m(j). For MCMB_2 1501 m>1 and n=1.

The block diagram of a MCMB_2 1501 in FIG. 15 is the same as one of MCMB_1 1401 in FIG. 14*b* except that a new Combinational Logic Turn component (CLT) 1550 is added. CLT 1550 is a sub-WPC, designed to coordinate all changes caused by moving the shared sole output register from CPCs 1500 to MCMB_2 1501. CLT 1550 has its m-set data bus input D connected to input signal D_I_m of the circuit, its input W(j) to output WE_O of j-th SM 152*j*, its input S to input signal SINI of the circuit, its 1-set data output signal Q of output register's width driving input D_I_n of BM 1530, its 1-bit output V driving input Valid_I_n of BM 1530, and its m-bit output T driving input Tunr_I_m of BM 1530.

The data flow for the circuit comprising CPC 1500 and MCMB_2 1501 in FIG. 15 is the same as FIG. 14*b* except that m copies 1510-151*m*−1 of a same CPC share one output register which is relocated to MCMB_2 1501.

FIG. 15*a* is the interface of CLT 1550 in FIG. 15. CLT 1550 is a sub-WPC and has one wave generic constant and one normal generic constant:
1) Multiple_copy_number1: it will be assigned with Multiple_copy_number of the parent MCMB_2.
2) Output_data_width: it is output data's width of the circuit, and is assigned with the MCMB_2's Output_data_width.

CLT 1550 has 3 input signals:
1) D: it is an m-set data bus input signal. D(j) is driven by output of piece of combinational logic of j-th CPC 151*j*.
2) W: it is an m-bit input signal. W(j) is asserted if D(j) is valid, or not otherwise.
3) S: it is connected to input signal SINI of the circuit.

CLT 1550 has 3 output signals:
1) Q: it is data bus output from sole output register 1583 of output data's width.
2) V: V is asserted if output Q is valid, or not otherwise. Output signal V has one cycle lifespan for a valid output data Q.
3) T: it is an m-bit output signal. T(j) is asserted if the piece of combinational logic of j-th CPC 151*j* in FIG. 15 has its turn to be latched onto sole output register FFo 1583, or not otherwise.

Figure 15B:
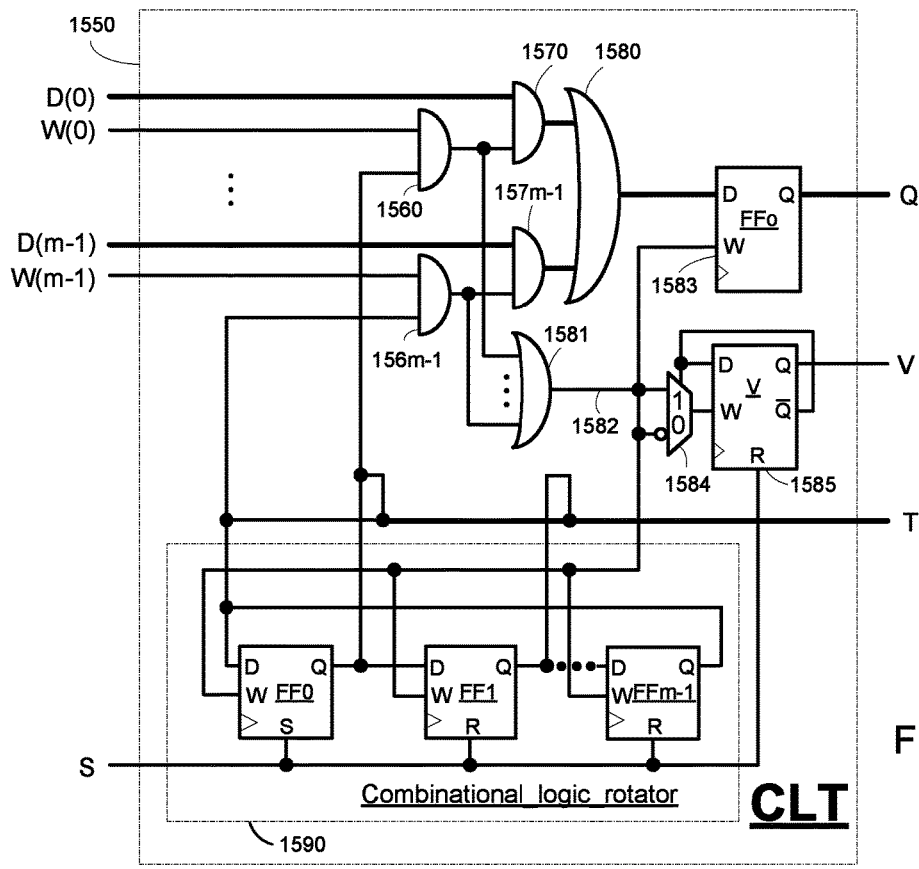
FIG. 15b is the schematic of CLT 1550 in FIG. 15.

FIG. 15*b* is the schematic of CLT 1550 in FIG. 15. Combinational_logic_rotator 1590 has m bits among which there is a sole asserted bit indicating which of m pieces of combinational logic has its turn to be latched onto sole output register FFo 1583. Combinational_logic_rotator 1590 is used to keep the data latching order onto the sole output register consistent with the input data latching order onto input registers. Input signal S drives input S of register FF0, inputs R of registers FF1-FFm−1 and 1-bit register V 1585. One cycle after S is asserted, 1-bit register 1585 is deasserted, and Combinational logic_rotator 1590 has register FF0 asserted and other registers FF1-FFm−1 deasserted. Data outputs Q of all bit registers of Combinational_logic_rotator 1590 drive m-bit output signal T. 2-input and-gate 156*j* (0<=j<=m−1) has its one input connected to input signal W(j) and another to data output Q of j-th register FFj in Combinational_logic_rotator 1590. 2-input and-gate 157*j* has its one input connected to data input signal D(j) of output data's width and another to the output of and-gate 156*j*. M-bus input or-gate 1580 of output data's width has each input coming from one of the outputs of and-gates 1570 to 157*m*−1, respectively, and its output driving data input D of sole output register 1583 of output data's width. M-bit input or-gate 1581 has each input connected to the output of one of and-gates 1560-156*m*−1, respectively, and its output driving wire 1582, output register 1583's input W and Combinational_logic_rotator 1590's write enables W. Wire 1582 is asserted if a new data is being latched onto sole output register 1583 on the current cycle, or not otherwise. Combinational_logic_rotator 1590 is rotated a bit each time a data is being latched onto output register 1583. Register 1583 has its output Q driving output signal Q. 2-input multiplexer 1584 has its '1' input connected to wire 1582, its '0' input to reverse wire 1582, its control input to register 1585's output $\overline{Q}$, and its output driving register 1585's input W. 1-bit register V 1585 is designed to remember status of output register 1583, has input R connected to input signal S, its data output $\overline{Q}$ also driving its data input D, and its output Q driving output signal V. Output signal V is asserted if data output signal Q is valid, or not otherwise. Register 1585 is being toggled only if wire 1582 is toggling to make output signal V consistent with data output signal Q.

How to Automatically Generate a MCMB_1 or a MCMB_2

A MCMB_1 and a MCMB_2 play the same function, and have different data structures to finish the same job. A MCMB_1 has Multiple_copy_number copies of a same CPC and each of CPCs has an independent output register while a MCMB_2 has Multiple_copy_number copies of a same CPC, sharing one output register. After buffering function is introduced it is unknown which of two WPCs uses few logic resources. They are designed to have the same interface and same connections with CPCs as shown in FIG. 14/FIG. 14a in order that they can be automatically exchanged by only one additional wave constant Thru_out_register if coding is properly designed for the situation. Here is the definition for Thru_out_register in coding a pair of a MCMB and CPCs:
1) '1': the output register of j-th CPC drives its output signal D_O_m(j), and CPCs are paired with a MCMB_1 as shown in FIG. 14b.
2) '0': the piece of combinational logic of j-th CPC drives its output signal D_O_m(j), and CPCs are paired with a MCMB_2 as shown in FIG. 15.

Here is a code snippet under which a synthesizer would generate a proper MCMB_1 or MCMB_2, depending on the value of wave constant Thru_out_register. Thru_out_register appears in the generic map and its initial value is determined by a synthesizer.
  entity work.MCMB—MCMB_1 or MCMB_2 will be properly generated
    generic map ( . . . )
    port map ( . . . );

Here is the rule on how to determine the initial value of Thru_out_register by a synthesizer. A synthesizer should call a global function Get_Thru_out_register( ) to get the initial value of Thru_out_register after 2 wave constants Series_clock_number and Multiple_copy_number have been determined. Here is the function's implementation. Coding notes are available in attached file: WPC-CPC-with-Buffering-Function.txt.

-- W = Wanted_capacity of the circuit; S = Series_clock_number;
-- M = Multiple_copy_number
function Get_Thru_out_register(W: integer; S: integer; M: integer) return
    std_logic is variable Max_1 : integer;
begin
  if W > (S+1) then
    Max_1 := W;
  else -continued

```
    Max_1 := S+1;
  end if;
  if (Max_1 < 2*M) and (M > 1) then
    return '0';
  else
    return '1';
  end if;
end Get_Thru_out_register;
```

Thru_out_register has initial value '0' if following 2 conditions are satisfied, or value '1' otherwise:
1) M>1: the circuit deploys m CPCs to enable the circuit to accept one data per cycle.
2) Max_1<2*M:
  a) Max_1=max (W, S+1), the largest required number of data for a MCMB to buffer.
  b) 2*M is the total number of input registers plus output registers for a MCMB_1 and each of the registers is counted for buffering one data.

So what function Get_Thru_out_register( ) returns is the selection that guarantees that minimum number of extra memory cells is used for the circuit.

Figure 16:
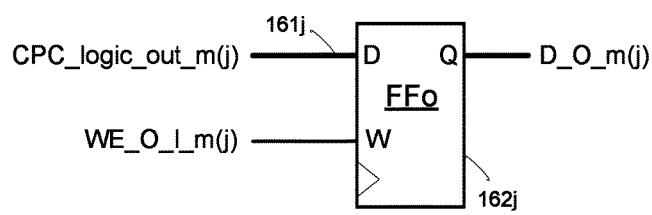
FIG. 16 is the schematic of the logic used to generate output signal D_O_m(j) of CPCs 1400 in FIG. 14b when wave constant Thru_out_register='1'.

FIG. 16 is the schematic of the logic used to generate output signal D_O_m(j) of CPCs 1400 in FIG. 14b when Thru_out_register='1'. Output register FFo 162j (0<=j<=m−1) of output data's width in CPC 141j has its data input D connected to CPC_logic_out_m(j) 161j of CPC 141j, its input W to input signal WE_O_I_m(j) of CPC 141j, and its output Q driving output signal D_O_m(j) of CPC 141j.

Figure 16A:
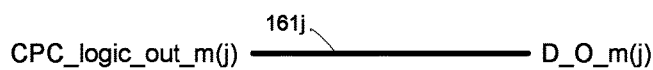
FIG. 16a is the schematic of the logic used to generate output signal D_O_m(j) of CPCs 1500 in FIG. 15 when wave constant Thru_out_register='0'.

FIG. 16a is the schematic of the logic used to generate output signal D_O_m(j) of CPCs 1500 in FIG. 15 when Thru_out_register='O'. In the case CPC_logic_out_m(j) 161j of CPC 151j directly drives output signal D_O_m(j) of CPC 151j.

Automatically generating one of 2 versions of MCMB without designers' deep involvement can be divided into 2 parts: a) MCMB component itself codes the 2 internal different parts for a MCMB_1 and a MCMB_2 based on Thru_out_register, and b) a designer codes CPCs' 2 different output parts by copying the off-shelf solution provided by the present invention. Please refer to attached file: WPC-CPC-with-Buffering-Function.txt on how a MCMB_1 and a MCMB_2 are separately generated based on Thru_out_register.

Here is a CPC code exemplar CPC_3 linked by a link3 statement with a MCMB for a 64-bit wave-pipelined signed integer multiplier C<=A*B. Different indexes for combinational logic output 161j and output register 162j in either FIG. 16 or FIG. 16a are automatically generated by putting the CPC instantiation into a loop statement "for . . . loop" whose label is also reflected in link3 statement. 5 "must" statements in CPC 3 show code differences between CPC_1_2 and CPC_3 for a same 64-bit wave-pipelined signed integer multiplier C<=A*B with 2 different link statements, one being link1 or link2 statement, another being link3 statement, and they must be copied by a designer into his code for a CPC whose instantiation link3 statement is used to link with an instantiation of a MCMB. Function unsigned ( ) is used to change CPC's output data type to "unsigned" data type so that CPCs' data output signal D_O_m can be directly connected to data input signal D_I_m of MCMB in FIG. 14b and FIG. 15 in HDL code.

```
entity CPC_3 is
  generic (
    wave Thru_out_register        : std_logic := '1';                  -- 1. must
    Input_data_width              :   positive := 64;      -- optional
    Output_data_width             :   positive := 128      -- optional
  );
  port (
    CLK        :   in std_logic;
    WE_i       :   in std_logic;                -- '1': write enable to input registers A, B
    Da_i       :   in signed(Input_data_width-1 downto 0); -- input data A
    Db_i       :   in signed(Input_data_width-1 downto 0); -- input data B
    WE_o_i     :   in std_logic;                -- '1': write enable to output register C
    Dc_o       :   out unsigned(Output_data_width -1 downto 0) -- output data C
  );
end CPC_3;
architecture A_CPC_3 of CPC_3 is
  signal       Ra :    signed(Input_data_width-1 downto 0);       -- input register A
  signal       Rb :    signed(Input_data_width-1 downto 0);       -- input register B
  signal       Rc :    signed(Output_data_width-1 downto 0);      -- output register C
  signal       Cl :    signed(Output_data_width-1 downto 0);      -- combinational logic
  signal       Dc_o_before_out : signed(Output_data_width-1 downto 0);         --2. must!
begin
  Cl         <= Ra * Rb;         -- combinational logic output, key part of CPC
  Dc_o_before_out <= Rc when Thru_out_register = '1' else Cl;         -- 3. must!
  Dc_o       <= unsigned (Dc_o_before_out);                           -- 4. must!
  p_1 : process(CLK)
  begin
    if Rising_edge(CLK) then
      if WE_i = '1' then                        -- WE_i = '1' : latch input data
        Ra <= Da_i;
        Rb <= Db_i;
      end if;
      if Thru_out_register = '1' then           -- output through Rc         -- 5. must!
        if WE_O_I = '1' then                    -- WE_O_I = '1':latch output data
          Rc <= Cl;
        end if;
      end if;
    end if;
  end process;
end A_CPC_3;
```

How to Link a SMB or a MCMB with CPC(s)

Here are rules on how concurrent link statements specified by the 3 foregoing mentioned patents are used to link a SMB or a MCMB with CPC(s), seamlessly being fitted with original specification.

1) Link1 statement can be used to link a SMB instantiation with a series CPC instantiation. In the situation Series_clock_number is determined by a synthesizer, and Input_clock_number=Multiple_copy_number=1, there is no Thru_out_register, and output data from the CPC are driven by the output register in the CPC. If Series_clock_number >1 and the synthesizer cannot generate a proper wave-pipelined circuit which is able to accept one data per cycle, the synthesizer declares a failure and designer must use other coding choice to make a proper wave-pipelined circuit.

2) Link2 statement can be used to link a SMB instantiation with an instantiation of a series CPC or a feedback CPC. In the situation Series clock number and Input_clock_number are determined by a synthesizer, Multiple_copy_number=1 and there is no Thru_out_register. If Series_clock_number >1 and the synthesizer cannot generate a proper wave-pipelined circuit which is able to accept one data per cycle as hoped by a designer, the synthesizer will increase Input_clock_number one by one, starting from 2 or more, to generate a proper wave-pipelined circuit which can accept one input data per Input_clock_number cycles. The structure has 100% success rate.

3) Link3 statement can be used to link a MCMB instantiation with m copies of instantiation of a series CPC or a feedback CPC. In the situation 3 wave constants Series_clock_number, Multiple_copy_number and Thru_out_register are determined by a synthesizer and Input_clock_number=1. If Series_clock_number >1 and the synthesizer cannot generate a proper wave-pipelined circuit which is able to accept one data per cycle as hoped by a designer, the synthesizer will increase Multiple_copy_number one by one, starting from 2 or more, to generate a proper wave-pipelined circuit which can accept one data per cycle with Multiple_copy_number copies of a same CPC. The structure has 100% success rate. Series_clock_number and Multiple_copy_number are determined first, and then Thru_out_register is determined to get a circuit which uses least silicon area and power consumption. If Thru_out_register=1, output data from the CPCs are driven by multiple output registers in the CPCs, and CPCs are paired with a MCMB_1; if Thru_out_register=0, output data from the CPCs are driven by multiple pieces of combinational logic in the CPCs and the CPCs are paired with a MCMB_2. Because a MCMB_1 and a MCMB_2 have the same input and output interface, designer doesn't have to concern about which of MCMB_1 and MCMB_2 is generated.

FINAL CONCLUSION

It must note that the present invention providing buffering function for a wave-pipelined circuit in HDL can apply not only to the method invented by the 3 foregoing mentioned patents, but also to any type of methods that generate wave-pipelined circuits before or after the present invention is filed. Here is the reason. The method invented by the 3 foregoing mentioned patents centers on 2 key points: a) the concepts of wave constant; and b) how to divide coding a wave-pipelined circuit into 2 code components: a CPC and a WPC. Those 2 key points are universal for coding any type of wave-pipelined circuits, because what the 2 key points need a designer to provide is the logic for the critical path, the least information required from a designer, and the classification of CPC and WPC for coding a wave-pipelined circuit does not generate any more logic than its best coded equivalent wave-pipelined circuit does. They are natural code classification for any wave-pipelined circuit. If the related wave constants can be determined manually in order to generate a wave-pipelined circuit, the present invention can fully apply without any change, since the present invention has nothing to do with how to generate related wave constants, either automatically or manually. And amazingly, the present invention can also be used to add buffering function to any successfully written code in HDL that had generated a well behavioral wave-pipelined circuit without causing any synthesization problem. The reason is what the present invention touches is the logic that has nothing to do with essential critical paths and will not generate any more timing delay and data contamination.

Why the development of the present invention is fully based on the method and circuits invented by the 3 foregoing mentioned patents is that the invented method and circuits cover the largest spectrum of structures and configurations of wave-pipelined circuits on one side, and on the other side, the present invention also gives the strongest support for the invented method to become a part of standard in HDL and for the renewed circuit version to become a part of system library in HDL as earlier as possible with a clever, stronger, better and more complete version of source file in VHDL than the previous version provided by the 3 foregoing mentioned patents.

The applicant of the present invention can be contacted by email: wtxwtx@gmail.com.

What is claimed is:

1. A method for constructing a circuit of wave-pipelining with a buffering function in HDL (hardware description language), the method comprising:
constructing a first part of the circuit, the first part comprising at least one critical path, each critical path of the at least one critical path comprising an input register, a piece of combinational logic and an output register, the piece of combinational logic connecting the input register to the output register, a positive integer Register_number being defined to be equal to a sum of a total number of the at least one input register and a total number of the at least one output register in the circuit, the at least one critical path providing a first storage, and the first storage being able to buffer up to the positive integer Register_number of a plurality of working data;
constructing a second part of the circuit, the second part guaranteeing that each output register of the at least one output register solely owns an output register state machine, and the output register state machine comprising three states:
an idle state: the idle state indicates that an owner output register is empty on a current cycle;
an active state: the active state indicates that the owner output register is an active output register, the owner output register has a working datum in the plurality of working data, and the working datum is latched on the current cycle; and
a buffered state: the buffered state indicates that the owner output register is a buffered output register, the owner output register has a working datum in the plurality of working data, and the working datum was latched on a past cycle; and
constructing a control unit that connects the first part to the second part and controls the plurality of working data travelling through the circuit without a data contamination.

2. The method of claim 1 further comprising:
making the output register state machine going to the idle state on the current cycle if one of following four conditions is satisfied:
the output register state machine is going to the idle state if a synchronous initialization input signal SINI of the circuit is asserted;
the output register state machine is going from the idle state to the idle state if the owner output register is not latching one working datum of the plurality of working data;
the output register state machine is going from the active state to the idle state if the owner output register is releasing its one working datum in the plurality of working data, and the owner output register is not latching one working datum of the plurality of working data; or
the output register state machine is going from the buffered state to the idle state if the owner output register is releasing its one working datum in the plurality of working data, and the owner output register is not latching one working datum of the plurality of working data.

3. The method of claim 1 further comprising:
making the output register state machine going to the active state on the current cycle if one of following three conditions is satisfied:
the output register state machine is going from the idle state to the active state if the owner output register is latching one working datum of the plurality of working data;
the output register state machine is going from the active state to the active state if the owner output register is releasing its one working datum in the plurality of working data, and the owner output register is also latching one working datum of the plurality of working data; or
the output register state machine is going from the buffered state to the active state if the owner output register is releasing its one working datum in the plurality of working data, and the owner output register is also latching one working datum of the plurality of working data.

4. The method of claim 1 further comprising:
making the output register state machine going to the buffered state on the current cycle if one of following two conditions is satisfied:
the output register state machine is going from the active state to the buffered state if the owner output register is not releasing its one working datum in the plurality of working data; or
the output register state machine is going from the buffered state to the buffered state if the owner output register is not releasing its one working datum in the plurality of working data.

5. The method of claim 1 further comprising:
claiming that the active state of the output register state machine has one cycle lifespan for a working datum in the plurality of working data, and the working datum being latched by the owner output register on the current cycle.

6. The method of claim 1 further comprising:
claiming that the at most one active output register exists in the circuit on the current cycle.

7. The method of claim 1 further comprising:
generating an input register rotator if the circuit comprises a plurality of the input registers, the input register rotator comprising a plurality of bits, the plurality of bits having a one-to-one mapping relationship with the plurality of the input registers, the input register rotator being rotated one bit if the circuit is receiving one working datum of the plurality of working data, the plurality of bits having a sole asserted bit, and the sole asserted bit indicating that a mapped input register is eligible to latch one working datum of the plurality of working data on the current cycle.

8. The method of claim 1 further comprising:
generating a combinational logic rotator if the circuit comprises a plurality of the pieces of combinational logic and the plurality of the pieces of combinational logic share a sole output register, the combinational logic rotator comprising a plurality of bits, the plurality of bits having a one-to-one mapping relationship with the plurality of the pieces of combinational logic, the combinational logic rotator being rotated one bit if the sole output register is latching one working datum of the plurality of working data, the plurality of bits having a sole asserted bit, and the sole asserted bit indicating that a mapped piece of combinational logic is eligible to be latched onto the sole output register on the current cycle.

9. The method of claim 1 further comprising:
latching a working datum in the plurality of working data by an input register in the at least one input register on the current cycle if all following four conditions are satisfied:
the working data is available;
at least one of following two conditions is satisfied:
the circuit is allowed to output; or
a total number of the plurality of working data buffered in the circuit is less than a capacity of the circuit;
a total number of a plurality of cycles from a past cycle to a current cycle is equal to or greater than a wave constant Input_clock_number of the circuit if the wave constant Input_clock_number is greater than 1, and the input register previously latching one working datum of the plurality of working data on the past cycle; and
the input register is eligible to receive one working datum of the plurality of working data if a wave constant Multiple_copy_number of the circuit is greater than 1.

10. The method of claim 1 further comprising:
outputting nothing on the current cycle if at least one of following two conditions is satisfied:
the circuit is not allowed to output; or
each output register of the at least one output register is empty, and either the circuit does not comprise a working data FIFO (First-In-First-Out hardware structure), or the circuit comprises the working data FIFO and the working data FIFO is empty.

11. The method of claim 1 further comprising:
popping up and outputting a top working data in the plurality of working data from a working data FIFO (First-In-First-Out hardware structure) on the current cycle if the circuit is allowed to output, the circuit comprises the working data FIFO, and the working data FIFO is not empty.

12. The method of claim 1 further comprising:
outputting a top buffered output register on the current cycle if the circuit is allowed to output, the circuit does not comprise a working data FIFO (First-In-First-Out hardware structure), and at least one buffered output register exists.

13. The method of claim 1 further comprising:
outputting the active output register on the current cycle if the circuit is allowed to output, the active output register exists, at least one buffered output register does not exist, and either the circuit does not comprise a working data FIFO (First-In-First-Out hardware structure), or the circuit comprises the working data FIFO and the working data FIFO is empty.

14. The method of claim 1 further comprising:
pushing a top buffered output register into a working data FIFO (First-In-First-Out hardware structure) on the current cycle if the circuit is allowed to output, the circuit comprises the working data FIFO, and at least one buffered output register exists.

15. The method of claim 1 further comprising:
pushing the active output register into a working data FIFO (First-In-First-Out hardware structure) on the current cycle if the circuit comprises the working data FIFO, at least one buffered output register does not exist, the active output register exists, and one of following two conditions is satisfied:
the circuit is not allowed to output, and the working data FIFO is not full; or
the circuit is allowed to output, and the working data FIFO is not empty.

16. The method of claim 1 further comprising:
generating an output register index FIFO (First-In-First-Out hardware structure) if the circuit comprises a plurality of the output registers, the output register index FIFO storing a plurality of output register indexes, the plurality of the output registers having a one-to-one mapping relationship with the plurality of output register indexes, a capacity of the output register index FIFO being equal to a total number of the plurality of output register indexes, and an index in the plurality of output register indexes indicating that a mapped output register is in the buffered state if the index is stored in the output register index FIFO.

17. The method of claim 16 further comprising:
pushing an index of the active output register into the output register index FIFO on the current cycle if the circuit comprises the output register index FIFO, the active output register exists, and at least one of following two conditions is satisfied:
the circuit is not allowed to output, and either the circuit does not comprise a working data FIFO, or the circuit comprises the working data FIFO and the working data FIFO is full; or
the output register index FIFO is not empty.

18. The method of claim 16 further comprising:
popping up the output register index FIFO on the current cycle if the circuit is allowed to output, the circuit comprises the output register index FIFO, and the output register index FIFO is not empty.

19. The method of claim 1 further comprising:
generating an assistant data FIFO (First-In-First-Out hardware structure) if the circuit needs to store a plurality of assistant data, and a capacity of the assistant data FIFO being equal to a capacity of the circuit for the plurality of working data.

20. The method of claim 19 further comprising:
pushing one assistant datum of the plurality of assistant data into the assistant data FIFO on the current cycle if the circuit comprises the assistant data FIFO, and the circuit is receiving one working datum of the plurality of working data.

21. The method of claim 19 further comprising:
popping up and outputting a top assistant data in the plurality of assistant data from the assistant data FIFO on the current cycle if the circuit comprises the assistant data FIFO, and the circuit is outputting one working datum of the plurality of working data.

22. The method of claim 1 further comprising:
defining a 1-bit register V and a 1-bit register B, the 1-bit register V and the 1-bit register B representing one output register state machine of the at least one output register state machine, an assertion of the 1-bit register V indicating the active state of the owner output register, an assertion of the 1-bit register B indicating the buffered state of the owner output register, and a deassertion of both the 1-bit register V and the 1-bit register B indicating the idle state of the owner output register.

23. The method of claim 22 further comprising:
asserting the 1-bit register B on the current cycle if the owner output register is in the active state, and at least one of following two conditions is satisfied:
the circuit is not allowed to output, and either the circuit does not comprise a working data FIFO (First-In-First-Out hardware structure), or the circuit comprises the working data FIFO and the working data FIFO is full; or
the circuit comprises a plurality of the output registers, and at least one buffered output register exists.

24. The method of claim 22 further comprising:
deasserting the 1-bit register B on the current cycle if the circuit is allowed to output, and the owner output register is a top buffered output register.

25. The method of claim 22 further comprising:
claiming a piece of combinational logic in the at least one piece of combinational logic being locked on the current cycle if at least one of following two conditions is satisfied:
the output register connected to or shared by the piece of combinational logic is not releasing its one working datum in the plurality of working data; or
the piece of combinational logic is not eligible to be latched onto a shared sole output register.

26. The method of claim 25 further comprising:
blocking a locked piece of combinational logic from being latched onto a connected or shared output register on the current cycle.

27. The method of claim 25 further comprising:
generating at least one working data position shifter, the at least one working data position shifter having a one-to-one mapping relationship with the at least one critical path, each working data position shifter of the at least one working data position shifter comprising a plurality of bits, a number of the plurality of bits being equal to a number of cycles for each working data of the plurality of working data to travel through a mapped critical path, the plurality of bits comprising: a) an input register bit; b) either an absence of a combinational logic bit or at least one combinational logic bit; and c) an output register bit; the input register bit representing an input register on the mapped critical path, the absence of the combinational logic bit indicating that the circuit is a non-pipelined circuit, each combinational logic bit of the at least one combinational logic bit representing a data position on the piece of combinational logic on the mapped critical path, the output register bit representing the output register on the mapped critical path, and a data entry bit being asserted if the input register on the mapped critical path is receiving one working datum of the plurality of working data on the current cycle.

28. The method of claim 27 further comprising:
implementing a first set in a plurality of shifting rules for each working data position shifter of the at least one working data position shifter on the current cycle if a) the piece of combinational logic on the mapped critical path is unlocked; and b) at least one bit among the data entry bit and the plurality of bits is asserted; and the first set comprising:
shifting the working data position shifter one bit in a direction from the input register bit to the output register bit; and
shifting the data entry bit into the input register bit.

29. The method of claim 27 further comprising:
implementing a second set in a plurality of shifting rules for each working data position shifter of the at least one working data position shifter on the current cycle if the piece of combinational logic on the mapped critical path is locked, and the second set comprising:
deasserting the output register bit;
doing following two steps if a) the at least one combinational logic bit exists; b) a last bit of the at least one combinational logic bit is deasserted; and c) any bit among the data entry bit, the input register bit and the at least one combinational logic bit except the last bit is asserted:
shifting the working data position shifter one bit except the output register bit in a direction from the input register bit to the output register bit; and
shifting the data entry bit into the input register bit; and
asserting the input register bit if the at least one combinational logic bit is absent, the data entry bit is asserted, and the input register bit is deasserted.

30. The method of claim 27 further comprising:
defining the output register bit in each working data position shifter of the at least one working data position shifter as the 1-bit register V for the output register state machine of the owner output register if the total number of the at least one input register is equal to the total number of the at least one output register in the circuit.

31. The method of claim 22 further comprising:
generating the 1-bit register V if the circuit has a plurality of the pieces of combinational logic and the plurality of the pieces of combinational logic shares a sole output register, the 1-bit register V having a deasserted value as its initial value, the 1-bit register V being asserted if the 1-bit register V is deasserted and the sole output register is latching one working datum of the plurality of working data, and the 1-bit register V being deasserted if the 1-bit register V is asserted and the sole output register is not latching one working datum of the plurality of working data on the current cycle.

32. The method of claim 1 further comprising:
specifying a positive integer Wanted_capacity, and the circuit being able to buffer at least the positive integer Wanted_capacity of the plurality of working data.

33. The method of claim 32 further comprising:
defining a wave constant Thru_out_register for the circuit if the circuit has a plurality of the pieces of combinational logic, the wave constant Thru_out_register being a bit data, a signal Tc being a bit condition, and calculation of the wave constant Thru_out_register being based on following formulae:
1) Tc=(max (Wanted_capacity, Series_clock_number+1)<2*Multiple_copy_number) and (Multiple_copy_number >1);
2) the wave constant Thru_out_register is deasserted if the signal Tc is true, or the wave constant Thru_out_register is asserted if the signal Tc is not true;
where Series_clock_number and Multiple_copy_number are two wave constants of the circuit, and function max (x, y) returns a larger integer from input integers x and y.

34. The method of claim 33 further comprising:
connecting each piece of combinational logic of the plurality of the pieces of combinational logic to one output register of a plurality of the output registers if the wave constant Thru_out_register is asserted, or making the plurality of the pieces of combinational logic sharing a sole output register if the wave constant Thru_out_register is deasserted.

35. The method of claim 33 further comprising:
connecting outputs from a plurality of the output registers to an input of a wave-pipelining component of the circuit if the wave constant Thru_out_register is asserted, or connecting outputs from the plurality of the pieces of combinational logic to the input of the wave-pipelining component if the wave constant Thru_out_register is deasserted.

36. The method of claim 32 further comprising:
defining a positive integer Necessary_capacity of the circuit, the positive integer Necessary_capacity being equal to a smallest positive integer, and the smallest positive integer satisfying following three requirements:
the circuit is able to buffer the positive integer Necessary_capacity of the plurality of working data;
the data contamination does not occur on the current cycle; and
the circuit has a maximum throughput.

37. The method of claim 36 further comprising:
calculating the positive integer Necessary_capacity, and the calculation being based on following formulae:
Necessary_capacity=floor(Series_clock_number/Input_clock_number)+1 if Multiple_copy_number=1; or
Necessary_capacity=Series_clock_number+1 if Multiple_copy_number >1;
where Series_clock_number, Input_clock_number and Multiple_copy_number are 3 wave constants of the circuit, and function floor (x) returns a greatest integer that is less than or equal to an input real number x.

38. The method of claim 36 further comprising:
generating a working data FIFO (First-In-First-Out hardware structure) if a larger integer between the positive integer Necessary_capacity and the positive integer Wanted_capacity is greater than the positive integer Register_number, the working data FIFO being connected to the at least one output register, the working data FIFO providing a second storage, the second storage buffering at least one working datum of the plurality of working data, a capacity of the working data FIFO being determined by a positive integer F1_capacity, and calculation of the positive integer F1_capacity being based on following formula:

$$F1\_capacity = \max(\text{Necessary\_capacity}, \text{Wanted\_capacity}) - \text{Register\_number};$$

where function max (x, y) returns a larger integer from input integers x and y.

39. The method of claim 36 further comprising:
calculating a capacity of the circuit, and the capacity of the circuit being equal to a largest integer among the positive integer Register_number, the positive integer Necessary_capacity and the positive integer Wanted_capacity.

40. The method of claim 1 further comprising:
defining a generic constant for a code component in the circuit as a wave generic constant if the code component is a sub-component located within a wave-pipelining component of the circuit, and the generic constant is assumed to receive a determined initial value of a specific wave constant of the wave-pipelining component after a synthesizer has analyzed the at least one critical path of the circuit.

41. The method of claim 40 further comprising:
assigning the wave generic constant with a constant, the constant going to receive the determined initial value of the specific wave constant of the wave-pipelining component if the wave-pipelining component has a definition for the specific wave constant, or the constant being equal to a default integer value 1 if the wave-pipelining component does not have the definition for the specific wave constant.

42. The method of claim 1 further comprising:
defining a working data output priority list, the working data output priority list being based on positions of the plurality of working data in the circuit from top to bottom, and the working data output priority list comprising:
1) a working datum in the plurality of working data, the working datum being the top working data in a working data FIFO (First-In-First-Out hardware structure) if the circuit comprises the working data FIFO and the working data FIFO is not empty;
2) a top buffered output register if the circuit does not comprise the working data FIFO and at least one buffered output register exists; and
3) the active output register if the active output register exists.

43. The method of claim 1 further comprising:
defining a set of a plurality of data type change rules for the plurality of working data passing through the circuit, the set comprising:
1) making the plurality of working data before a working data input of the circuit having at least one input data type;
2) making the plurality of working data after a processing of at least one critical path component (CPC) having at least one output data type, the processing being finished either on a working data input of the at least one output register or on a working data output of the at least one output register;
3) making the plurality of working data before or after a working data output of the at least one CPC having an "unsigned" data type;

4) making the plurality of working data before a working data input of a wave-pipelining component (WPC) having the "unsigned" data type;
5) making the plurality of working data after a working data output of the WPC having the "unsigned" data type; and
6) making the plurality of working data after a working data output of the circuit having at least one output data type.

44. The method of claim 1 further comprising:
claiming that a working data FIFO (First-In-First-Out hardware structure) is full if the circuit comprises the working data FIFO, and at least one buffered output register exists.

45. The method of claim 1 further comprising:
claiming that an output register in the at least one output register is not releasing its one working datum in the plurality of working data on the current cycle if the output register is not empty and one of following two conditions is satisfied:
1) the circuit is not allowed to output, and either the circuit does not comprise a working data FIFO (First-In-First-Out hardware structure), or the circuit comprises the working data FIFO and the working data FIFO is full; or
2) the circuit is allowed to output, the circuit comprises an output register index FIFO, the output register index FIFO is not empty, and the output register is not a top buffered output register.

46. A circuit of wave-pipelining with a buffering function in HDL (hardware description language), the circuit comprising:
at least one critical path, each critical path of the at least one critical path comprising an input register, a piece of combinational logic and an output register, the piece of combinational logic connecting the input register to the output register, a positive integer Register_number being defined to be equal to a sum of a total number of the at least one input register and a total number of the at least one output register in the circuit, the at least one critical path providing a first storage, and the first storage being able to buffer the positive integer Register_number of a plurality of working data;
at least one output register state machine, each output register of the at least one output register owning one output register state machine of the at least one output register state machine, each output register state machine of the at least one output register state machine comprising three states:
an idle state: the idle state indicates that an owner output register is empty on a current cycle;
an active state: the active state indicates that the owner output register is an active output register, the owner output register has a working datum in the plurality of working data, and the working datum is latched on the current cycle; and
a buffered state: a buffered state indicates that the owner output register is a buffered output register, the owner output register has a working datum in the plurality of working data, and the working datum was latched on a past cycle; and
a control unit that connects the at least one output register state machine to the at least one critical path, and controls the plurality of working data travelling through the circuit without a data contamination.

47. The circuit of claim 46 further comprising:
a working data FIFO (First-In-First-Out hardware structure) if the circuit needs to buffer a first number of the plurality of working data and the first number is greater than the positive integer Register_number, the working data FIFO being connected to the at least one output register, the working data FIFO providing a second storage, the second storage being able to buffer a second number of the plurality of working data, and the second number being equal to a positive difference of the first number minus the positive integer Register_number.

48. The circuit of claim 46 further comprising:
an output register index FIFO (First-In-First-Out hardware structure) if the circuit comprises a plurality of the output registers, the plurality of the output registers having a one-to-one mapping relationship with a plurality of output register indexes, the output register index FIFO being able to buffer all of the plurality of output register indexes, and an index in the plurality of output register indexes indicating that a mapped output register is in the buffered state if the index is stored in the output register index FIFO.

* * * * *